United States Patent
Takeuchi et al.

(10) Patent No.: US 7,936,549 B2
(45) Date of Patent: May 3, 2011

(54) STATE GRASP DEVICE, AND SWITCHING CONTROL DEVICE OF POWER SWITCHING APPARATUS EMPLOYING THE STATE GRASP DEVICE

(75) Inventors: Toshie Takeuchi, Chiyoda-ku (JP); Akihiko Maruyama, Chiyoda-ku (JP); Mitsuru Tsukima, Chiyoda-ku (JP); Toshihiro Matsunaga, Chiyoda-ku (JP); Katsuhiko Horinouchi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 1225 days.

(21) Appl. No.: 11/587,583

(22) PCT Filed: Mar. 22, 2005

(86) PCT No.: PCT/JP2005/005098
§ 371 (c)(1),
(2), (4) Date: Oct. 25, 2006

(87) PCT Pub. No.: WO2005/111641
PCT Pub. Date: Nov. 24, 2005

(65) Prior Publication Data
US 2007/0222427 A1    Sep. 27, 2007

(30) Foreign Application Priority Data

May 13, 2004  (JP) ................................ 2004-143279
Jun. 15, 2004  (JP) ................................ 2004-176748

(51) Int. Cl.
*H01H 47/00* (2006.01)
*H01H 9/00* (2006.01)
*H01H 51/22* (2006.01)
*H01H 51/30* (2006.01)
*H01H 1/00* (2006.01)
*H01H 51/00* (2006.01)

(52) U.S. Cl. .................... 361/139; 361/160; 335/213
(58) Field of Classification Search .................. 361/139, 361/160; 335/213
See application file for complete search history.

(56) References Cited

U.S. PATENT DOCUMENTS
5,636,134 A    6/1997    Johnson et al.
(Continued)

FOREIGN PATENT DOCUMENTS
DE    38 07 278 A1    9/1989
(Continued)

OTHER PUBLICATIONS
U.S. Appl. No. 12/282,589, filed Sep. 11, 2008, Maruyama.

*Primary Examiner* — Dharti H Patel
(74) *Attorney, Agent, or Firm* — Oblon, Spivak, McClelland, Maier & Neustadt, L.L.P.

(57) ABSTRACT

A state grasp device that needs no optical adjustment, and can be downsized. An exciting current waveform of an opening electromagnetic coil of an electromagnetic operating set functioning to drive a moving contact of a switching device includes an inflection point appearing subsequently to a maximum value, the inflection point taking place at the time of the contact being parted. Accordingly, a wear amount of contact from the change over time can be obtained. A position of the inflection point is obtained, for example, by focusing the rate of change in current; and a wear amount of a switching contact is obtained from the change over time of a time when the inflection point takes place. With the device, the use of a mechanical detection device, such as an optical detector, can be eliminated.

28 Claims, 35 Drawing Sheets

U.S. PATENT DOCUMENTS 6,009,615 A 1/2000 McKean et al.
6,510,037 B1 * 1/2003 Schmitz .................. 361/160

FOREIGN PATENT DOCUMENTS

| DE | 197 23 563 A1 | 12/1998 |
| EP | 0 721 650 | 7/1996 |
| GB | 2 350 724 | 12/2000 |
| JP | 1 171369 | 12/1989 |
| JP | 6 267365 | 9/1994 |
| JP | 10 092282 | 4/1998 |
| JP | 2004 146333 | 5/2004 |
| JP | 2004 165075 | 6/2004 |
| JP | 2004 288502 | 10/2004 |

* cited by examiner

FIG. 2
(a) 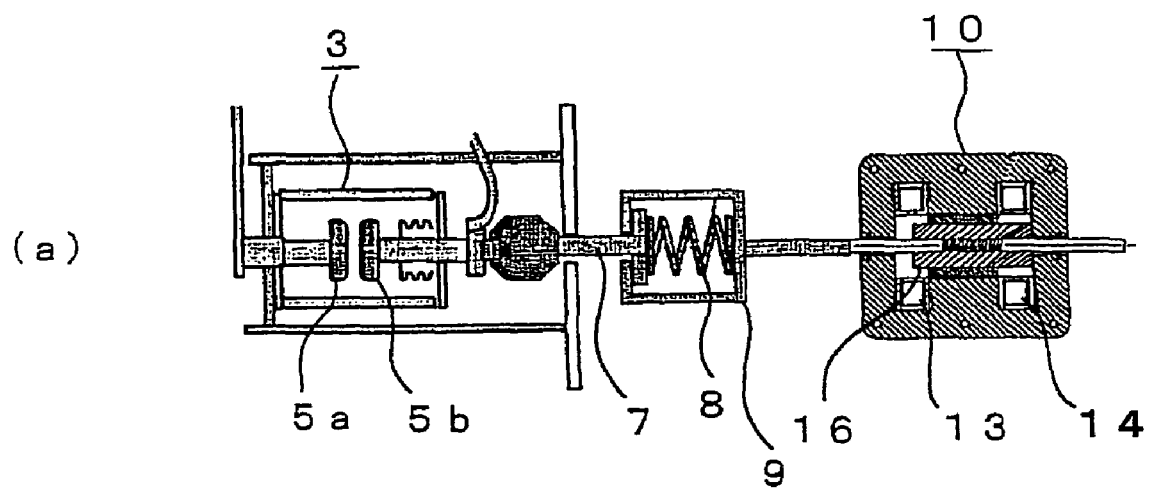
(b) 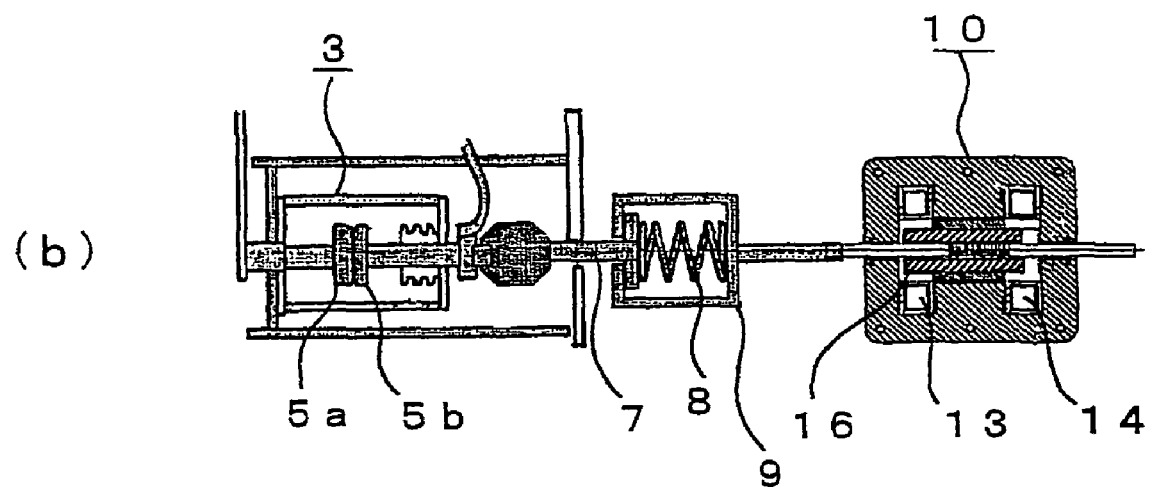
(c) 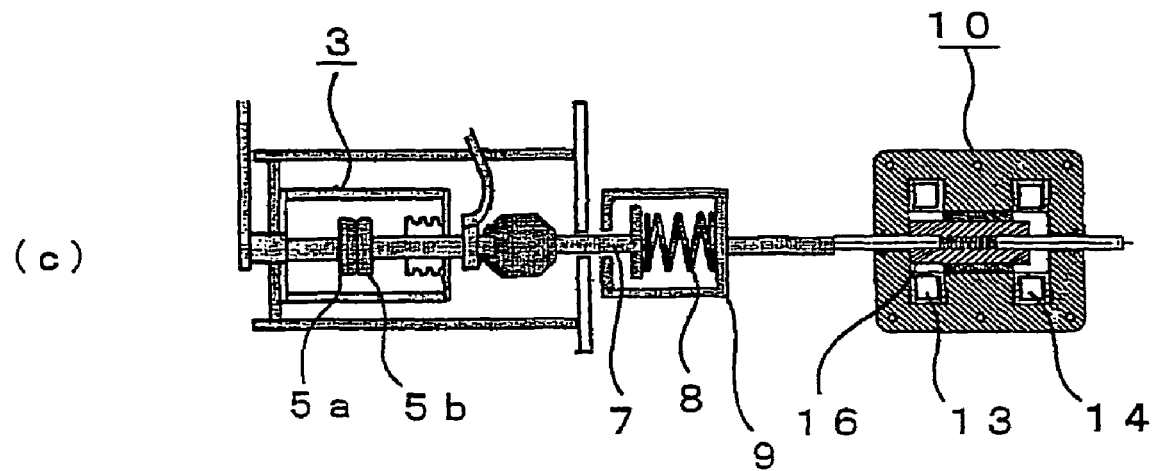

STATE GRASP DEVICE, AND SWITCHING CONTROL DEVICE OF POWER SWITCHING APPARATUS EMPLOYING THE STATE GRASP DEVICE

TECHNICAL FIELD

The present invention relates to a state grasp device for grasping a state, e.g., wear amount of a switching contact of a power circuit breaker of an operated apparatus or an electromagnetic operating system in the case where the operated apparatus is operated by the electromagnetic operating system, and further relates to a switching control device of a power switching apparatus provided with this state grasp device.

BACKGROUND ART

As a measuring device functioning to measure a wear of a switching contact, being one of state quantities of a breaker, for example, there is the one in which an indicator is attached to a driving rod adjacent to a driving coil of an electromagnetic operating mechanism, a position thereof is detected using an optical detector, and a displacement of the indicator from at an initial position due to the wear of a contact (refer to, for example, Patent Document 1).

Patent Document 1: British Patent Application laid-open under Publication No. 2350724 (15-20 lines on page 5, and FIG. 4)

DISCLOSURE OF INVENTION

Problems to be Solved by the Invention

Since the conventional measuring device for measuring a wear amount of a switching contact is arranged as described above, an optical detector becomes necessary, resulting in a large-scaled apparatus. In addition to this, it is required to hold an indicator being optically pointed. To meet this requirement, an optical adjustment for controlling an optical axis has to be done. Further, since a wear amount of contact is of several millimeters at most, the adjustment for eliminating the axis deviation has to be done with high accuracy. Moreover, supposing that there are provided two detectors in one operating mechanism and there are provided three operating mechanisms in a three-phase power switching apparatus with one operating mechanism located in each phase, six detectors will be needed, resulting in a problem of a larger-scaled and further expensive device.

The present invention was made to solve the above-discussed problems, and has an object of obtaining a state grasp device for grasping a state of an electromagnetic operating system or an operated apparatus, the state grasp device needing no optical adjustment and capable of being downsized. Further, the invention has another object of obtaining a state grasp device for a power switching apparatus that needs no optical adjustment as well as can be downsized. Furthermore, the invention has another object of obtaining a switching control device of a power switching apparatus that uses this state grasp device, and can achieve a longer operating life of switching contact.

Means of Solution to the Problems

A state grasp device according to the invention, which is disposed in an electromagnetic operating system that includes a fixed iron core; a moving iron core constructed movably with respect to this fixed iron core; and an electromagnetic coil that is excited by a driving power supply, and causes the moving iron core to travel, thereby driving an operated apparatus that is connected to the moving iron core. The state grasp device comprises measurement means for measuring a current flowing through the electromagnetic coil or a voltage to be generated at the electromagnetic coil, and search means for obtaining change information on an output waveform from this measurement means; and estimates a state of the operated apparatus or electromagnetic operating system on the basis of change information from this search means.

Further, in the state grasp device of a power switching apparatus according to the invention, an electromagnetic operating system thereof drives a moving contact of a switching contact of the switching apparatus, being an operated apparatus; and search means thereof includes at least one of a first inflection point search means for obtaining, as a contact motion start time, a time when a first inflection point that appears subsequently to the maximum value of a current waveform provided from current measurement means takes place, and a second inflection point search means for obtaining, as a contact movement completion time, a time when a second inflection point, which takes place after the contact motion start time and at which a current waveform becomes the minimum, takes place.

Furthermore, in a switching control device of a power switching apparatus according to the invention, an electromagnetic operating system thereof drives a moving contact of a switching contact of a power switching apparatus, being an operated apparatus, and is provided with an opening electromagnetic coil and a closing electromagnetic coil to be excited with an electric charge having been stored in a capacitor as an electromagnetic coil;

search means thereof comprises at least one of the first inflection point search means obtaining as a contact motion start time a time when the first inflection point takes place, which point appears subsequently to the maximum value of a current waveform provided by the current measurement means, and the second inflection point search means obtaining as a contact movement completion time a time when the second inflection point, which takes place subsequently to the contact motion start time and at which a current waveform becomes the minimum, takes place; and there are provided closing time period prediction means for predicting a closing completion time period when the closing electromagnetic coil is excited next on the basis of at least one of the contact motion start time and the contact movement completion time and at least one of a charge voltage of the capacitor and temperature information of the power switching apparatus; and timing control means for controlling timing of exciting the closing electromagnetic coil next on the basis of the closing completion prediction time period.

Effect of the Invention

In the state grasp device according to the invention, which is disposed in an electromagnetic operating system that includes a fixed iron core; a moving iron core constructed movably with respect to this fixed iron core; and an electromagnetic coil that is excited by a driving power supply, and causes the moving iron core to travel, thereby driving an operated apparatus that is connected to the moving iron core; the state grasp device comprises measurement means for measuring a current flowing through the electromagnetic coil or a voltage to be generated at the electromagnetic coil, and search means for obtaining change information on an output waveform from this measurement means; and estimates a state of the operated apparatus or electromagnetic operating system on the basis of change information from this search means. As a result, it is possible to estimate states of an operated apparatus or an electromagnetic operating system with a device that needs no optical adjustment, as well as is small-sized.

Further, in the state grasp device of a power switching apparatus according to the invention, an electromagnetic operating system thereof drives a moving contact of a switching contact of a power switching apparatus, being an operated apparatus; and search means thereof obtains at least one of a first inflection point search means for obtaining as a contact motion start time a time when a first inflection point that appears subsequently to the maximum value of a current waveform provided from current measurement means takes place, and a second inflection point search means for obtaining as a contact movement completion time a time when a second inflection point, which takes place after the contact motion start time and at which a current waveform becomes the minimum, takes place. As a result, it is possible to obtain a contact motion start time or a contact movement completion time to grasp states of a power switching apparatus with a device that needs no optical adjustment, as well as is small-sized.

Furthermore, in a switching control device of a power switching apparatus according to the invention, an electromagnetic operating system thereof drives a moving contact of a switching contact of a power switching apparatus, being an operated apparatus, and is provided with an opening electromagnetic coil and a closing electromagnetic coil to be excited with an electric charge having been stored in a capacitor as an electromagnetic coil; search means thereof comprises at least one of the first inflection point search means obtaining as a contact motion start time a time when the first inflection point takes place which point appears subsequently to the maximum value of a current waveform provided by the current measurement means, and the second inflection point search means obtaining as a contact movement completion time a time when the second inflection point, which takes place subsequently to the contact motion start time and at which a current waveform becomes the minimum, takes place; and there are provided closing time period prediction means for predicting a closing completion time period when the closing electromagnetic coil is excited next on the basis of at least one of the contact motion start time and the contact movement completion time, and at least one of a charge voltage of the capacitor and temperature information of the power switching apparatus; and timing control means for controlling timing of exciting the closing electromagnetic coil next on the basis of the closing completion prediction time period. As a result, it is possible to make longer an operating life of a switching contact of the power switching apparatus.

BEST MODE FOR CARRYING OUT THE INVENTION

Embodiment 1

FIGS. 1 to 9 show a first preferred embodiment of the present invention. FIG. 1 is a schematic view of a vacuum circuit breaker, being an operated apparatus employing an electromagnetic operating mechanism. FIGS. 2 are state views showing switching states of the vacuum circuit breaker. FIG. 3 is an enlarged view of an electromagnetic operating mechanism. FIG. 4 is a schematic diagram showing an arrangement of a contact wear-measuring device of the vacuum circuit breaker. FIG. 5 is a characteristic chart indicating current flowing through an opening coil and a stroke of a moving iron core. FIG. 6 is a characteristic chart indicating a mass and a contact pressure of contacts at the time of operation of the vacuum circuit breaker. FIG. 7 is a flowchart for explaining the operation. FIG. 8 is a characteristic chart indicating the rate of change in current flowing through an opening coil. FIG. 9 is an explanatory chart indicating current waveforms flowing through the opening coil and strokes in comparison between when contacts show no wear and when the contacts show some wear.

With reference to FIG. 1, a vacuum valve 3 forming a vacuum circuit breaker contains switching contacts 5 in a vacuum container. The switching contact 5 includes a moving contact Sb that is disposed in opposition to a stationary contact 5a, which is located at the left of FIG. 1, with a predetermined gap therebetween in lateral direction of FIG. 1, being an axial direction. A driving rod 7 is fixed to the moving contact 5b, and the moving contact 5b and the driving rod 7 form a moving part 6. This moving part 6 is connected to a moving iron core 16 of the later-described electromagnetic operating mechanism via a pressure spring 8 and a spring bearing 9.

The electromagnetic operating mechanism 10 (refer to FIG. 3 as well) includes a closing coil 13, an opening coil 14, and a moving iron core 16. The closing coil 13 and opening coil 14 acting as driving electromagnetic coils are wound in a hollow rectangular configuration, and they are disposed with a predetermined distance therebetween in axial direction. The moving iron core 16 having a rectangular cross section that is made of ferromagnetic material is disposed in an axially movable manner at each axially central portion of the closing coil 13 and the opening coil 14. A plate-like permanent magnet 16a is attached onto the peripheral portion of the moving iron core 16 (refer to FIG. 3). A drive power-supply unit 20 includes a closing capacitor 23, an opening capacitor 24, a closing command switch 27, and an opening command switch 28. Furthermore, there is provided a current measuring instrument 32 acting as current measuring means on a connection line 31 providing a connection between the opening capacitor 24 of the drive power supply unit 20 and the opening coil 14.

A contact-wear measuring device 33 acting as characteristic amount grasp device of the power switching apparatus is connected to the current measuring instrument 32. The contact wear measuring device 33, of which detailed arrangement is shown in FIG. 4, includes an AD converter 33a, an opening start point search means 33b acting as a first inflection point search means, a memory 33c, and contact wear calculation means 33d and contact wear determination means 33e acting as characteristic amount grasp means. Each function of the opening start point search means 33b and the contact wear calculation means 33d is performed in a CPU. The opening start point search means 33b or the contact wear calculation means 33d includes an adder and a multiplier, not shown, and is capable of an arithmetical operation. Numerical values, being a target of the arithmetical operation, are placed in a register variable, being a temporary storage region in an internal part of the opening start point search means 33b or the contact wear calculation means 33d from the memory 33d. Operation results are temporarily placed in the register variable, and thereafter are transferred to the memory 33c.

Now, switching operation of the vacuum circuit breaker is described. With reference to FIG. 1, the closing capacitor 23 and the opening capacitor 24 of the drive power-supply unit 20 are regularly charged with a predetermined voltage. When a closing command switch 27 is pressed to provide a closing command in the state in which the moving contact 5b is parted, shown in FIG. 1 and FIG. 2(a), an electric charge having been charged in the closing capacitor 23 is supplied to the closing coil 13. Then, the current flowing through the closing coil 13 causes the moving iron core 16 to drive axially to the left of FIG. 1, and brings the moving contact 5b in contact with the stationary contact 5a via the pressure spring 8 and the driving rod 7 to be closed. At this time, the moving contact 5b comes to be in contact with the stationary contact 5b to become in the state of FIG. 2(b), thereafter the pressure spring 8 is pressed further to come into the state of FIG. 2(c) in which a contact pressure between the contacts is obtained, and is kept in this state by the magnetic flux provided by the permanent magnet 16a that is attached to the moving iron core 16 to become in the closed state.

When an opening command switch 28 is pressed to provide an opening command in this closed state, an electric charge having been charged in the opening capacitor 24 is supplied to the opening coil 14 via the connection line 31. Then, the current flowing through the opening coil 14 causes the moving iron core 16 to be driven axially to the right of FIG. 1 to change from the state of FIG. 2(C) first to the state of FIG. 2(b). During this time period, the pressure spring 8 having been pressed just extends even if the moving iron core 16 travels to the right, and the moving contact 5b and the driving rode 7 on the vacuum valve 3 side are not moved. Thereafter, when the moving iron core 16 travels further to the right, the moving contact 5b, the driving rod 7, the pressure spring 8, the spring bearing 9, and the moving iron core 16 move rightward all together. The moving contact 5b is parted from the stationary contact 5a to be in the state of FIG. 2(a), and held by the magnetic flux of the permanent magnet 16a that is attached to the moving iron core 16 to become in the open state.

Prior to the description of operations of the contact wear measuring device 33, described hereinafter are current flowing through the opening coil 14 when a vacuum circuit breaker is open and the change in stroke of the moving iron core 16. When the vacuum circuit breaker is closed, as described above, the pressure spring 8 is pressed by means of the moving iron core 16, and the contacts 5a and 5b are maintained in the state in which a contact pressure therebetween is held by the action of the magnetic flux indicated by the black arrows in FIG. 3 of the permanent magnet 16a (FIG. 2(c)). At this moment, the current in a direction of counteracting the above-mentioned magnetic flux indicated by the black arrows of the permanent magnet is made to flow through the opening coil 14. Thus, the above-mentioned hold magnetic force is attenuated, and the moving iron core 16 travels in a direction of opening (rightward direction of FIGS. 1 to 3) by the electromagnetic attraction that is generated by the action of magnetic flux indicated by the white arrows.

When the moving iron cores 16 starts traveling, first the spring bearing 9 that is connected to the moving iron core 16 comes to travel. Accordingly, an inertia of masses of the moving iron core 16, the spring bearing 9, the pressure spring 8, and a connection rod providing a connection between the moving iron core 16 and the spring bearing 9, is exerted on the electromagnetic operating mechanism 10. Subsequently, when the moving iron core 16 travels rightward by a predetermined distance, the spring bearing 9 comes to be in contact with the driving rod 7 resided on the side of the vacuum valve 3. That is, the situations change from the state of FIG. 2(c) to the state of FIG. 2(b). On and after this moment, the whole of moving members from the moving iron core 16 to the moving contact 5b travels as an integral part, and a moving mass is sharply increased as shown in FIG. 6. This inertia will be exerted on the electromagnetic operating mechanism 10.

These operations are based on the following circuit equations (1) (2) and equation of motion (3). Masses and loads relating to the drive system change in a discontinuous manner during a series of motions of the moving iron core 16, the moving contact 5b or the like, and this change causes a waveform of the current flowing through the opening coil 14 to change. The present invention focuses on this phenomenon.

The circuit equation (1) is an equation that can be satisfied in the state in which the moving part 6 is at rest before being driven and after having been driven. The circuit equation (2) is an equation that can be satisfied in the state in which a speed electromotive force term is generated during driving.

[Equation 1]

$$I(t) \cdot R + \frac{d\phi(I(t), z(t))}{dI} \cdot \frac{dI}{dt} = E \quad (1)$$

$$I(t) \cdot R + \frac{d\phi(I(t), z(t))}{dI} \cdot \frac{dI}{dt} + \frac{d\phi(I(t), z(t))}{dI} \cdot \frac{dz}{dt} = E \quad (2)$$

$$m(z(t))\frac{d^2z}{dt^2} = Fm(I(t), z(t)) + Fs(z(t)) + F_{friction} \quad (3)$$

where: I is coil current, R is coil resistance, z is stroke, E is charge voltage, $\phi$ is total flux linkage of coil, Fm is electromagnetic force, Fs is pressure spring force, F friction is frictional force, and m is inertia mass Additionally, although the current flowing through the coils is supplied from a constant voltage source according to the equations (1) (2), the phenomenon herein can be treated in the same manner also in the case of being supplied from a discharge circuit or a current application circuit such as capacitors as shown in FIG. 1.

Thus, the change in current waveform takes place when a circuit equation changes from the equation (1) to the equation (2) at the moment of the moving part 6 changing from the state before being driven to the driven state, when a circuit equation changes from the equation (2) to the equation (1) at the moment of the moving part 6 changing from the driven state to after the completion of being driven, or in the case where an acceleration term $d^2z/dt^2$ changes in a discontinuous manner due to discontinuous change in mass m or load Fs in the motion equation of (3). These moments correspond to points at which a first-order differential of a waveform, that is, current-time characteristics I (t), is zero, or a first-order differential or a second-order differential becomes discontinuous. In the description of the invention, points at which currents change showing the above-mentioned phenomenon are generically defined as inflection points.

Meanwhile, in a theoretical viewpoint, waveforms of current flowing through the opening coil 14 can be obtained as described above. Examples of being measured on an actual vacuum circuit breaker are now modeled and shown in FIG. 5 together with a stroke of the moving iron core 16. With reference to FIG. 5, a waveform of the current J flowing through the opening coil 14 comes to be the maximum value imax at a time ts of a motion start point (Act1) of the moving iron core 16, and comes to a first infection point P at a time tp subsequently to the foregoing time ts, and a second inflection point Q, being the minimum point at a time tq (hereinafter, it is referred to as a minimum point as well). The times tp, tq are indicated establishing the instant of the opening coil 14 being excited as a zero point (reference point) of time axis. The other times hereinafter are indicated in the same manner. In addition, a reference point of time may be set anywhere.

Strokes of the moving iron core 6 change as shown by a stroke st of FIG. 5. The moving iron core 16 starts traveling at a time ts (point Act1 of FIG. 5); the moving contact 5b starts parting from the stationary contact 5a at a time tp, being a contact motion start time and an opening start time (time when the inflection point P takes place); thereafter the moving iron core 16 and the moving contact 5b travel as an integral part; and they have traveled the entire stroke at a time tq corresponding to the minimum point Q (time when the minimum point Q takes place), and the moving iron core 16 and the moving contact 5b are stopped, thus the opening being completed (opening completion point Act3 of FIG. 5). That is, the time tq is a contact motion completion time, and an opening completion time. As described above, obtaining the times tp and tq when the inflection point P and the minimum point Q take place focusing on waveforms of a current J flowing through the opening coil 14, those obtained times are an opening start time and an opening completion time.

Now, described are the current measuring instrument 32 that measures the current flowing through the opening coil 14, i.e., the current flowing through the connection line 31 when a vacuum circuit breaker is open, and the contact wear measuring device 33. A current flowing through the connection line 31 is converted into a voltage output of analog signals proportional to a current flowing through the current measuring instrument 32, supplied to the AD converter 33a, and converted to digital signals. In accordance with these digital signals, the time tp when the inflection point P of the current waveform of FIG. 5 is positioned, that is, the inflection point P take place is obtained. Then, by measuring how times tp changes with respect to the time tp (initial) in the initial state of a vacuum circuit breaker, a wear amount of contact can be obtained by contact wear calculation means 33d.

A method of searching positions of the inflection point P is hereinafter described. Herein, positions of the inflection point P means positions on coordinates when times are plotted along the axis of abscissas, and currents are plotted along the axis of ordinates. Although a variety of methods can be thought as the method for searching positions of the inflection point P, the method of focusing the rate of change in current is described in this first embodiment. This searching is executed by opening start point search means 33b. A storage region G of N numbers in size has been secured in the memory 33a in order to be capable of preliminarily holding data of a time period necessary for opening of the vacuum circuit breaker. For example, supposing that a sufficient time period needed for opening is 30 msec, when a quantization bit number is 10 bits and a sampling rate is 100 kS/s ($\Delta$tg=10 μsec interval) like the above-mentioned example, a storage region of N=3000 numbers in size with 10 bits per one) is acquired as an array G.

Furthermore, a storage region, for example, of M=N/10 numbers in size necessary for the following operation processing is acquired as an array F. The opening start point search means 33b executes processing in the following procedure after having prepared the arrays in the memory 33c as described above. Hereinafter, operations of the opening start point search means 33b and the contact wear calculation means 33d are described with reference to a flowchart of FIG. 7.

1) Fetching Current Value (Step S11)

Letting a time t when a vacuum circuit breaker receives an opening command 0, fetching currents flowing through the connection line 31 via the current measuring instrument 32 is started at intervals of a time $\Delta$tg (10 μsec), current values are converted to digital data with the AD converter 33a, and the data are stored in the array G of the memory 33c. A value at a time j·$\Delta$tg is stored in j-th element of the array G. Then, fetching is ended at a point of time of having obtained N numbers of data.

2) Smoothing (Step S12)

An average value of, e.g., ten numbers of data having been fetched is stored in an array F (Step S12). By smoothing, noise components, which the data having been stored in the array G possess, are reduced. Whereby, sampling data having been smoothed at intervals of $\Delta$tf=100 μsec can be obtained. Accordingly, a value at a time t=i·$\Delta$tf is stored in i-th element of the array F.

3) Searching Opening Start Time (Step S13)

Inflection point search means 33b first obtains the maximum value of data in the array F. Next, the rates of change in current (dI/dt) are obtained in sequence. Values having been obtained in such a way are indicated in FIG. 8. As shown in FIG. 8, (dI/dt) sharply increases in the beginning, passes a zero point U while decreasing by degrees from this point, and comes to be a negative value. This zero point U corresponds to a time ts at which a current J becomes the maximum value imax in FIG. 5(a) being a motion start point of the moving iron core 16. Subsequently, after the time ts, (dI/dt) comes to be a negative value, continues to decrease, and then sharply increases at a point R. This point R corresponds to the inflection point P, and a time tp when this opening start point R takes place is a contact motion start time.

Additionally, in the foregoing description of the present invention, a point, which corresponds to a point of a first-order differential of current-time characteristics I (t) being zero, or a first-order or second-order differential of current-time characteristics I(t) being discontinuous, and at which current changes in the above-mentioned phenomenon, is generically defined as an inflection point. To determine particularly this "coming to be discontinuous", it is necessary to take the following contents into consideration.

That is, the presence of this discontinuity is determined in the case of making a determination assuming that no statistical error is included. Specifically, for example, there are some cases where results are obtained by smoothing processing of data having been actually measured, or by fitting with functions being divided for single or plural regions. In the case of making the smoothing processing, sharply-changed portions due to discontinuity of original data is subjected to "smoothing", so that the state as it is will not correspond to that "first-order differential or second-order differential comes to be discontinuous". In this case, however, positions of a "discontinuous" point can be judged by estimating portions at which values of first-order differential or second-order differential with regard to the change in data in a certain time period range. Thus, at least according to this invention, the cases as described above are also included in "points of coming to be discontinuous" that are described in, e.g., claim 2. Furthermore, also in the case of fitting with a single function (although it is normally difficult, so that it will be fitting with a plurality of functions), there is no "discontinuity of first-order differential or second-order differential" in the proper sense of the word. However, the same interpretation as in the case of the above-mentioned smoothing is made.

4) Calculating a Wipe of Moving Contact (Step S14)

Contact wear calculation means 33d first calculates a wipe Lw of the moving contact 5b with a time difference $\Delta$tw(=tp−ts) between a time tp, being a contact motion start time, and a time ts, being a moving iron core motion start time when the moving iron core 16 starts traveling. The relation of values between a time difference $\Delta$tw and a wipe Lw is measured with an actual device to create a database. A wipe Lw is obtained referring to this database.

In addition, a wipe is a distance that the moving iron core travels from a time point when the moving contact has started traveling up to a time point when a contact starts traveling, or is a difference between compression of spring in the closed state and compression of spring in the opening state, and amount of change in wipe is equal to wear amount of contact.

5) Calculating Wear Amount of Contact (Step S15)

Furthermore, contact wear calculation means 33d obtains a difference ΔLw between a current wipe Lw, being at the second predetermined time, and a wipe Lw0 when the contact shows no wear, having been measured before at the first predetermined time, and determines a wear amount of contact from a difference between wipes.

6) Checking Wear Amount of Contact (Step S16)

Contact wear determination means 33e checks whether or not a wear amount of contact having been determined exceeds a predetermined value.

7) External Outputting of Signals (Step S17)

Contact wear determination means 33e externally outputs an alarm signal and a wear amount of contact in case of a wear amount of contact exceeding a predetermined value, and externally outputs a wear amount of contact in case of not exceeding a predetermined value.

As described above, wear amount of contact wears is obtained. Currents flowing through the opening coil 14 before the contact shows no wear and after it shows some wear are compared, which is shown in FIG. 9. With reference to FIG. 9, solid line indicates a current J of the opening coil 14 before the contact being worn, and broken line indicates a current of the opening coil 14 after the contact being worn. With reference to FIG. 9, at the time of a new contact (at the first predetermined time according to the invention), a wipe ΔLw1 is obtained with a time difference between a time ts that corresponds to the maximum value imax of currents flowing through the opening coil 14 and a time tp1 that corresponds to the inflection point P. Further, at a point of time more subsequent to the time of being new (at the second predetermined time according to the invention), a position where the inflection point P takes place shifts to the upper left of FIG. 9 as the wear of contact increases, and the inflection point P changes from a time tp1 to a time tp2. That is, a time period from the start of opening operation of the moving iron core 16 to the beginning of parting of the moving contact 5b from the stationary contact 5a becomes shorter. Further, as shown in FIG. 9, a time of opening completion when the moving iron core 16 has reached a stroke end is changed from tq1 to tq2, resulting in a longer time period. The reason for this event is that a movement distance of a moving part comes to be longer by a distance due to increase in wear amount of contact.

At this time, with a time difference Δt2 between a time ts that corresponds to the maximum value imax of currents flowing through the opening coil 14 (it is hardly changed even at the time of a contact being worn) and a time tp2 that corresponds to the inflection point P and, a wipe Lw2 is obtained (Δt2=tp2−ts). Then, by the calculation with a difference ΔLW between the wipe Lw1 before the contact being worn and the above-mentioned wipe Lw2, or with a data table representing the relation between a difference between wipes ΔLw and a wear amount of contact, a wear amount of contact is obtained.

In the above description, an example is described in which a wipe of the moving contact 5b is obtained with a difference between a time ts and a time tp, and a wear amount of contact is obtained in accordance with the change in wipe (changing from Δlw1 to Δlw2). It is, however, also possible to obtain a wear amount of contact with the change in time tp (changing from tp1 to tp2), omitting the obtaining of wipe.

As described above, it is possible to obtain a position of the inflection point P in waveform of a current J of the opening coil 14 by the opening start point search means 33b, and to obtain a wear amount of contact in accordance with the change in position of the inflection point P (the change of time in inflection point P taking place). Therefore, it becomes possible to measure wear amount of contact without use of any optical detector, thus enabling a device to be downsized by eliminating the need of optical adjustment. In addition, although a wear amount of contact is obtained using current waveforms of an opening coil at the time of opening according to this first embodiment, it is also possible to obtain a wear amount of contact using current waveforms of a closing coil 13.

Embodiment 2

In the foregoing first embodiment with reference to FIG. 5, a point at which a current value comes to be the maximum is a motion start point of a moving iron core. As far as no strict accuracy is required, this processing has no problem. However, in the case where the phenomenon should be analyzed in more detail, an actual motion start point of the moving iron core comes to be a little before the maximum point of current in relation to a time constant of the circuit. An inflection point thereof is generally hard to extract due to the small rate of change. According to this second embodiment, a simple method of searching an inflection point of in such a case is disclosed.

That is, as shown in FIG. 10, the moving iron core starts moving at a point of time A' before a point A, being the maximum point of current. In detail, although the inflection point of a current waveform is present at the point A', the change in waveform is small as compared with that at point A corresponding to the extreme value easy to detect. Accordingly, to detect this change, it is necessary to carry out current measurement with high accuracy, thus leading to high cost of a measuring device.

Then, the compensation of Point A is made with the use of a compensation time period ΔT, being a compensation amount from A point to point A', thereby enabling to calculate a more accurate state factor, being a driving parameter.

In general, there are some cases where an inflection point can be presumed at higher speed, or more easily by the method of estimating an inflection point using a compensation time period ΔT from the minimum point or the maximum point in the vicinity than by the method of calculating a certain inflection point with waveform analysis.

In addition, calculation methods of a compensation time period ΔT include: the method of using a fixed value having been actually measured preliminarily, or having been determined by calculation preliminarily; the method of calculation with functions having been obtained preliminarily by experiment or calculation of the correlation between a time, current, and voltage value at point A, or the method of calculating from a map data; or the method of obtaining by creating an approximate function from waveform data before at point A, and comparing this approximate function with an actual waveform.

Embodiment 3

FIGS. 11 and 12 show another embodiment according to the invention. FIG. 11 is a schematic diagram of a switching time period monitoring device of a vacuum circuit breaker.

FIG. 12 is a flowchart showing operations. With reference to FIG. 11, an opening time period monitoring device 43 acting as a state grasp device includes the same AD converter 33a and memory 33c as those of FIG. 5, as well as opening-time minimum point search means 43a and closing-time minimum search means 43b acting as a second inflection point search means, and error determination means 43c acting as signal transmission means.

Now, operation of the switching time period monitoring device 43 is described referring to a flowchart of FIG. 12. An opening command switch 28 is pressed to provide an opening command to an opening coil 14 to cause the opening coil 14 to perform an opening operation (Step S21). At this time, a current flowing through the connection line 31 is converted into a digital data with the AD converter 33a to be fetched in the memory 33c (Step S22). Thereafter, a smoothing processing is made in the same manner as in the foregoing first embodiment (Step S23). The same minimum point Q as that shown in FIG. 5 is searched by opening-time minimum point search means 43a (Step S24).

The search of the minimum point Q is performed based on, for example, the rate of change in current J at the time of opening (di/dt). FIG. 8 is a characteristic chart indicating the rate of change of a current flowing through the opening coil 14 as shown before. With reference to FIG. 8, the minimum point at the time of opening (the minimum point Q of FIG. 5) is searched by focusing the fact that (di/dt) is changed to be not less than a predetermined value in a positive direction at an opening completion point S that corresponds to the minimum point Q. A time tq when this minimum point Q takes place is a movement completion time that is an opening completion time, so that it is determined by error determination means 43c whether or not a time period tq is within a predetermined range (Step S25). In the case of being out of a predetermined range, an error signal indicating the error is transmitted (Step S26). In the case of being within a predetermined range, the program proceeds to Step S31.

A waveform of current flowing through the closing coil 13 at the time of closing is changed in the same manner as a current J shown in FIG. 5. Accordingly, it is possible to search the minimum point at the time of closing in the same manner as in search of the minimum point at the time of opening. That is, a closing command switch 27 is pressed to provide a closing command to the closing coil 13 thereby causing the closing coil 13 to make a closing operation (Step S31). At this time, a current flowing through the connection line 31 is converted into a digital data with the AD converter 33a to be fetched in the memory 33c (Step S32). Thereafter, a smoothing processing is performed (Step S33). The same minimum point as that shown in FIG. 5 is searched by closing-time minimum point search means 43b (Step S34). The search of the minimum point is performed in the same manner as in the foregoing Step S24. A time when this minimum point takes place is a movement completion time of the moving contact 5b, that is, a closing completion time, so that it is determined by error determination means 43c whether or not a closing completion time period is within a predetermined range (Step S35). In the case of being out of a predetermined range, an error signal indicating the error is transmitted (Step S36).

In the case of an abnormally long time period until the completion of opening or closing, there may be any error such as increase in frictional resistance when the moving constant 5 b or the moving iron core 16 travels. Furthermore, in the case where opening or closing has not completed, there maybe any movement failure of, e.g., the moving contact 5b or the moving iron core.

As described above, it is possible to detect the completion of opening or closing without use of a mechanical switching auxiliary contact by monitoring an opening completion time period or a closing completion time period serving as a contact movement completion time period by the error determination means. In addition, it is possible to detect error of driving states such as imperfect turning-on or impossible opening of a breaker, thus enabling to contribute to the prevention of malfunction or to the improvement in reliability.

Embodiment 4

FIG. 13 is a schematic diagram of a characteristic amount-measuring device of a vacuum circuit breaker showing a further embodiment according to the invention. With reference to FIG. 13, a characteristic amount-measuring device 53 acting as a state grasp device includes opening time period calculation means 53a acting as characteristic amount grasp means and error determination means 53b acting as signal transmission means in addition to the same AD converter 33 and contact wear calculation means 33d as those in FIG. 4, and the same opening-time minimum point search means 43a as that in FIG. 11. A difference ΔLw between a current wipe Lw2 at the second predetermined time and a wipe Lw1 having been measured before at the first predetermined time is obtained by the same method as in the above-mentioned first embodiment with the use of AD converter 33a and contact wear calculation means 33d. A wear amount of contact is determined based on the difference ΔLw between the wipes. Further, a position of the minimum point Q (it is also an inflection point) at which currents comes to be the minimum after the inflection point P shown in FIG. 5 is obtained with opening-time minimum point search means 43a.

Opening time period calculation means 53a obtains a time difference Δtd between a time tp and a time tq (tp and tq are shown in FIG. 5) from a time tp that corresponds to the inflection point P and a time tq that corresponds to the minimum point Q. Further, with this time difference Δtd, an opening time period is obtained using an opening time period database in which the relation between a time difference and an opening time period having been preliminarily measured with an actual device is stored in a table form. Error determination means 53b determines whether or not a wear amount of the contact or an opening time period having been obtained as described above exceeds a predetermined value. In the case of exceeding a predetermined value, this error determination means 53b externally outputs an alarm signal, and a wear amount of contact or an opening time period having exceeded predetermined value. In the case of not exceeding a predetermined value, the error determination means 53b externally outputs a wear amount of contact and an opening time period. In addition, it is preferable that opening time period calculation means 53a further makes a conversion of an opening time period having been obtained to obtain an opening velocity.

Furthermore, this time difference Δtd becomes larger as a frictional resistance when the moving contact 5b or the moving iron core 16 travels is increased. Accordingly, it is possible to obtain operating conditions of the vacuum circuit breaker by obtaining the change in the time difference Δtd.

Since it is possible to obtain the change in opening time period based on the positions of the inflection point P and the minimum point Q of a current waveform of the opening coil by such a method, it becomes possible to make a device downsized and inexpensive by eliminating the need of optical adjustment. Furthermore, since there is provided error determination means 53b that determines whether or not a wear amount of contact or an opening time period is out of a predetermined range and transmits an alarm in the case of error, it is possible to monitor operation failure such as error in a wear amount of contact, or imperfect turning-on or impossible opening of a vacuum circuit breaker, thus enabling to achieve the improvement in reliability.

Embodiment 5

FIG. 14 is a schematic diagram of a characteristic amount-measuring device of a vacuum circuit breaker showing a further embodiment according to the invention. With reference to FIG. 14, characteristic amount-measuring device 63 acting as a state grasp device includes contact wear calculation means 63a acting as contact wear grasp means. According to this embodiment, contact wear calculation means 63a obtains a wear amount of contact by the method different from that by the contact wear calculation means 33d shown in FIG. 13. The other arrangement is the same as that according to the third embodiment shown in FIG. 13, so that same reference numerals designate like parts, and further descriptions thereof are omitted. A position of the inflection point P of a current waveform is obtained by the same method as that according to the above-mentioned first embodiment. Further, the minimum point Q at which currents comes to be the minimum after the inflection point P shown in FIG. 5 is obtained with the minimum point search means 53a.

Opening time period calculation means 53a obtains a time difference Δtd between a time tp that corresponds to the inflection point P, and a time tq that corresponds to the minimum point Q (=tq-tp, refer to FIG. 5). Further, with this time difference Δtd, an opening time period is obtained using an opening time period database in which the relation between a time difference Δtd and an opening time period having been preliminarily measured with an actual device is stored in a table form. Contact wear calculation means 63a obtains a difference between a time difference Δtd1 (=tq1-tp1, refer to FIG. 9) at the time of a new contact, being the first predetermined time having been preliminarily measured with an actual device, and a current time difference Δtd2 (=tq2-tp2, refer to FIG. 9) at the second predetermined time (after a predetermined number of switching has performed); and this contact wear calculation means 63a obtains a wear amount of contact from the database representing the relation between the foregoing difference and the wear amount of contact. Error determination means 53b determines whether or not a wear of the contact or an opening time period exceeds a predetermined value. In the case of exceeding a predetermined value, this error determination means 53b externally outputs an alarm signal, and a wear amount of contact or an opening time period having exceeded a predetermined value. In the case of not exceeding a predetermined value, the error determination means 53b externally outputs a wear amount of contact and an opening time period. In addition, it is preferable that opening time period calculation means 53a further makes a conversion of an opening time period. having been obtained to obtain an opening velocity. Furthermore, instead of obtaining a wear amount of contact from the change in time difference Δtd between a time tp and a time tq (the change from Δtd1 to Δtd2), it is preferable to obtain a wear amount of contact from the change in time tq, i.e., a difference between a time tq at the time of a new contact and a time tq2 after a predetermined number of switching has done.

As described above, it is possible to obtain a wear amount of contact from the change in time tp that corresponds to the inflection point P of a current waveform of an opening coil and in time tq that correspond to the minimum point Q thereof; or it is possible to obtain a wear amount of contact from the change in time tq that corresponds to the minimum point Q. Further, it is possible to obtain the change of an opening time period from a time tp that corresponds to the inflection point P of a current waveform of the opening coil and time tq that corresponds to the minimum point Q thereof. Thus, it becomes possible to make a device downsized and inexpensive by eliminating the need of optical adjustment. Furthermore, since there is provided error determination means 53b and this error determination means 53b determines whether or not a wear amount of contact or an opening time period is out of a predetermined range and generates an alarm in the case of error, it is possible to know operation failure such as error in wear amount of contact, imperfect turning-on or impossible opening of a vacuum circuit breaker, thus enabling to achieve the improvement in reliability.

Embodiment 6

FIG. 15 is a schematic diagram of a switching control device of a vacuum circuit breaker showing a further embodiment according to this invention. With reference to FIG. 15, the switching control device 73 includes temperature/capacitor voltage obtaining means 73a, closing time period prediction means 73b, and switching-on timing control means 73c. The remaining arrangement is the same as that shown in FIG. 4. First, the same inflection point P as shown in FIG. 5 is searched, and a time tp when an inflection point takes place is obtained by inflection point search means 33b. Contact wear calculation means 33d calculates a wipe Lw of the moving contact 5b in the same manner as in the first embodiment based on the time ts when currents flowing through the opening coil 14 comes to be the maximum and the above-mentioned time tp, and obtains a wear amount of contact based on a difference from a wipe Lw0 before the contact being worn having been preliminarily calculated. Temperature/capacitor voltage obtaining means 73a obtains data regarding a temperature of the vacuum circuit breaker and a voltage of the closing capacitor 23. Closing time prediction means 73b predicts and operates a closing time period at the time of next closing in accordance with these temperature and voltage, and the above-mentioned wear amount of contact.

The closing time period, which the closing time period prediction means 73b predicts and operates, comes to be longer due to the fact that a resistance of the closing coil 13 is large in the case of the closing coil 13 being at a high temperature, so that a flowing current becomes smaller. In case of the capacitor 23 being at a high temperature, a capacity of the capacitor 23 becomes larger, and the current flowing through the closing coil 13 becomes larger, so that the foregoing closing time period comes to be shorter. In the case of a high charge voltage of the capacitor 23, the current flowing through the closing coil 13 becomes larger, so that the closing time period comes to be shorter. In addition, an internal part of a vacuum circuit breaker or a power switching apparatus including the vacuum circuit breaker can be expected to be at a substantially uniform temperature, so that temperature information at a certain point in the internal part of the power switching apparatus can represent a temperature of the capacitor 23 and the closing coil 13.

Furthermore, when the inflection point P shifts to the left and an opening start time comes to be earlier due to a wear of contact, the moving contact 5b has to travel by an extra distance corresponding to the wear amount of contact, and a movement time period that is an opening time period becomes longer by this distance. Therefore, also at the time of closing, a movement distance of the moving contact 5b becomes longer by a distance for the wear amount of contact (refer to times tp1, tp2 of FIG. 9), so that a closing time period is predicted by adding a time period of moving a distance for this wear amount of contact at the time of closing. Closing timing control means 73c controls a switching-on (closing) timing of a vacuum circuit breaker on the basis of a closing time period having been operated. The switching-on timing is controlled so that, for example, a rush current flowing through the switching contacts may be nearly zero when the vacuum circuit breaker is switched on, thus achieving the reduction in wear amount of contact of a vacuum circuit breaker.

In addition, it is preferable that the predictive operation of a closing time period is made with either of information about a voltage of the closing capacitor 23 or of information about a temperature of the closing coil 13 depending on a required accuracy. This predictive operation can be made also in the later-described seventh embodiment.

Embodiment 7

FIG. 16 is a schematic diagram of a switching control device of a vacuum circuit breaker showing a further embodiment according to the invention. With reference to FIG. 16, a switching control device 83 includes opening-time minimum point search means 43a and closing time period prediction means 83a. The other arrangement is the same as that shown in FIG. 15. First, the inflection point P and the minimum point Q (refer to P, Q of FIG. 5) are searched by inflection point search means 33b and opening-time minimum point search means 43a, and times tp, tq, being opening start and opening completion times when the inflection point P and the minimum point Q take place respectively, are obtained. A movement distance d of the moving contact 5b at the time of opening is obtained from a difference Δtpq between the time tq and time tp. Temperature/capacitor voltage obtaining means 73a obtains data regarding a temperature of the vacuum circuit breaker and a voltage of the closing capacitor 23. Closing time prediction means 83a predicts and operates a closing time period at the time of closing next in accordance with the temperature and voltage, and the above-mentioned movement distance d at the time of opening.

The closing time period, which the closing time period prediction means 83a predicts and operates, comes to be longer due to the fact that a resistance of the closing coil 13 is large in the case of the closing coil 13 being at a high temperature, so that a flowing current becomes smaller. In case of the capacitor 23 being at a high temperature, a capacity of the capacitor 23 becomes larger, and the current flowing through the closing coil 13 becomes larger, so that the foregoing closing time period comes to be shorter. In the case of a high charge voltage of the capacitor 23, the current flowing through the closing coil 13 becomes larger, so that the closing time period comes to be shorter. In addition, an internal part of a vacuum circuit breaker or a power switching apparatus including the vacuum circuit breaker can be expected to be at a substantially uniform temperature, so that temperature information at a certain point in the internal part of the power switching apparatus can represent a temperature of the capacitor 23 and the closing coil 13.

Furthermore, a movement distance of the moving contact 5b at the time of opening extends due to wear of contact, so that also a closing time period comes to be longer by this distance. A table representing the relation between a movement distance d and a closing time period, in which both are associated, has been preliminarily prepared. When predicting a closing time period, the closing time period is obtained with reference to this table. Closing timing control means 73c controls a switching-on (closing) timing of a vacuum circuit breaker on the basis of a closing time period having been operated.

Embodiment 8

According to the foregoing first embodiment, the search of each inflection point on a current waveform is carried out on the basis of the rate of change over time of current (FIG. 8). On the other hand, according to this eighth embodiment, a current waveform is represented by an approximate curve of polynomial. Operations of the case of searching each inflection point on the basis of such approximate curve are hereinafter described referring to a flowchart of FIG. 17.

1) Fetching Current Value (Step S41)

Letting a time t when a vacuum circuit breaker receives an opening command 0, fetching currents flowing through the connection line 31 via the current measuring instrument 32 is started at intervals of a time Δtg (10 μsec), current values are converted into digital data with the AD converter 33a, and the data are stored in an array G of the memory 33c. A value at a time j·Δtg is stored in j-th element of the array G. Then, fetching is ended at a point of time of having obtained N numbers of data.

2) Smoothing (Step S42)

An average value of, e.g., ten numbers of data having been fetched is stored in an array F (Step S42). By smoothing, noise components, which the data having been stored in the array G possess, are reduced. Thus, sampling data having been smoothed at intervals of Δtf=100 μsec can be obtained. Accordingly, a value at a time t=i·Δtf is stored in i-th element of the array F.

3) Maximum Value Searching (Step S43)

An element number imax that provides the maximum value of an array F is obtained.

4) Setting Inflection Point Near-Point Search Start Point (Step S44)

An element number, for example, 30 numbers that correspond to 3 msec before imax is set to be an inflection point near-point search start point ist.

5) Obtaining Approximate Curve with Respect to Array F (Step S45)

Approximation is made with a polynomial using a least square with respect to values of the array F in a range from ist to imax. For example, a quadratic curve $(at^2+bt+c)$ is made to be approximate, and coefficients a, b, c are obtained respectively (refer to FIG. 18). The approximation by the least square is generally a well-known way, so that the detailed description is omitted. Although an approximation is not limited to a quadratic, a quadratic curve is easy to process.

6) Determining Whether or Not Approximation is Successful (Step S46)

It is determined whether or not the approximation is successful with signs of a coefficient a. That is, as shown in FIG. 19, supposing that $a \geq 0$, an approximate curve has a convex shape downward, so that it is failure. In the case of the failure, 1 is added to ist, and the program returns to Step S45. On the other hand, in the case of a<0, an approximate curve has a convex shape upward, so that the approximation is successful. At this time, a value of imax is set to be an approximation end point ied (imax=ied).

7) Obtaining Extrapolation Error (Step S47)

An error $D=F(t)-(at^2+bt+c)$ is obtained with respect to an extrapolation point t=ied+1.

8) Determining Whether or Not it is a Near-Point of an Inflection Point (Step S48)

Whether or not it is a near-point of an inflection point is determined depending on whether or not an error D exceeds a decision value having been preliminarily determined. On the supposition it is a near-point of an inflection point, it will be a value of not more than a decision value.

Then, for example, letting a decision value 5, on the supposition of D≧5 as shown in FIG. 20, it is not a near-point of an inflection point, and the program proceeds to the subsequent Step S19. On the supposition of D>5 as shown in FIG. 21, it is a near-point of an inflection point, and the program proceeds to Step S50.

9) Recalculation of Approximate Curve (Step S49)

1 is added to a value of ied. A quadratic curve (at2+bt+c) is made approximate using a least square again with respect to values of an array F in a range from ist to ied, and coefficients a, b, c are obtained respectively. Then, the program returns to Step S47, and the process from Step S47 to Step S49 is repeated until a near-point of the inflection point is obtained.

10) Setting Inflection Point Search Start Point (Step S50)

An element number of an array G that corresponds to a point that returns, for example, 100 μsec from the near-point of the inflection point is set to be an inflection point search start point jst. That is, jst=10×(ied−1)

12) Setting Inflection Point Search End Point (Step S51)

An element number of an array G that corresponds to a point, for example, 200 μsec ahead from the near-point of the inflection point is set to be an inflection point search end point jed. That is, jed=10×(ied+2)

13) Obtaining Approximate Curve (Step S52)

Approximation is made with a polynomial using a least square with respect to values of the array G in a range from jst to jed. For example, a quadratic curve $(at^2+bt+c)$ is made approximate, and coefficients a, b, c are obtained respectively.

14) Determining Inflection Point (Step S53)

As shown in FIG. 22, tp=−b/(2a) that provides the minimum value of a quadratic curve $(at^2+bt+c)$ is set to be a position of the inflection point P. Further, with reference to FIG. 22, Dn, Dn+1, Dn+2, Dn+3 indicated by black dots are data in the array G.

15) Calculating Time Difference in Inflection Point Positions (Step S54)

A time difference (tp0−tp) between a time tp that corresponds to a position of an inflection point P1 having been searched in such a manner, and a time tp0 that corresponds to a position of an inflection point at the time of the contact not being worn, having been preliminarily measured, is obtained.

15) Calculating Wear Amount of Contact (Step S55)

Contact wear calculation means 33d obtains a wear amount of contact from an expression or table of the relation between the time difference (tp0−tp) and a wear amount of contact (almost in proportion) having been preliminarily obtained by the experiment or calculation.

In the procedure as described above, it is possible to obtain a position of an inflection point of a current waveform of the opening coil using the approximation by a least square, and to obtain a wear amount of contact from the position of the inflection point P (time tp when the inflection point P takes place). Accordingly, it becomes possible to measure a wear amount of contact without use of any optical detector, thus enabling to make a device downsized by eliminating the need of optical adjustment. Contact wear measuring device 33 can be put into practice just with an one-chip IC, thus making it suitable to be integrated in a vacuum circuit breaker which is particularly required to achieve reduction in size and weight, and reduction in cost.

Moreover, an inflection point P or Q can be obtained not only by inflection point search means, minimum point search means or the like, but can be obtained by the following method. For example, a waveform J of currents, shown in FIG. 5, is displayed on a screen of a display; inflection points P and Q are clicked with a mouse by visually observing this display screen; times tp and tq are obtained from address points having been clicked; and a wear amount of contact is automatically calculated from the same database of wear amount of contacts as that used in the first embodiment.

Embodiment 9

Several methods of detection on the basis of current waveform are described in each of the foregoing embodiments. In the case, however, of an opening or closing coil that are excited by an electric charge of capacitors, an inflection point of this voltage similar to that of current appears. Accordingly, conditions of device such as wear amount of contact, opening time period or closing time period can be obtained by the same method. According to this ninth embodiment, a characteristic amount is obtained with an inflection point of this voltage waveform. FIG. 23 shows results of measuring voltages to be induced to a non-excitation coil, i.e., the closing coil 13 at the time of opening operation (indicated by a narrow line), and corresponds to FIG. 5 showing a current waveform. Further, in the drawing, a thick solid line shows a stroke of the moving iron core 16.

With reference to FIG. 23, an inflection point P of a voltage waveform having been obtained can be obtained, for example, based on time differential characteristics thereof, and an opening start time (contact motion start time) tp can be obtained. Accordingly, it comes to be possible to grasp the change in characteristic amounts of a power switching apparatus by the same method as described above in the case of using a current waveform.

Embodiment 10

According to the heretofore embodiments, change information at points of inflection of a current waveform from a movement start point to a movement completion point of a moving iron core (corresponding to an opening completion point Q in the example of FIG. 15) is a target. It is described in this tenth embodiment that change information can be obtained from a waveform after movement completion of the moving iron core.

With reference to FIG. 24, a current waveform after completion of the operation, that is on and after Q point, being a point of time of movement completion of the moving iron core represents a waveform in which change in current caused by bouncing at the time of impact of a moving part of the electromagnetic operating mechanism is superposed Further, a magnitude of this mechanical bouncing reflects conditions such as driving velocity or fixed state of the power switching apparatus. Thus, it is possible to detect the change in state of an apparatus from the change in current waveform on and after this Q point.

Specifically, a current waveform in the case of no bouncing, with the use of specified plural points, is estimated from a current waveform on and after Q point, and a differential between this estimated current waveform (it is indicated by an interpolated curve including a dotted part of FIG. 24) and an actually measured waveform (indicated with a solid line) is obtained. This differential waveform, shown in the lower half of FIG. 24, represents a magnitude of the above-mentioned mechanical bouncing. Numerical values such as maximum value, time width of a waveform or integral value thereof are extracted from this differential waveform. These numerical values are compared with data at the normal time or limit values having been preliminarily determined, thereby making the state determination of a power switching apparatus. In the case where any error is determined, an error signal is outputted. It is possible to preliminarily know an error state of the apparatus by adding such error determination means.

Embodiment 11

In addition, although a vacuum circuit breaker is taken as an example of a power switching apparatus, it is a matter of course to apply this invention to a power switching apparatus including the similarly arranged electromagnetic operating mechanism such as air break switch or electromagnetic contactor. Furthermore, this invention is applicable to wider range of apparatus.

FIG. 25 shows the eleventh embodiment of the invention, in which a state grasp device according to the invention is applied to an electromagnetic operating mechanism to drive a brake apparatus for use in, e.g., elevator. In the drawing, the electromagnetic mechanism 100 is the one similar to the electromagnetic mechanism 10 described with reference to FIGS. 1, 3, a moving iron core 103 drives a connection part 104 in a crosswise direction of a page space by operating currents flowing through a pair of coils 101, 102. FIG. 25 shows a state of brake apparatus being operated, in which a brake lever 106 sandwiches a rail 107 by a constant force due to tension of a release spring 105, resulting in generation of braking force.

When current is supplied to coils 101, 102 to be excited, the moving iron core 103 travels to the left of page space, and causes the brake lever 106 to turn while pressing the release spring 105. The brake lever 106 comes to separate from the rail 107, resulting in release of the braking force. Thus, an elevator cage starts moving.

FIG. 26 shows a coil current waveform of the brake apparatus of FIG. 25. With reference to FIG. 26, an inflection point P subsequent to the time point of current peak is a brake release operation completion time. Furthermore, when, e.g., friction at the connection part is increased owing to deterioration with the passage of time and the mechanism state is changed, a current value is increased as shown in the drawing. The inflection point shifts in order of P1→P2→P3, a brake release operation completion time period becomes longer.

Accordingly, in the same manner as described in the foregoing first embodiment and the like, the change with the passage of time in time information regarding the inflection point is grasped and monitored by inflection point search means of a current waveform, thereby transmitting an error alarm before occurrence of operation failure. In this manner, it is possible to prevent occurrence of fault, as well as to reliably carry out maintenance.

As a matter of course, also the change in friction at the brake-sliding portion exerts effects on time information regarding the inflection point having been searched, so that it is possible to estimate a friction from the data of inflection point.

Further, the invention is not limited to a brake apparatus of an elevator, but is likewise applicable to a valve gear that makes switching operation of valves for use in an automobile, bringing about the same advantages.

Furthermore, generally, the invention is likewise applicable to state grasp of an electromagnetic operating system of which driving characteristics are changed due to change in state factor such as friction, etc., of an operated apparatus that is driven by the electromagnetic operating system, or state grasp of the operated apparatus operated by the electromagnetic operating system.

Additionally, in some fields of a state grasp device according to this invention being applied, only one coil of an electromagnetic operating mechanism thereof is used. In such a device, to search an inflection point from a voltage waveform, it is necessary to measure a voltage of this coil during being supplied with current from a drive power supply such as capacitors. In this case, the change in voltage drop that occurs in internal resistance of the above-mentioned drive power supply due to change in current will be a voltage change waveform, being a search target.

Embodiment 12

A manner of simply detecting a capacity change of the capacitor acting as a drive power supply of an electromagnetic operating mechanism (see FIG. 1) is hereinafter described. That is, generally in a capacitor, elements are deteriorated in the process of repeating the operations of charge and discharge, and an electrostatic capacity thereof decreases by degrees. When a capacity of the capacitor is decreased below a certain level, the current ensuring a normal driving operation cannot be supplied to coils, resulting in operation failure of the electromagnetic operating system. Consequently, it becomes necessary to monitor a capacity.

FIG. 27 shows a voltage waveform of a terminal voltage of the capacitor at the time of discharge to coils. Furthermore, an attention is particularly focused on the change in voltage waveform in the case where a capacity of the capacitor is changed. That is, as shown in the drawing, when a capacity of the capacitor is decreased from an initial state (100%) to 80%, 60%, an attenuating velocity of voltage is found to change. Therefore, by detecting such attenuation of voltage after a predetermined time period has passed from the instant of voltage application, capacity deterioration of the capacitor can be grasped. Supposing that an alarm is transmitted when detecting a predetermined capacity decrease, it is possible to prevent the electromagnetic operating system from occurrence of failure, as well as it is possible to reliably carry out the maintenance.

In particular, on the supposition that this capacity change detection means is integrated into a switching control device according the sixth and seventh embodiments (refer to FIGS. 15, 16), it is possible to monitor a capacity of the capacitor without use of any dedicated capacity monitor, thus enabling to arrange a control device inexpensively.

Embodiment 13

A manner of simply detecting an ambient temperature of an electromagnetic operating system is hereinafter described. An extremely weak current is applied to a closing coil 13 or an opening coil 14 of an electromagnetic operating system at a predetermined time when a breaker is in no operation, and output voltage therefrom is measured. Note that a resistance of, e.g., conductor for use in coils linearly changes with respect to a temperature. Accordingly, a resistance of the coil has been preliminarily measured, and the rate of change in resistance relative to the above-mentioned resistance is measured, thereby enabling to basically grasp an ambient temperature. Since an output voltage in the case where an extremely weak current flows changes in accordance with $V=I*R$ at the time of a resistance being changed, the ambient temperature change can be detected by monitoring the above-mentioned output voltage.

Thus, an error alarm is transmitted before the occurrence of operation failure of a breaker in accordance with an ambient temperature having been detected, whereby it is possible to prevent occurrence of any fault, as well as to reliably carry out the maintenance. Furthermore, supposing that a temperature having been estimated is fetched in the switching control device according to the sixth and seventh embodiments (refer to FIGS. 15, 16), it is possible to monitor an ambient temperature without use of any dedicated thermometer, thus enabling to arrange an inexpensive control device.

In addition, although opening/closing coils of the electromagnetic operating mechanism 10 are used herein, it is also preferable to use, for example, a small coil winding for measuring temperature. This winding is not necessarily required to be integrated in the electromagnetic operating mechanism 10.

Embodiment 14

In this embodiment, a further manner of simply detecting an ambient temperature of an electromagnetic operating system is described.

FIG. 28 shows an example of estimating an ambient temperature using a Hall element. With reference to FIG. 28, a magnetic flux monitoring hole is formed in a part of a stationary iron core, a Hall element 110 is mounted on this monitoring hole. In general, an output voltage from the Hall element has a constant gradient with respect to an ambient temperature. That is, $Vh=K \cdot \alpha \cdot B$ (where: Vh is a Hall element output voltage, K is a temperature coefficient, $\alpha$ is an output sensitivity at an ordinary temperature, and B is a magnetic flux density). In the case where the electromagnetic operating mechanism 10 holds an opening or closing state and a permanent magnet generates a constant magnetic field, the change in Hall element output voltage Vh will show only in the form of a temperature change based on the above-mentioned temperature coefficient k. That is, it comes to be possible to estimate an ambient temperature by monitoring the change in Vh.

Thus, an error alarm is transmitted before the occurrence of operation failure of a breaker in accordance with an ambient temperature having been detected, whereby it is possible to prevent occurrence of any fault, as well as to reliably carry out the maintenance. Furthermore, supposing that a temperature having been estimated is fetched in the switching control device according to the sixth and seventh embodiments (refer to FIGS. 15, 16), it is possible to monitor an ambient temperature without use of a dedicated thermometer, thus enabling to arrange an inexpensive control device.

In addition, although a Hall element is located on the peripheral side of an electromagnetic operating mechanism, this layout position can be anywhere only on condition that it is on the way of path where magnetic fluxes of the permanent magnet 16a pass through.

Embodiment 15

In this embodiment, a state grasp device capable of simply implementing the operation for obtaining current value information or voltage value information at inflection point, is described.

FIG. 29 is a view showing an operation processing section according to a fifteenth embodiment of the invention. With reference to FIG. 29, there are provided first-order differential waveform detection means 124 for detecting a first-order differential waveform of the current flowing through an opening coil 121, and zero•cross detection means 127 for detecting a zero•cross point of this differential waveform and outputting a pulse signal at the zero•cross point.

With reference to FIG. 30, points of being an extremely large value and an extremely small value out of inflection points on a current waveform of this FIG. 30(a) are replaced with zero•cross points on a current first-order differential waveform (FIG. 30(b)). With reference to FIG. 29, current signal conversion means 126A fetches a pulse signal from the zero•cross detection means 127 as a trigger signal, fetches a current value of the opening coil 121 from the current waveform detection means 122 as current change information at these inflection points, and delivers them to characteristic amount measuring device 125.

Voltage signal conversion means 126B fetches a pulse signal from the zero•cross detection means 127 as a trigger signal, fetches a voltage value of the opening coil 121 from the voltage waveform detection means 123 as voltage change information at these inflection points, and delivers them to the characteristic amount measuring device 125.

According to such arrangement, since points of inflection on a current waveform are extracted as a plurality of pulse signals by the zero cross detection means 127, it is unnecessary to fetch all waveforms of current and voltage. Only measured values obtained by reading a pulse signal as a trigger signal by ADC have to be processed in an operating unit. Consequently, it is possible to achieve the reduction in load of the operating unit, and the device arrangement at low cost.

Further, a current differential waveform can be detected with a wire-wound CT. However, since a current waveform of a general electromagnetic operating mechanism includes much signals of a frequency band in the vicinity of 10 Hz, an accurate measurement cannot be performed due to influence of saturation of a core of a normal wire-wound CT equipped with core. A more accurate measurement can be carryout by using an air-core CT (the so-called Rogowski CT).

As shown in FIG. 29, it is preferable that there is provided an OR circuit 129, whereby a pulse signal corresponding to a specified time, which is generated at a timer•unit 128 with reference to a driving start command signal is added as a pulse signal to be used as a trigger signal.

Furthermore, it is preferable that a voltage detected value or a voltage differential detected value may be the target of zero•cross detection other than a current detected value.

As shown in FIG. 30(c), it is preferable to add a circuit acting to let electric signals from first-order differential waveform detection means 124 further into a differential circuit to fetch out a second-order differential signal of current, and to execute peak detection or zero•cross detection of the second-order differential signal. Peak value or zero•cross point of current second-order differential signal represents inflection point of current signal, so that the search of a wider range of inflection points and the operation and obtaining of change information at these inflection points can be simply and inexpensively carried out.

Embodiment 16

FIG. 31 is a schematic diagram showing a state grasp device according to a sixteenth embodiment of the invention. This sixteenth embodiment has an object of simply making the operation of obtaining change information in the same manner as in the foregoing fifteenth embodiment.

With reference to FIG. 31, the fact that there are provided first-order differential waveform detection means 124 for detecting a first-order differential waveform of current through the opening coil 121, and zero•cross detection means 127 for detecting zero•cross points of this differential waveform and outputting a pulse signal at these zero•cross points is the same as in the foregoing first embodiment.

On the other hand, signals that are output from the voltage waveform detection means 123 are inputted to the threshold detection means 130. Only pulse signals from these threshold detection means 130 and zero•cross detection means 127 are inputted to an operating unit of the characteristic amount measuring device 125.

The threshold detection means 130, as shown in FIG. 32, outputs signals of which output pulse signal is ON as long as input signals are signals larger than a constant threshold. Thus, information about a pulse width time period at this time includes information about an attenuation waveform of voltage. It is possible to use this pulse width information as one of measured values for calculating state factors of a device.

An operating unit of the characteristic amount-measuring device 125 calculates a state factor of the power switching apparatus based on time information of each pulse signal from threshold detection means 130 and zero•cross detection means 127.

In addition, it is preferable to take signals from current waveform detection means 122 as inputs of threshold detection means 130.

By employing such arrangement, it is possible to omit an ADC section, thus enabling to arrange an operating unit at less cost.

Embodiment 17

According to each of the foregoing embodiments, described are means and methods for detecting specified states, for example, a contact motion start time or a contact movement completion time, and further a characteristic amount such as wear amount of a switching contact based on a variation over time thereof with information indicated by inflection points on an output waveform provided from measurement means of current or voltage. In the foregoing description, these means and methods are confirmed to be further useful as compared with the conventional means and methods.

Meanwhile, the present invention, that is a state grasp device that obtains change information at inflection points on an output waveform provided from measurement means for measuring current flowing through an electromagnetic coil or voltage generated at an electromagnetic coil, and that estimates a state of an operated apparatus or an electromagnetic operating system on the basis of these change information, is effective as means for grasping a still wider range of states other than in the embodiments having been specifically exemplified heretofore. However, in the actual application thereof, it is necessary to take notice of the following points.

That is, change information, being time information, current value information, and voltage value information at each inflection point are generally affected by plural kinds of states, that is, by the change in a plurality of state factors. Accordingly, to grasp a state quantity of these plurality of state factors in an appropriate manner and with high accuracy, not only the analysis of phenomenon in the case where respective state factors are made to change as a matter of course is needed, but also analysis of complex phenomenon caused by the plurality of factors is further needed.

According to this seventeenth embodiment, although a part of description is overlapped with the foregoing descriptions, various useful methods are described from the above-mentioned viewpoint. Although a power switching apparatus is presumed and described as an operated apparatus, it is a matter of course that this seventeenth embodiment is likewise applicable to the other devices such as brake apparatus having been adopted in the eleventh embodiment.

FIG. 33 shows current and voltage of an opening coil at the time of opening. A charge voltage of the capacitor is used as a driving power supply. A current waveform or voltage waveform of the coil repeats a complicated variation from the start of coil current-carrying to the operation completion of a moving part or after the operation completion, and possesses complicated inflection points of as indicated by A to H in the drawing. Further, in the drawing, a point I indicates as an example a feature time point to be described in the later-described eighteenth embodiment. Ways of these inflection points appearing are different depending on opening/closing operation or types of electromagnetic operating system. A current waveform and a voltage waveform are fetched in the switching control device by current waveform detection means and voltage waveform detection means. Subsequently, inflection points in a waveform are extracted using an analysis algorithm from these waveform data to let times corresponding to these points Ta-Th, current values Ia-Ih, and voltage values Va-Vh.

These measured values are varied depending on a state of the power switching apparatus. Herein, a state of the power switching apparatus is a value of factors causing operation characteristics of the power switching apparatus to change. Due to the fact that a variation of these factors exceeds a predetermined value, any operation fault of the power switching apparatus occurs, or the probability of occurring any operation fault rises These state factors can be changed depending on operation history of the power switching apparatus or with lapse of time. Specifically, the state factors include a temperature of the power switching apparatus, a frictional force generated at a moving part, a capacity of the capacitor and a charge voltage of the capacitor in system of carrying current through coils using the capacitor, a power supply voltage in system of carrying current through coils using a constant voltage power supply, a resistance value in a coil current-carrying circuit, a wear mount of switching constants in a vacuum valve, and a holding power of opening or closing with a permanent magnet.

FIG. 34 shows an example of a coil current waveform at the time of opening of a power switching apparatus in the normal state, and a coil current waveform in the power switching apparatus in which the friction of a driving part is increased. In this example, an electromagnetic coil is driven by a discharge current from the capacitor. When a frictional force that is generated at the moving part is increased, a spring force exerting on the moving iron core and a part of electromagnetic force counteracts the friction, resulting in reduction in force of driving the moving iron core, and the reduction in movement velocity of the moving iron core. Therefore, a time period from the start of movement of the moving iron core to the start of a switching contact being parted, and a time period from the start of movement of the moving iron core to the completion of operation of the moving iron core come to be longer. That is, times Tb, Tf at inflection points B, F are delayed. Further, since a movement speed of the moving iron core at a time point B when the switching contact begins to part becomes smaller as compared with that at the normal time, a counter electromotive voltage that is generated at coils in accordance with a movement speed of the moving iron core, and current is more likely to flow. Accordingly, a current value Ib at an inflection point B tends to be larger as compared with that at the normal time.

Further, at a point F of operation completion of the moving part, a current value If is increased due to decrease in velocity of the moving iron core. Moreover, due to the fact that a driving time period comes to be longer, an electric charge having been discharged from the capacitor until an inflection point F is reached is increased, and a voltage value Vf at the inflection point F is decreased, whereby a current value If is decreased. Since this effect is added, the change different from the change in current value at the inflection point B is shown at the inflection point F. Values of time, current or voltage are likewise changed in accordance with a frictional force at the other inflection points.

FIG. 35 shows an example of a coil current waveform at the time of opening of the power switching apparatus in the normal state, and a coil current waveform in the power switching apparatus of a switching contact being worn. In this example, an electromagnetic coil is driven by a discharge current from the capacitor. When the switching contact is worn, a distance, which the moving iron core travels, from a motion start point A of the moving iron core to a point B of the switching contact begins to part becomes shorter. Therefore, a time Tb at the point B comes to be a smaller value than that at the normal time. Furthermore, a distance, which the moving iron core travels, from the motion start point A of the moving iron core to the point B of the switching contact begins to part is understood to be a compression of a spring. Since a compression of the spring becomes smaller, a velocity of the moving iron core at the inflection point B comes to be smaller as compared with that at the normal time. Accordingly, a counter electromotive voltage that is generated at the coil is decreased in accordance with a movement speed of the moving iron core, and current is more likely to flow. Thus, a current value Ib at the inflection point B tends to be larger as compared with that at the normal time. Further, at the operation completion point F of the moving iron core, the time Tb at the inflection point F becomes larger due to decrease in velocity of the moving iron core. Furthermore, with respect to the increase effect of a current value If due to the decrease in velocity of the moving iron core, an electric charge to be discharged from a capacitor until the inflection point F is reached is increased due to the longer driving time period, and a voltage value Vf at the inflection point F is decreased, whereby a current value If is decreased. Accordingly, the current value If at the inflection point B tends to decrease as compared with that at the normal time. Furthermore, values of a time, current, or voltage are changed in accordance with a wear amount of contact likewise in the other inflection points.

FIG. 36 shows an example of a coil current waveform at the time of opening of a power switching apparatus in the normal state, and a coil current waveform in the power switching apparatus which capacity is decreased due to deterioration of a capacitor. In this example, an electromagnetic coil is driven by a discharge current from the capacitor. When a capacity of the capacitor is decreased, the decrease in capacitor voltage due to the discharge of current to the coil comes to be larger than that at the normal time. Therefore, current values at each inflection point are decreased. On the other hand, since time at each inflection point depends on a velocity of the moving iron core to be determined mainly by a spring force, there is no much difference from those at the normal time.

As described above, the time, current value, and voltage value at each inflection point are reflected on each state of the power switching apparatus at each individual point of time. For example, a current value Ib at the inflection point B is changed in accordance with the change in each state factor such as wear amount of contact, frictional force of the moving part, capacitor deterioration, and has such a correlation as shown in FIGS. 37 (a) to (c). However, in the case where the influence of the change in not less than two state factors is reflected on a current value Ib, it is difficult to separately estimate the changes in not less than two state factors only based on Ib FIGS. 37 (d) to (f) show the influence of the change in each state factor such as wear amount of contact, frictional force of the moving part, a capacitor deterioration on a current value If at the inflection point F. The change tendency due to the change in each state factor of a current value If at the inflection point F is different from the change of value Ib. It can be said that Ib and If have independent change tendencies with respect to three state factors. As a matter of course, current measured values Ib, If at the above-mentioned inflection points B, F are changed depending upon the change in state factors other than. a wear amount of contact, a frictional force of the moving part, and a capacitor deterioration.

In general, in the case where there are M numbers of measured values of, e.g., time, current, or voltage having an independent change tendency with respect to N numbers of state factors, on the supposition of $M \geq N$, it is possible to numerically estimate a variation of N numbers of state factors by first-order approximation from M numbers of measured values. Further, in the case of the presence of a higher-order correlation in the correlation between a state factor and a quantity to be measured, a larger number of independent measured values are needed.

Further, generally, it is necessary that measurement accuracy of these measured values is equal to or below a required sensitivity of a measured value corresponding to a sensitivity required for calculating a variation in state factors. It is possible, however, to achieve higher measurement accuracy by averaging a plurality of measured values. Thus, by adding any non-independent measured value of higher measurement accuracy to the above-mentioned independent measured values, it is possible to improve the accuracy in estimating any state factor variation.

Calculation methods of a variation of state factors include a method of having preliminarily prepared a correlation map between a measured value and a state factor, and calculating a variation of a state factor by interpolation or extrapolation from an actually measured value; or a method of having preliminarily determined a function with which a state factor is directly derived from a measured value. Means for determining these correlation map (database) or function include the method of determination on the basis of actually measured data, the method of determination on the basis of analysis simulation, and the method of determination using both of them.

State factors are numerically calculated, and thereafter these state factors are compared with limit values having been preliminarily determined, thereby enabling to determine error of a power switching apparatus. In the case where states are determined to be in error, an error signal is outputted, thus enabling to preliminarily detect a fault.

In addition, there are some state factors to be varied depending on temperature conditions of the power switching apparatus. For example, a capacity of a general capacitor is decreased due to reduction in temperature, and a resistance value of a coil is decreased due to reduction in temperature. As described above, to divide the change of state factors into that due to the deterioration and that due to temperature variation, temperatures are measured using temperature measuring means, and an estimated value of a variation of state factors are compensated, thereby enabling to carry out more accurate estimation of state factors.

Further, supposing that state factors of the power switching apparatus can be numerically obtained, it is possible to predict operation of the power switching apparatus with the use of these state factors. The prediction of operation is to numerically predict driving parameters such as driving velocity or closing time period at the time of next closing operation base on a variation in state factors at the time of opening operation, or to numerically predict driving parameters such as driving velocity or opening time period at the time of next opening operation based on a variation in state factors at the time of closing operation.

The prediction methods of driving parameters of the power switching apparatus include the method of having preliminarily created a correlation map between state factors and drive parameters, or the method of having preliminarily prepared functions to derive driving parameter from state factors. Further, there is also a method of calculating drive parameters using a correlation map or functions from measured values of time, current value, voltage value, and temperature at points of inflection.

Embodiment 18

According to each of the foregoing embodiments, change information is obtained from inflection points on an output waveform from measurement means of current or voltage. However, the inventors have found the following fact as a result of carrying out extensively various experiments concerning state grasp of devices. The fact is that information useful for state grasp can be obtained from current value information or voltage value information at a time point of feature, being a point of time after a predetermined time period has passed since the moment of starting the excitation of an electromagnetic coil. In addition, this feature time point is not limited to the above-described excitation start time point, but points of time when a predetermined time period has passed from the time points where points of inflection having been described in the foregoing embodiments are positioned, can be targeted.

According to this eighteenth embodiment, described is a method of estimating and grasping states from change information at this feature time point, or how timing of this feature time points is set.

With reference to the mentioned FIG. 33, a point at which a time period Tx has passed since the discharge start, is set to be a feature time point I. At this time, Tx is a time period interval that is determined so that the change in current value or voltage value is larger with respect to the change of specified state factors, and so that the change in current value and voltage value is smaller with respect to the other state factors. FIG. 38 shows situations of the change in coil voltage waveform with respect to the change in each state factor of (a) wear amount of contact, (b) friction, (c) capacitor capacity, and (d) capacitor charge voltage.

For example, in the vicinity of Tx=0.035, the change in current value is small with respect to the change in three state factors of contact wear, friction, and charge voltage; and the change in voltage value is large with respect to the change in capacitor capacity. Further, a voltage value at a point o Tx=0 comes under only the influence of the change in charge voltage. In case of using measured values at such a feature time point, a variation of a specified factor can be separated from the other state factors, and calculated.

As an example of the specific calculation method of a time period interval Tx, there are the following methods. In the case of N numbers of state factors being present, letting the permitted minimum value of a state factor R, being one state factor thereof Rmin and the permitted maximum value of the state factor Rmax, the minimum value, which a voltage value V takes, is VRmin and the maximum value is VRmax when a state factor R is made to change from Rmin to Rmax. Also as to state factors Ti I=1, ..., N−1) other than the state factor R, when letting the maximum value and the minimum value of a voltage value VTi_min, VTi_max in the case where values of each state factor is changed from the permitted minimum value to the permitted maximum value, $s1=|VR\text{max}-VR\text{min}|$ $s2=\Sigma|VTi\_\text{max}-VTi\_\text{min}|$, it is preferable to obtain as Tx such a point that s1 becomes larger than a certain value A having been preliminarily set on the basis of measurement error, and that s2 becomes smaller than a certain value B having been preliminarily set to be smaller than the mentioned value A. Herein, although Tx is obtained with respect to a voltage value, it is also preferable to obtain Tx with respect to a current value.

Furthermore, it is preferable to obtain as Tx such a appoint that S1>A, s2<B, as well as s1 is the maximum.

In addition, it is preferable to obtain such a time period Tx that s1>A, s2<B, as well as d=s2/s1 is the minimum. Further, it is also preferable to select such a plurality of Tx that d is extremely small other than a point of d being the minimum. Moreover, it is preferable that the calculation method of s1 and s2 are $s1=(VR\text{max}-VR\text{min})^2$ $s2=\Sigma(Vi\_\text{max}-Vi\_\text{min})^2$ Furthermore, it is preferable that the calculation method of d is d=s2−s1.

It is also preferable that a selection range of Tx includes a time period after the driving completion of an electromagnetic operating system, in addition to a time period from the start of carrying a coil current to the driving completion of the electromagnetic operating system.

Furthermore, although the method of separating the change in one state factor from the other state factors is described in the above-mentioned example, it is preferable to be used as the method of separating the change in a plurality of state factors from the change in other plurality of state factors.

For example, in the case of N numbers of state factors being present, N, N=M+L, numbers of state factors are divided into M numbers of state factors Ri (i=1, ..., M) and L numbers of state factors Tj (j=1, ..., L). When letting the minimum value and the maximum value of voltage values VRi_max, VRi_min, VTj_max, VTj_min in the case where a value of each state factor is changed from the permitted minimum value to the permitted maximum value, $s1=\Sigma|VRi\_\text{max}-VRi\_\text{min}|$, $s2=\Sigma|VTj\_\text{max}-VTj\_\text{min}|$, it is preferable to obtain as Tx a point at which s1 is larger than a value A and s2 is smaller than a value B. Although Tx is obtained with respect to a voltage value, it is preferable to obtain Tx with respect to a current value.

Further, it is preferable to obtain as Tx a point at which s1>A, s2<B, as well as s1 is the maximum.

It is also preferable to obtain such a time period Tx that s1>A, s2<B, as well as d=s2/s1 is the minimum. Further, it is preferable to select such a plurality of Tx that d is extremely small other than a point of d being the minimum. It is also preferable that the calculation method of s1 and s2 are $s1=\Sigma(VRi\_\text{max}-VRi\_\text{min})^2$ $s2=\Sigma(VTj\_\text{max}-VTj\_\text{min})^2$ Furthermore, it is preferable that the calculation method of d is d=s2−s1. It is preferable that a selection range of Tx includes a time period after the driving completion of an electromagnetic operating system, in addition to a time period from the start of carrying a coil current to the driving completion of the electromagnetic operating system.

By this method, a variation in a specified state factor cannot be estimated based on voltage value or current value. However, by making the combination of measured values of voltage or current at a plurality of feature time points having been obtained by this method, a variation of a specified state factor can be estimated. Further, it is preferable that measured values to be combined are values measured at the above-mentioned inflection points.

Furthermore, in the case of N numbers of state factors being present, N (N=M+N) numbers of state factors are divided into M numbers of state factors Ri (i=1, . . . , M) and L numbers of state factors Tj (j=1, . . . , L).

There is a yet further method of obtaining Tx. By this method, taking respective state factors Ri (i=1, . . . , M) as one group, and letting the minimum of voltage values VRmin and the maximum of voltage values VRmax in the case. where values of state factors that are included in a group thereof are changed from respective permitted minimum values to respective permitted maximum values;

taking respective state factors Ti (j=1, . . . , L) as one group, and letting the minimum of voltage values VTmin and the maximum of voltage values VTmax in the case where values of state factors that are included in a group thereof are changed from respective permitted minimum values to respective permitted maximum values; and $s1=|VR\mathrm{max}-VR\mathrm{min}|$ $s2=|VT\mathrm{max}-VT\mathrm{min}|$, a point at which s1 becomes larger than a value A and s2 becomes smaller than a value B is obtained as Tx. Although, Tx is obtained with respect to a voltage value, it is also preferable to obtain TX with respect to a current value.

Further, it is preferable to obtain as Tx a point at which s1>A, s2<B, as well as s1 is the maximum.

It is also preferable to obtain such a time period Tx that s1>A, s2<B, as well as d=s2/s1 is the minimum. Further, it is preferable to select such a plurality of Tx that d is extremely small other than a point of d being the minimum.

It is also preferable that the calculation method of s1 and s2 are $s1=\Sigma(VRi\_\mathrm{max}-VRi\_\mathrm{min})^2$ $s2=\Sigma(VTj\_\mathrm{max}-VTj\_\mathrm{min})^2$ Furthermore, it is preferable that the calculation method of d is d=s2−s1. It is preferable that a selection range of Tx includes a time period after the driving completion of an electromagnetic operating system, in addition to a time period from the start of carrying a coil current to the driving completion of the electromagnetic operating system.

By this method, a variation of a specified state factor cannot be estimated based on voltage value or current value. However, by making the combination of measured values of voltage or current at a plurality of feature time points having been obtained by this method, a variation in a specified state factor can be estimated. Moreover, it is preferable that measured values to be combined are values measured at the above-mentioned inflection points.

As the method of causing values of a state factor included in a group of one state factor to change from each permitted minimum value to each permitted maximum value, there are a method of continuously changing values, and a method of discontinuously changing values at intervals. Further, as a procedure of causing values of a state factor included in a group of one state factor to change from each permitted minimum value to each permitted maximum value, there are a procedure of causing each state factor to change at a constant rate all at once, and a procedure of causing values of one state factor at a time to change in sequence in such a manner that a value of the first state factor is changed from the minimum to the maximum and subsequently a value of the second state factor is changed from the minimum to the maximum. In the case where M numbers of state factors are included in a group of one state factor, there is a further procedure of dividing values from the permitted minimum value to the permitted maximum value of respective state factors into k−1, and assaying all the combinations of k numbers of values of respective state factors included in a group of a state factor, of which k numbers of values have been obtained by division.

By this method, a variation in a specified state factor cannot be estimated from voltage value or current value. However, by making the combination of measured values of voltage or current at a plurality of feature time points having been obtained in a group of a different state factor, a variation in a specified state factor can be estimated. Further, it is possible to estimate a variation in a specified state factor by combining these measured values with measured values at the other feature time points or inflection points.

As described above, in the state grasp device according to the invention, which is disposed in an electromagnetic operating system that includes a fixed iron core; a moving iron core constructed movably with respect to this fixed iron core; and an electromagnetic coil that is excited by a driving power supply, and causes the moving iron core to travel, thereby driving an operated apparatus that is connected to the moving iron core; the state grasp device comprises measurement means for measuring a current flowing through the electromagnetic coil or a voltage to be generated at the electromagnetic coil, and search means for obtaining change information on an output waveform from this measurement means; and estimates a state of the operated apparatus or electromagnetic operating system on the basis of change information from this search means. As a result, it is possible to estimate states of an operated apparatus or an electromagnetic operating system with a device that needs no optical adjustment, as well as is inexpensive and small-sized.

Further, the search means thereof includes inflection point search means for searching an inflection point on output-time characteristics showing the change with time of output values that are obtained from measurement means, and the search means obtains at least one kind of information out of time information, current value information and voltage value information at the inflection point. As a result, it is possible to obtain useful change information from inflection points on output-time characteristics.

Furthermore, the inflection point search means thereof includes a function to search a position of the other inflection point on the basis of a compensation amount having been preliminarily set from a position of one inflection point. As a result, it becomes easy to search points of inflection.

Further, the inflection point search means thereof obtains a time when an inflection point takes place on the basis of the rate of change with time of the output-time characteristics. As a result, it is possible to easily obtain times when inflection points take place.

Further, the inflection point search means thereof applies output-time characteristics to an approximate curve of polynomial, and obtains a time when an inflection point takes place on the basis of this approximate curve. As a result, it is possible to easily obtain times when inflection points take place.

Further, the search means thereof obtains at least one kind of information of current value information and voltage value information at a feature time point, being a time point after a predetermined time period has passed from at least one of a time point of starting the excitation with the driving power supply and a time point when an inflection point is positioned on output-time characteristics showing the change with time of output values that are obtained from measurement means as change information. As a result, it is possible to obtain useful change information from a feature time point on output-time characteristics.

Further, with respect to each of a plurality of groups consisting of not less than one of state factors having been preliminarily set as to a plurality of state factors causing states of the operated apparatus or electromagnetic operating system, on the basis of output-time characteristic information that can be obtained by causing state quantities of a state factor belonging to a group thereof to change within a predetermined range;

the search means thereof extracts a time zone in which change in output due to change in state quantity of the state factor on output-time characteristic information corresponding to a group of one state factor is larger than a value A having been preliminarily set on the basis of a measurement error; as well as change in output due to change in state quantity of the state factor on output-time characteristic information corresponding to a group of at least one of the other state factors is smaller than a value B having been preliminarily set to be smaller than the above-mentioned value A, and selects at least one time point as a feature time point for each of these time zones having been extracted. As a result, it is possible to obtain useful feature time points.

Further, the electromagnetic operating system thereof drives a moving contact of a switching contact of a power switching apparatus, being an operated apparatus; and search means thereof includes at least one of a first inflection point search means for obtaining, as a contact motion start time, a time when a first inflection point that appears subsequently to the maximum value of a current waveform provided from current measurement means takes place, and a second inflection point search means for obtaining, as a contact movement completion time, a time when a second inflection point, which takes place after the contact motion start time, and at which a current waveform becomes the minimum, takes place. As a result, it is possible to obtain a contact motion start time or a contact movement completion time of a power switching apparatus with a device that needs no optical adjustment, as well as is inexpensive and small-sized.

Further, there is provided characteristic amount grasp means for obtaining change in characteristic amount of the power switching apparatus from a variation with time in at least one of a contact motion start time and a contact movement completion time. As a result, it is possible to obtain the change in various characteristic amounts with a device that needs no optical adjustment, as well as is inexpensive and small-sized; and it is further possible to appropriately grasp a state of the power switching apparatus.

Further, the electromagnetic coil thereof is an opening electromagnetic coil; first inflection point search means obtains, as a first contact motion start time, a contact motion start time when the opening electromagnetic coil is excited at a first predetermined time, as well as obtains, as a second contact motion start time, a contact motion start time when the opening electromagnetic coil is excited at a second predetermined time sequentially after the first predetermined time; and the characteristic amount grasp means obtains a wear amount of the switching contact as a characteristic amount on the basis of the first and second contact motion start times. As a result, it is possible to obtain a wear amount of the switching contact with a device that needs no optical adjustment, as well as is inexpensive and small-sized.

Further, the electromagnetic coil thereof is an opening electromagnetic coil; second inflection point search means obtains, as a first contact movement completion time, a contact movement completion time when the opening electromagnetic coil is excited at a first predetermined time, as well as obtains, as a second contact movement completion time, a contact movement completion time when the opening electromagnetic coil is excited at a second predetermined time sequentially after the mentioned first predetermined time; and the mentioned characteristic amount grasp means obtains a wear of the switching contact as a characteristic amount on the basis of the first and second contact movement completion times. As a result, it is possible to obtain a wear amount of the switching contact with a device that needs no optical adjustment, as well as is inexpensive and small-sized.

Further, the electromagnetic coil thereof is an opening electromagnetic coil, and includes both first inflection point search means and second inflection point means; at the first predetermined time, the first inflection point search means obtains, as the first contact motion start time, a contact motion start time when the opening electromagnetic coil is excited, and the second inflection point search means obtains a contact movement completion time as the first contact movement completion time; at the second predetermined time sequentially after the mentioned first predetermined time, the first inflection point search means obtains, as the second contact motion start time, a contact motion start time when the opening electromagnetic coil is excited, and the second inflection point search means obtains a contact movement completion time as the second contact movement completion time; and characteristic grasp means obtains a first time difference, being a difference between the first contact movement completion time and the first contact motion start time, as well as obtains a second time difference, being a difference between the second contact movement completion time and the second contact motion start time, and obtains as a characteristic amount a wear amount of the switching contact on the basis of the first and second time differences. As a result, it is possible to obtain a wear amount of the switching contact with a device that needs no optical adjustment, as well as is inexpensive and small-sized.

Further, there are provided both first and second inflection point search means; and the mentioned characteristic amount grasp means obtains, as a characteristic amount, a movement time period of the moving contact on the basis of a contact motion start time and a contact movement completion time. As a result, it is possible to obtain a movement time period of the moving contact with a device that needs no optical adjustment, as well as is inexpensive and small-sized.

Further, the electromagnetic operating system thereof drives a moving contact of a switching contact of a power switching apparatus, being an operated apparatus, is provided with an opening electromagnetic coil and a closing electromagnetic coil to be excited with an electric charge having been charged in a capacitor; the search means thereof includes at least one of the first inflection point search means obtaining, as a contact motion start time, a time when the first inflection point takes place which point appears subsequently to the maximum value of a current waveform provided by current measurement means, and the second inflection point search means obtaining, as a contact movement completion time, a time when the second inflection point, which takes place subsequently to the contact motion start time, and at which a current waveform becomes the minimum, takes place; and there are provided closing time period prediction means for predicting a closing completion time period when the closing electromagnetic coil is excited next on the basis of at least one of a contact motion start time and a contact movement completion time, and at least one of a charge voltage of the capacitor and temperature information of the power switching apparatus; and timing control means for controlling timing of exciting the closing electromagnetic coil next on the basis of a closing completion prediction time period. As a result, it is possible to make an operating life of the switching contact longer.

Further, there is provided means for measuring a voltage of the electromagnetic coil when a predetermined extremely weak current is carried to the electromagnetic coil, obtaining coil resistance change characteristics of the electromagnetic coil from current voltage values, and obtaining temperature information of the closing electromagnetic coil on the basis of this coil resistance change characteristics. As a result, it is possible to grasp an ambient temperature inexpensively without provision of a dedicated thermometer.

Further, a Hall element is mounted on the iron core forming a magnetic circuit, and there is provided means for measuring voltage change characteristics of the Hall element under the conditions of constant magnetic flux, and obtaining temperature information of the closing electromagnetic coil on the basis of this voltage change characteristics. As a result, it is possible to gasp an ambient temperature inexpensively without provision of a dedicated thermometer.

Further, at least one of an inflection point and a feature time point contains a point that is extracted on output-time characteristics after the movement completion of the moving iron core. As a result, it is possible to cause a state after the movement completion of the moving iron core to be a grasp target.

Further, the search means thereof includes zero•cross detection means for differentiating a current flowing through the electromagnetic coil or a voltage generated at the electromagnetic coil, and for outputting a pulse signal at a zero•cross point of differential output thereof; and obtains time information of an inflection point with a pulse signal. As a result, it is possible to achieve reduction in operation load, and reduction in cost.

Further, there is provided operation means for operating at least one kind of variation in state quantity, a driving parameter, and a remaining operating life of the operated apparatus or electromagnetic operating system on the basis of at least one kind of information of time information, current value information, and voltage value information at the inflection point, and current value information and voltage value information at a feature time point. As a result, it is possible to grasp a wide variety of states of an operated apparatus and electromagnetic operating system.

Further, there is provided signal transmission means for transmitting signals when a change amount over time of the variation exceeds a predetermined value. As a result, it is possible to preliminarily detect driving error; and it is possible to prevent occurrence of malfunction of the operated apparatus and electromagnetic operating system, resulting in improvement in reliability.

INDUSTRIAL APPLICABILITY

A state grasp device according to the present invention is not only applicable to a power switching apparatus such as vacuum circuit breakers, but is widely applicable to an electromagnetic operating system including a fixed iron core; a moving iron core constructed movably with respect to this fixed iron core; and an electromagnetic coil that is excited by a driving power supply, and causes the moving iron core to travel, thereby driving an operated apparatus that is connected to the moving iron core such as electromagnetic operating mechanism to drive a brake apparatus for use in elevators, etc. With this state grasp device, it is possible to grasp various states of an operated apparatus simply and inexpensively without use of complicated and expensive optical means.

BRIEF DESCRIPTION OF DRAWINGS

FIG. 2 are state views each showing switching states of the vacuum circuit breaker.

DESCRIPTION OF REFERENCE NUMERALS

Figure 1:
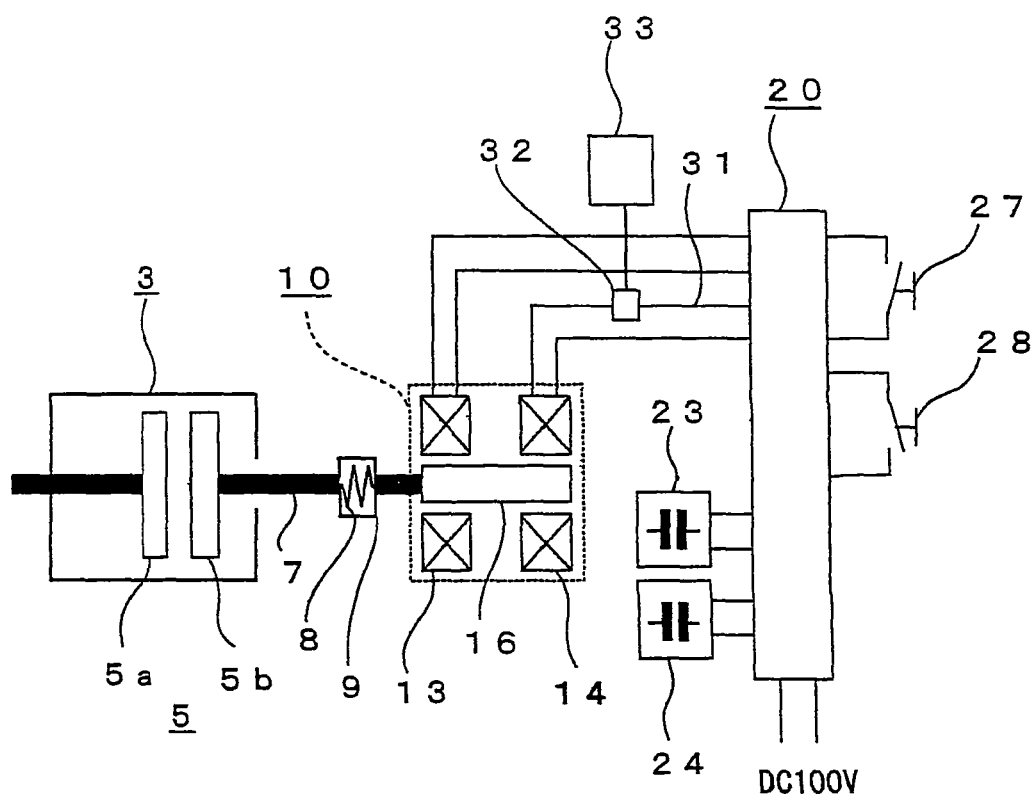
FIG. 1 is a schematic view of a vacuum circuit breaker using an electromagnetic operating mechanism according to a first preferred embodiment of the present invention.
Figure 3:
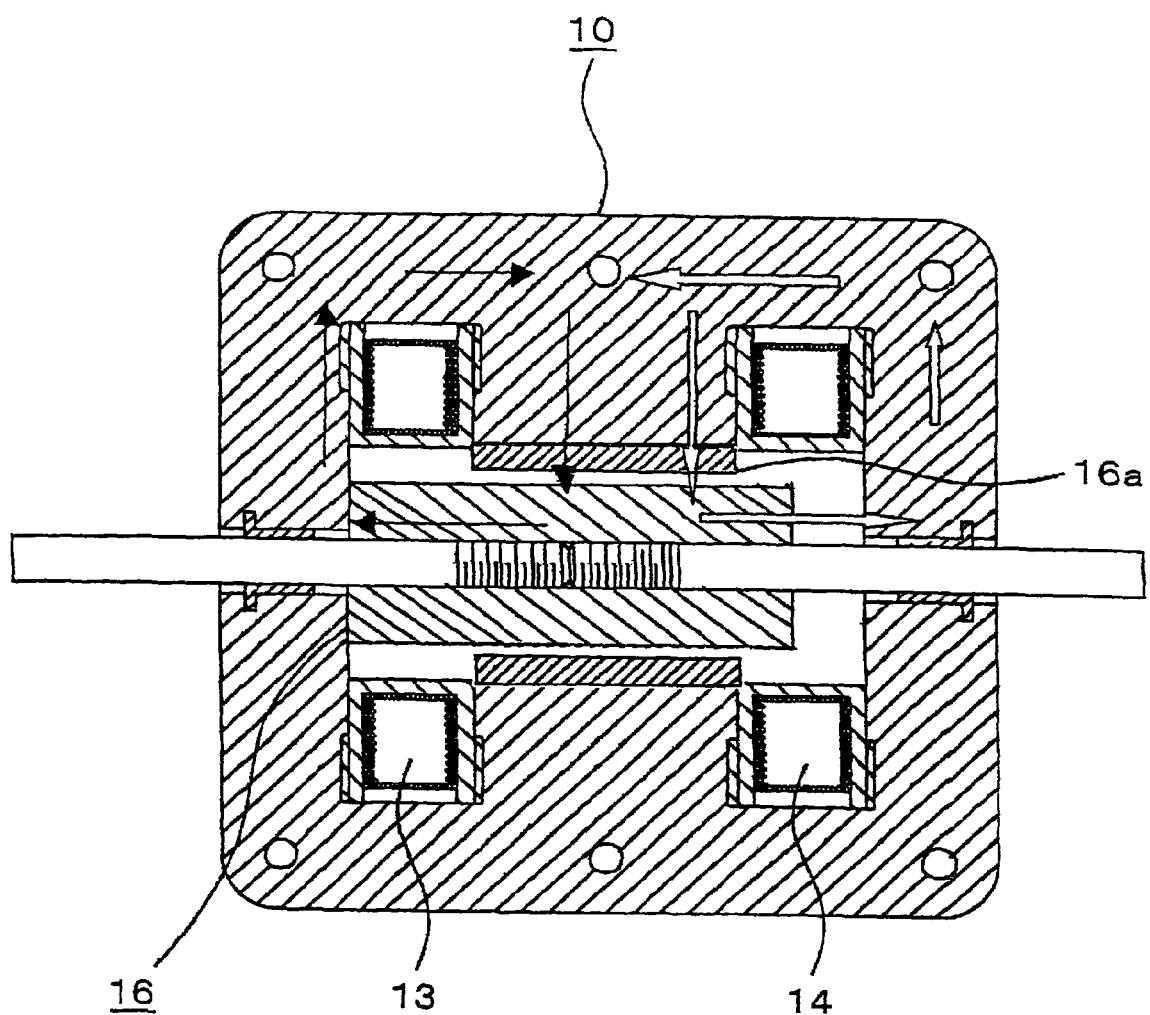
FIG. 3 is an enlarged view of an electromagnetic operating mechanism of FIG. 1.
Figure 4:
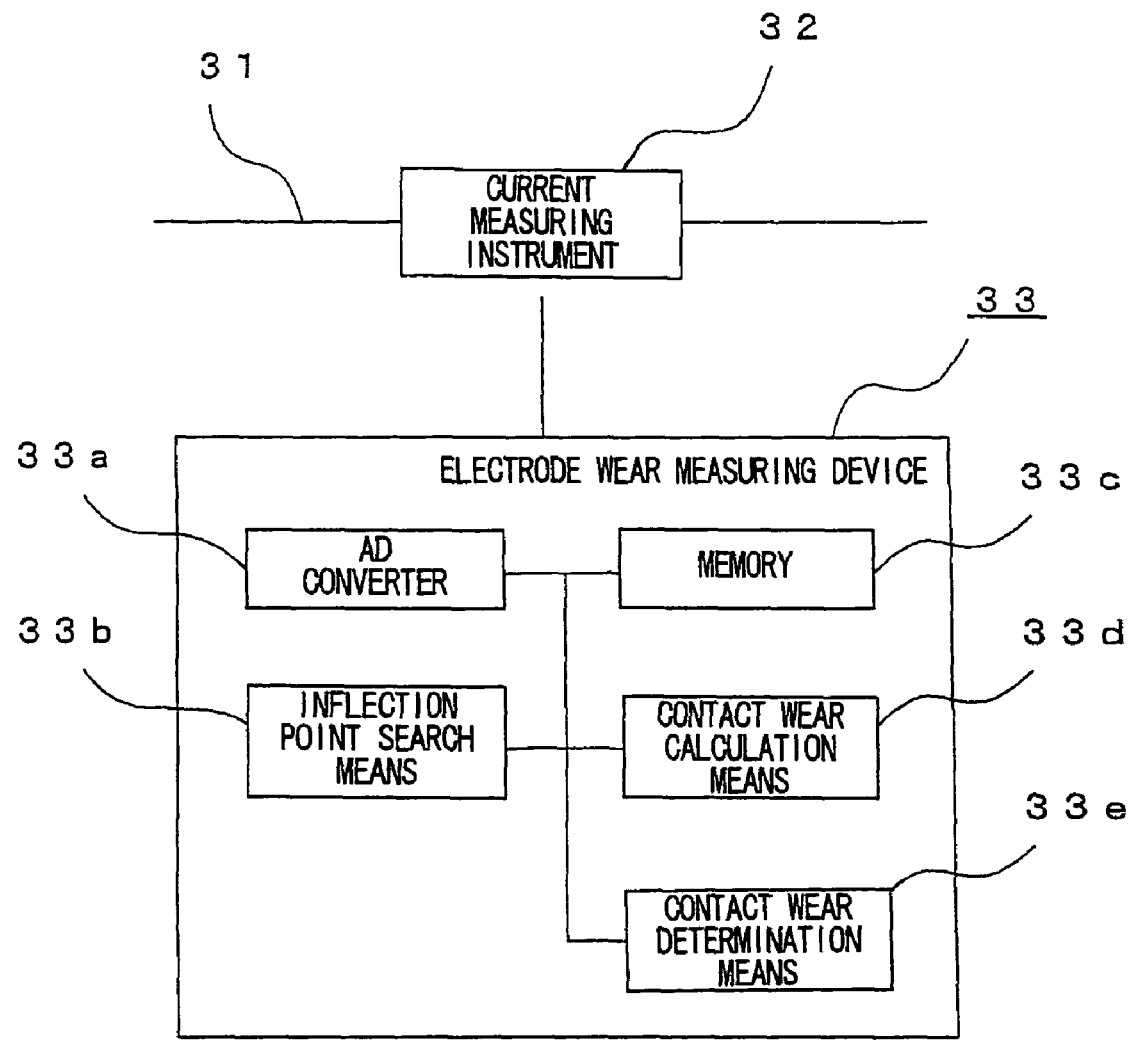
FIG. 4 is a schematic diagram showing an arrangement of a contact wear-measuring device of FIG. 1.
Figure 5:
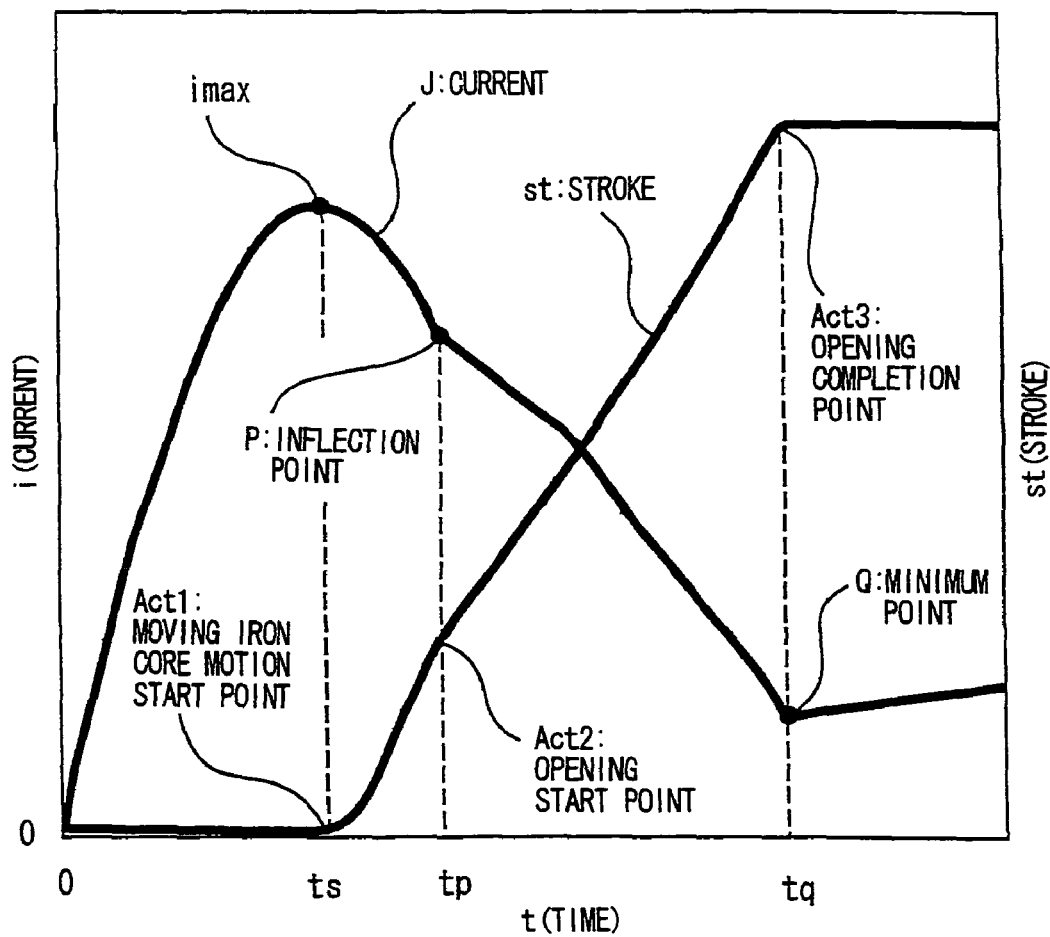
FIG. 5 is a characteristic chart showing a current flowing through an opening coil and a stroke of a moving iron core.
Figure 6:
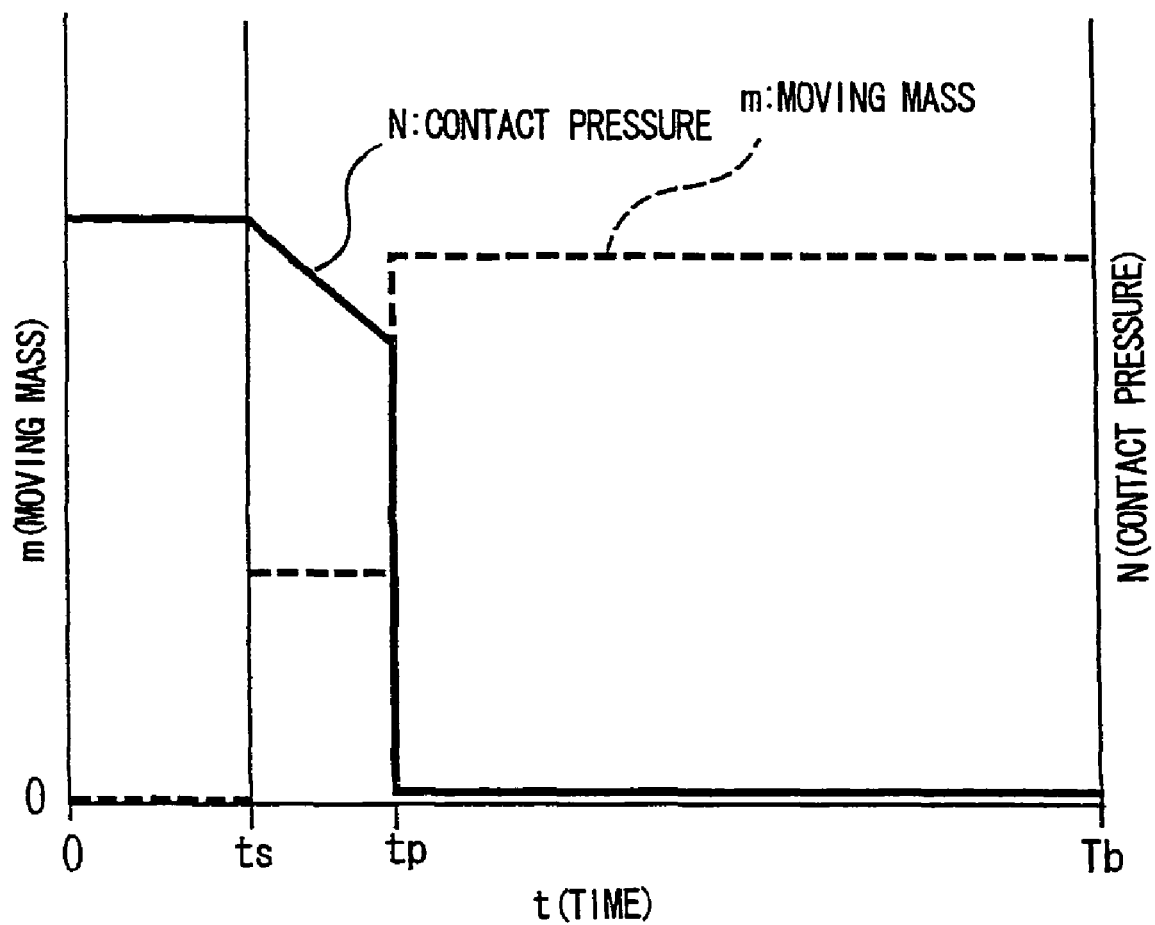
FIG. 6 is a characteristic chart showing a mass and a contact pressure of a contact at the time of operation of a vacuum circuit breaker.
Figure 7:
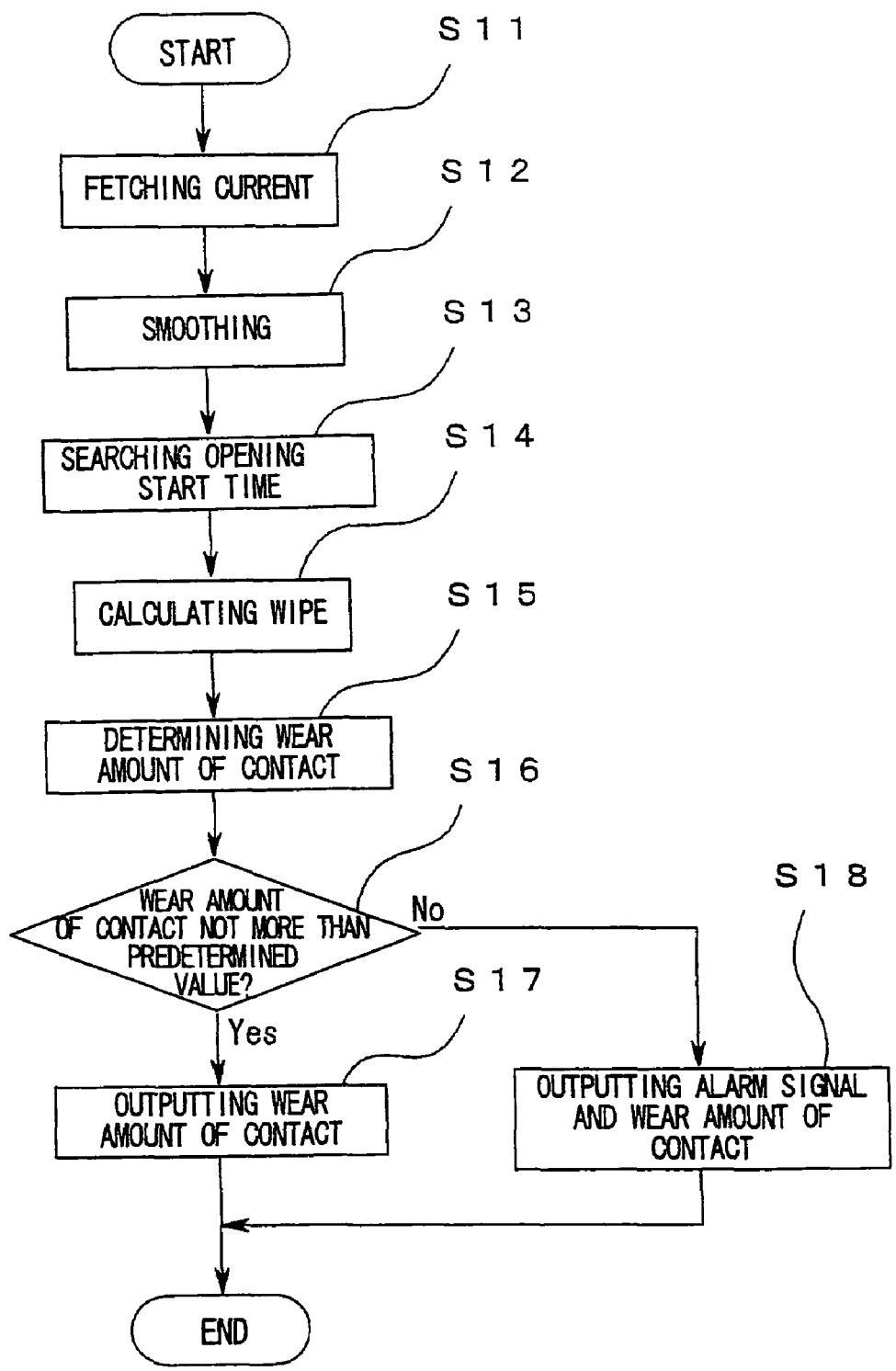
FIG. 7 is a flowchart for explaining operation of the contact wear measuring device of FIG. 1.
Figure 8:
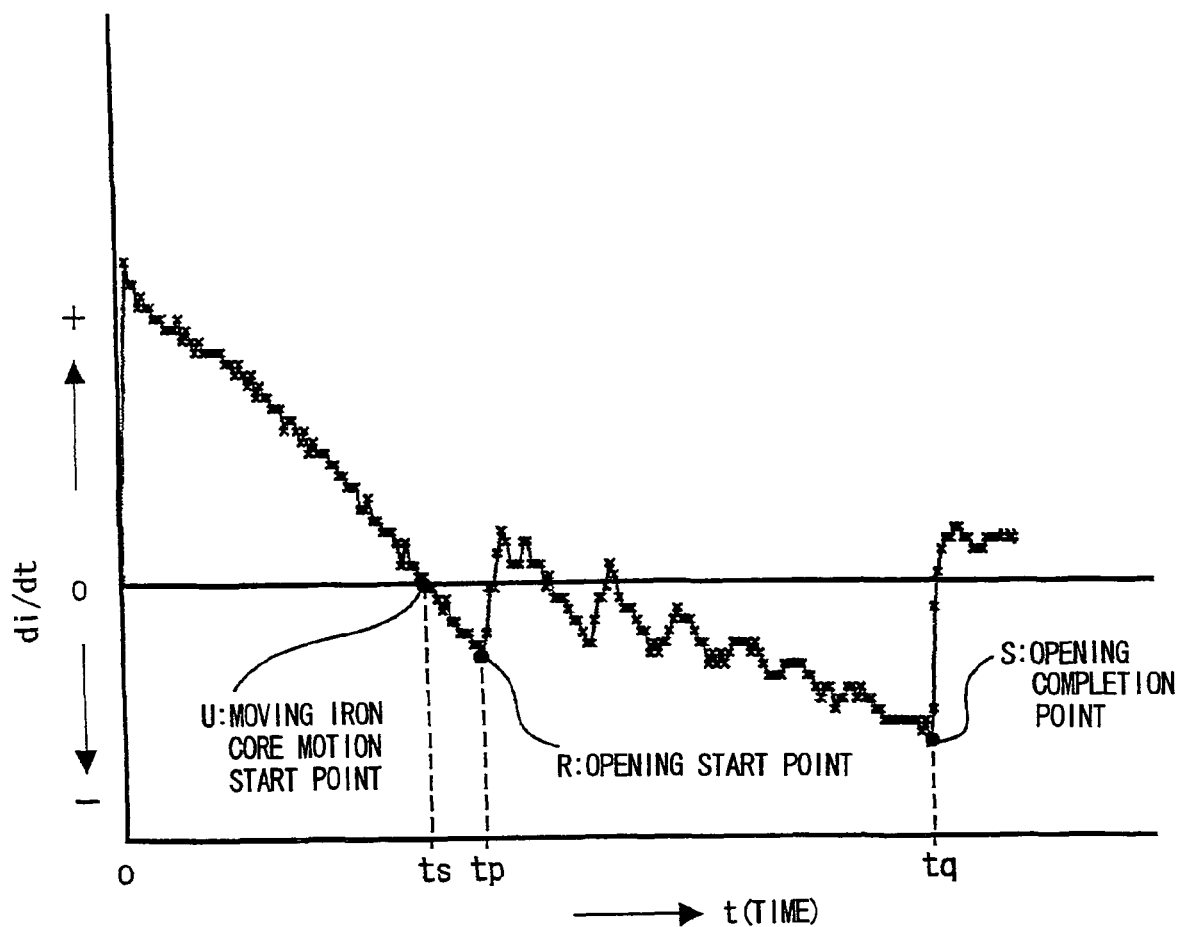
FIG. 8 is a characteristic chart showing the rate of change in current flowing through the opening coil.
Figure 9:
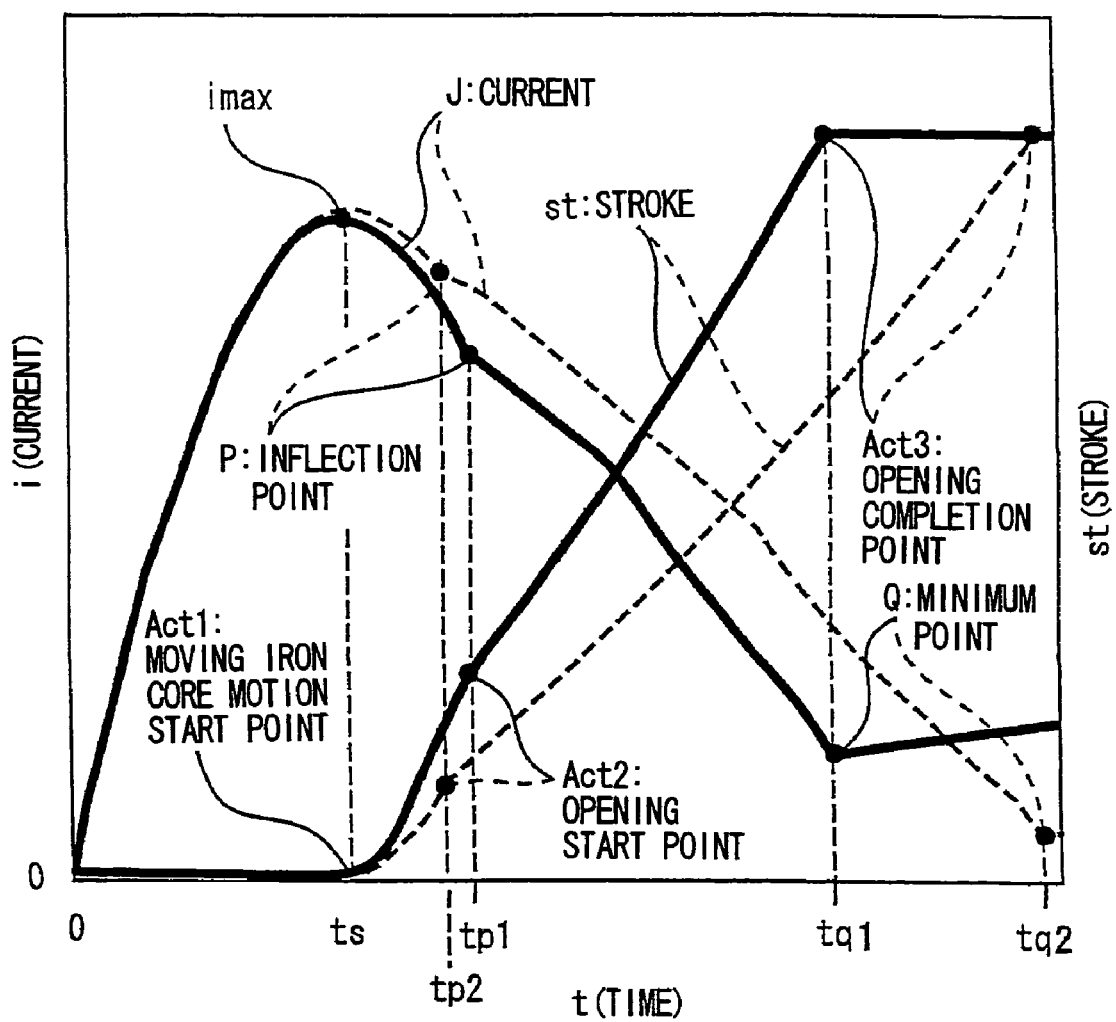
FIG. 9 is an explanatory chart showing a waveform of current flowing through the opening coil and a stroke in comparison between at the time of no wear of contact and at the time of some wear of the contact.
Figure 10:
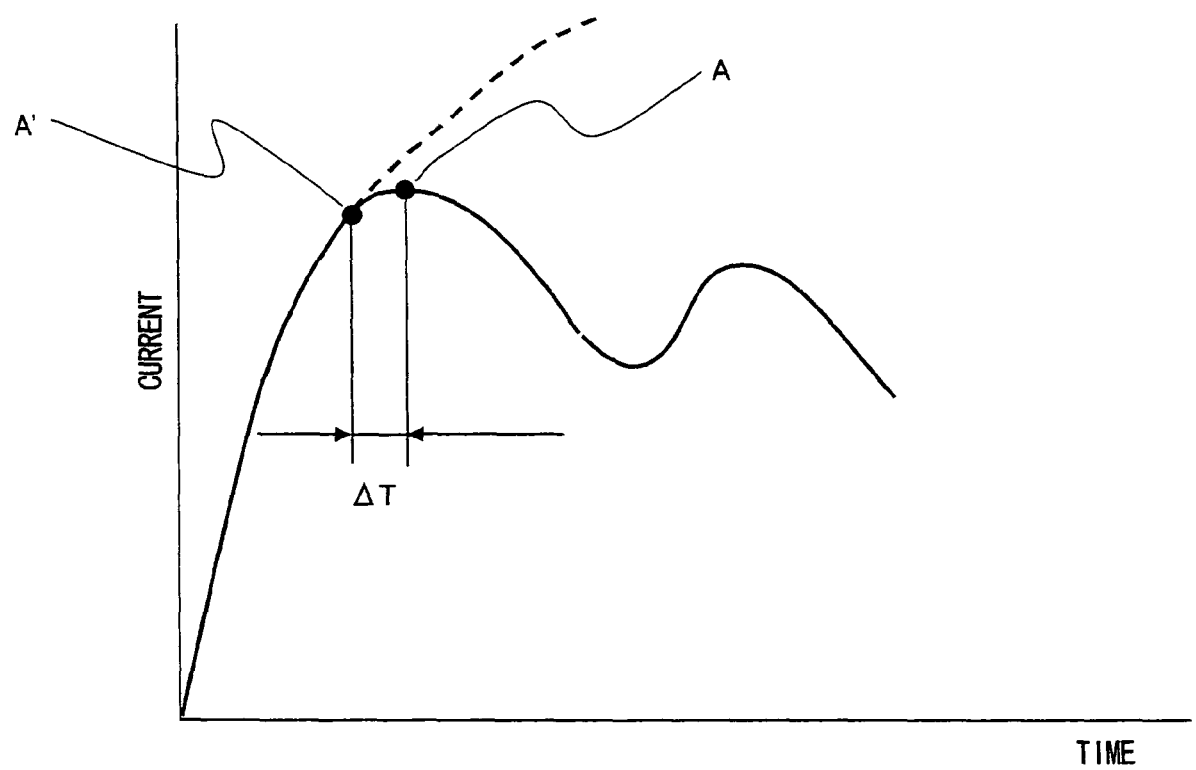
FIG. 10 is a chart explaining a manner of obtaining the other inflection point A' by compensation from the inflection point A according to a second embodiment of the invention.
Figure 11:
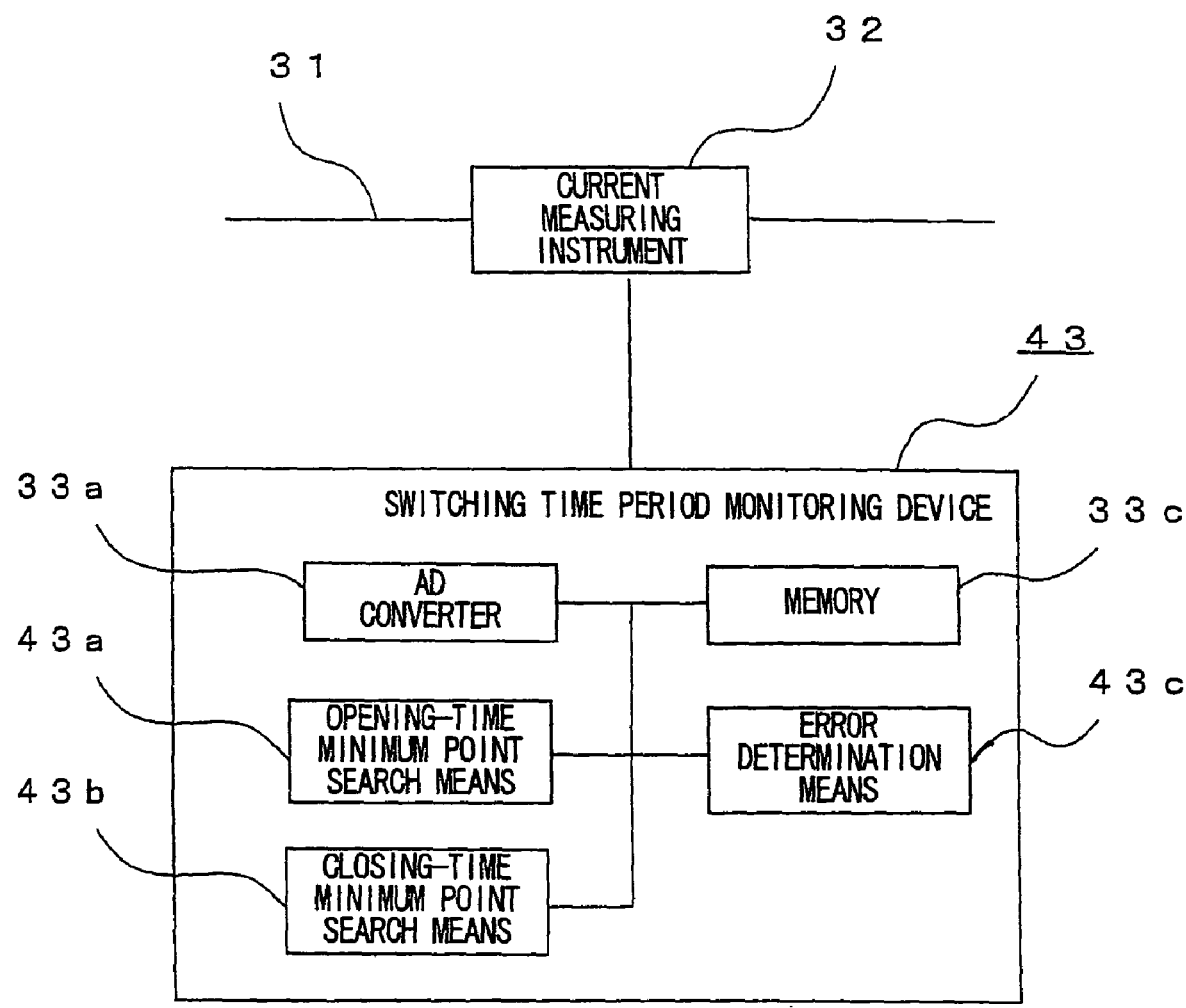
FIG. 11 is a schematic diagram of a switching time period monitoring device of a vacuum circuit breaker according to a third embodiment of the invention.
Figure 12:
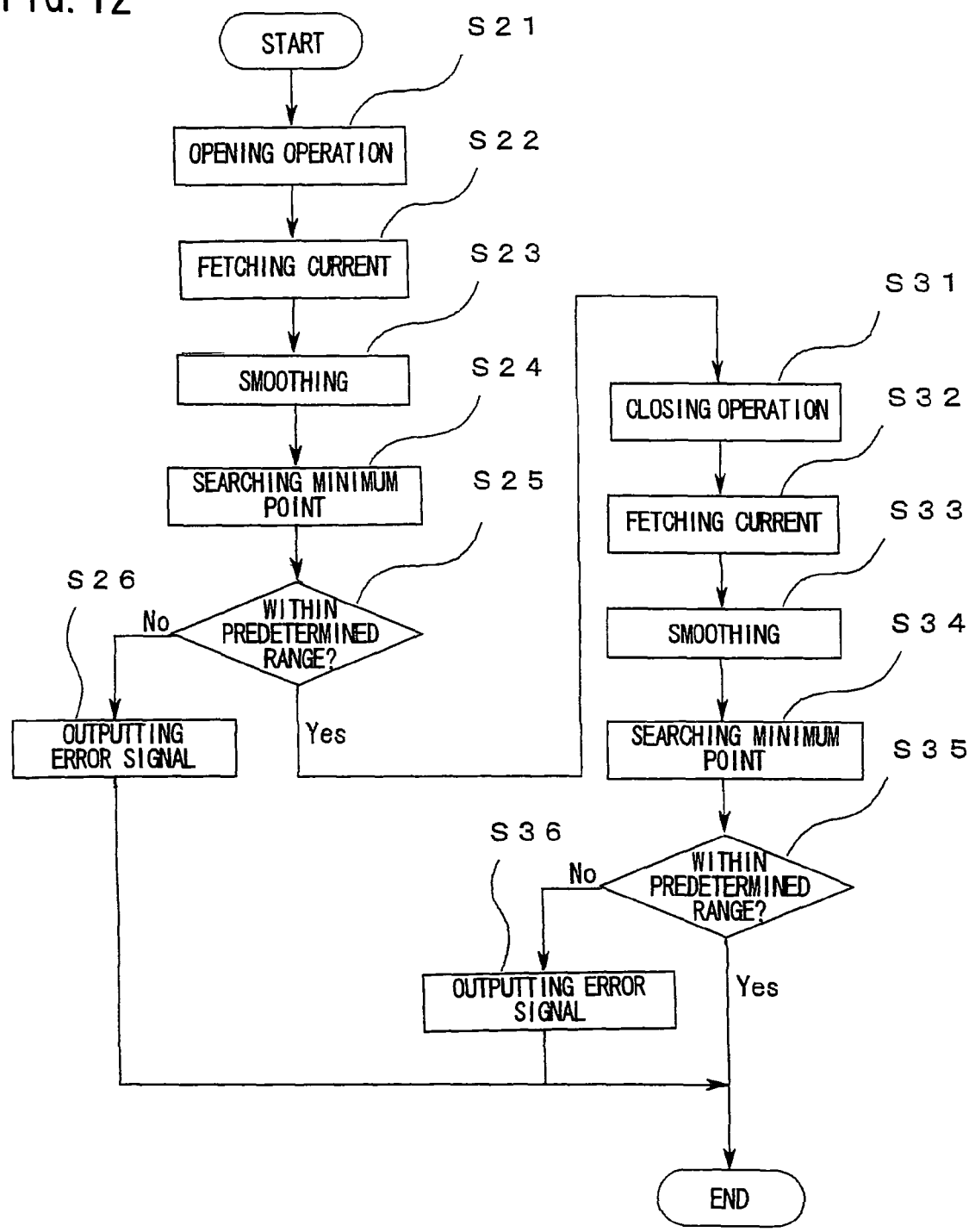
FIG. 12 is a flowchart for explaining operation of the switching time period monitoring device of FIG. 11.
Figure 13:
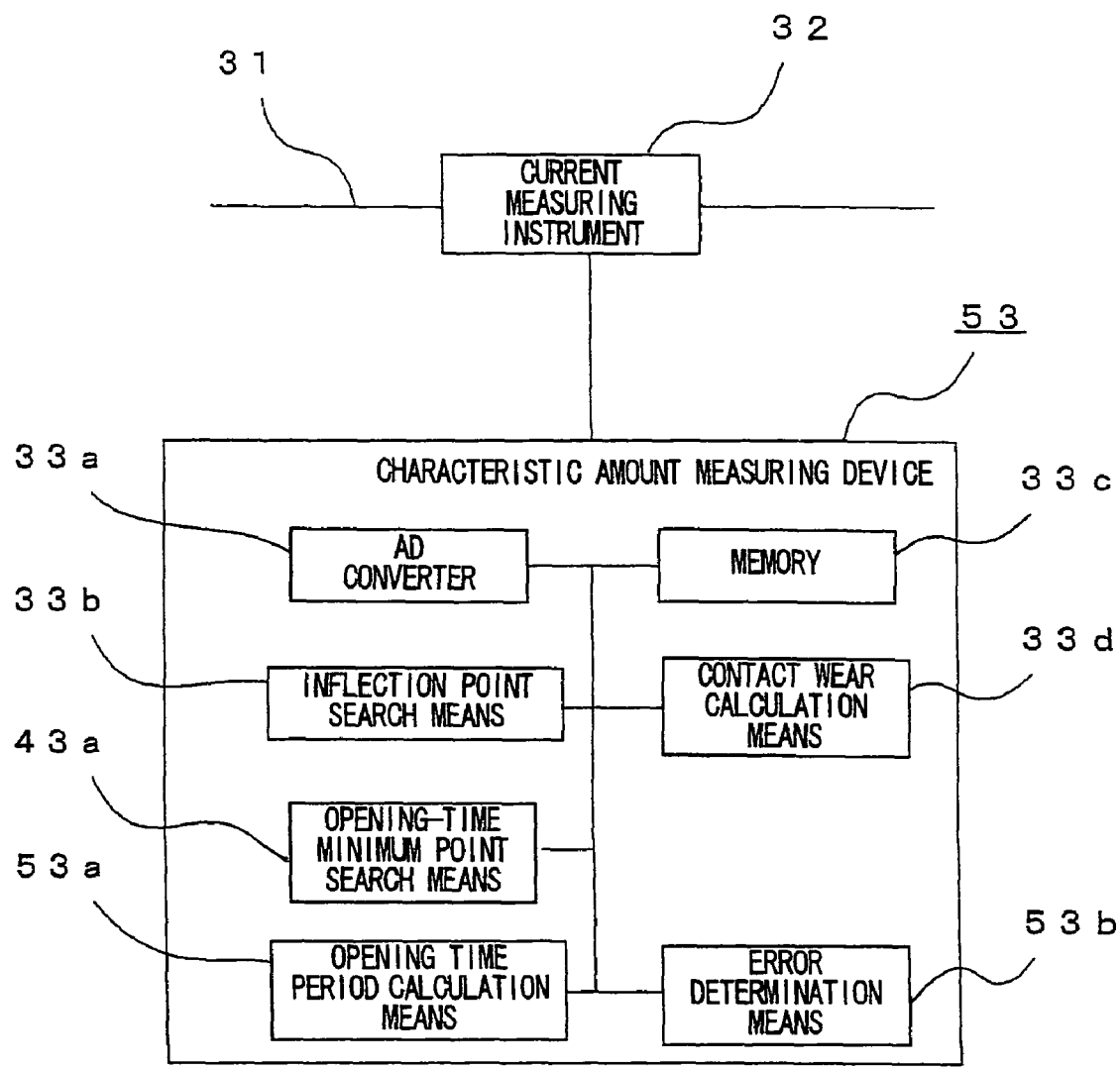
FIG. 13 is a schematic diagram of a characteristic amount measuring device of a vacuum circuit breaker according to a fourth embodiment of the invention.
Figure 14:
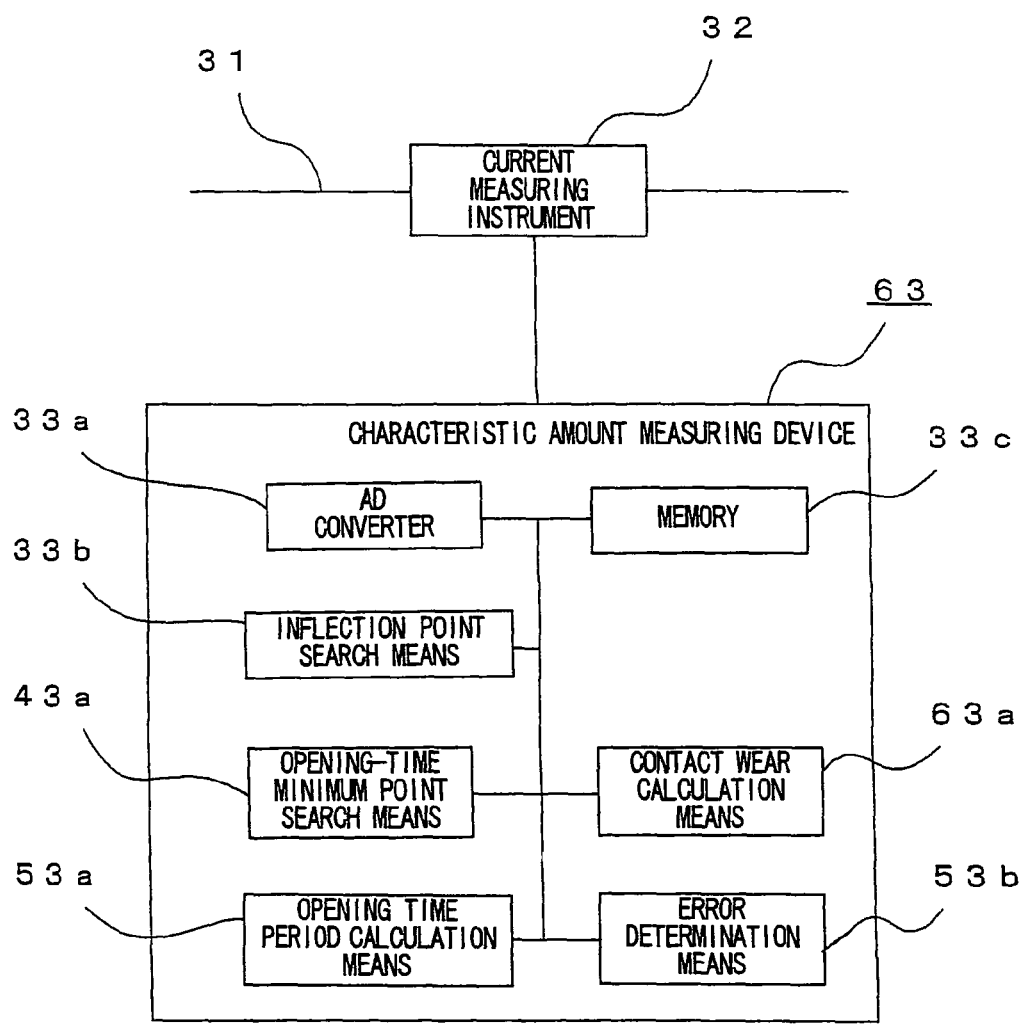
FIG. 14 is a schematic diagram of a switching control device of a vacuum circuit breaker according to a fifth embodiment of the invention.
Figure 15:
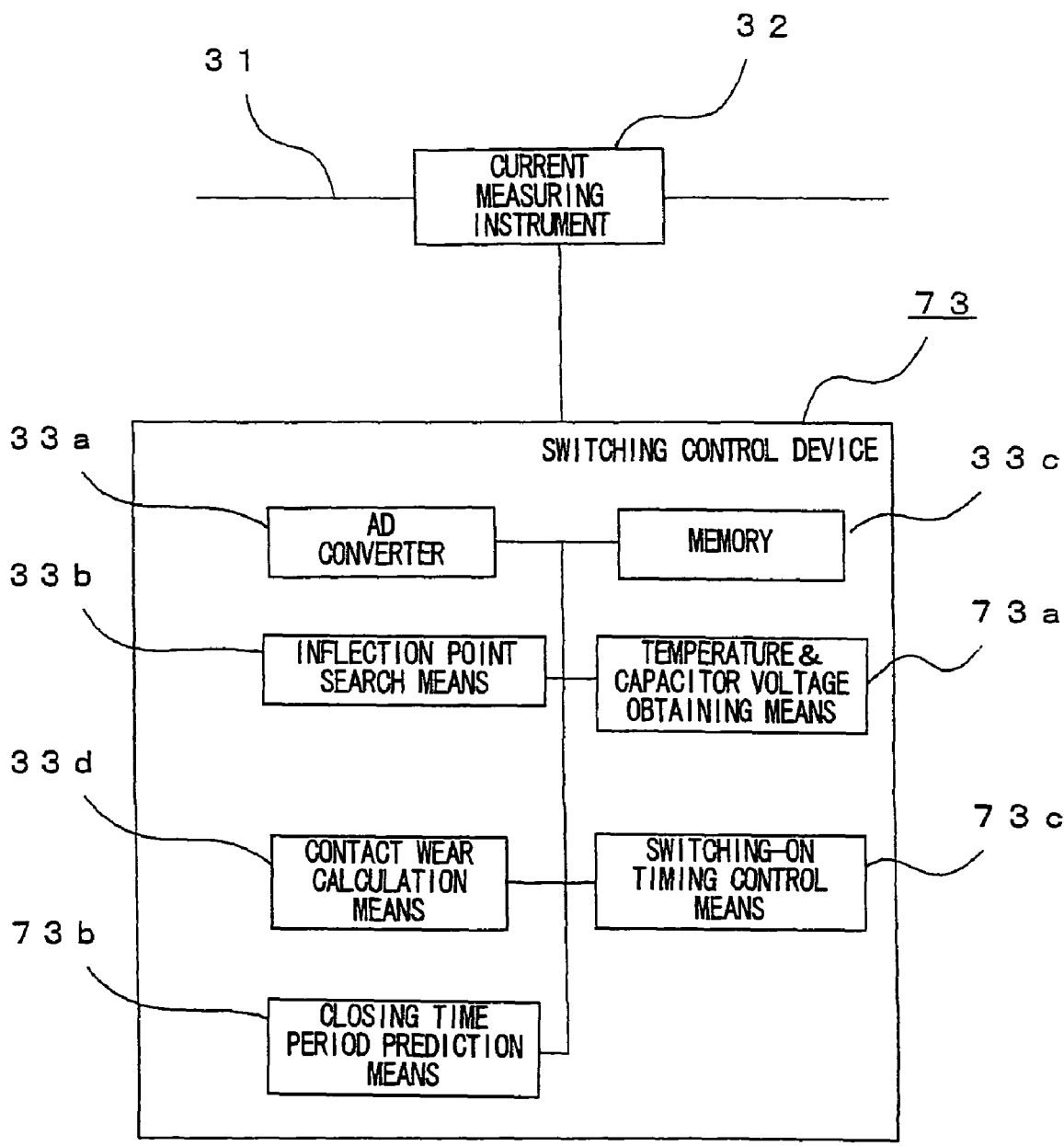
FIG. 15 is a schematic diagram of a switching control device of a vacuum circuit breaker according to a sixth embodiment of the invention.
Figure 16:
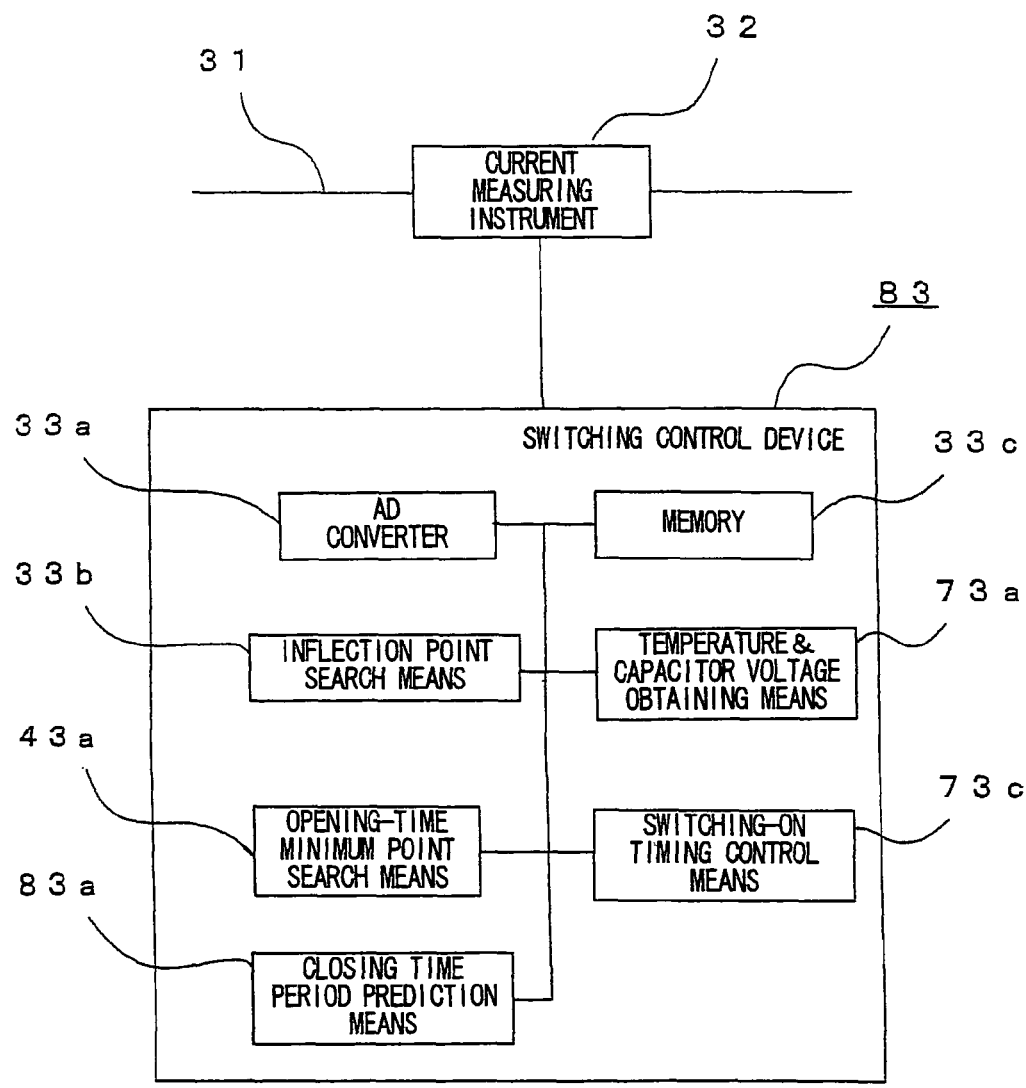
FIG. 16 is a schematic diagram of a switching control device of a vacuum circuit breaker according to a seventh embodiment of the invention.
Figure 17:
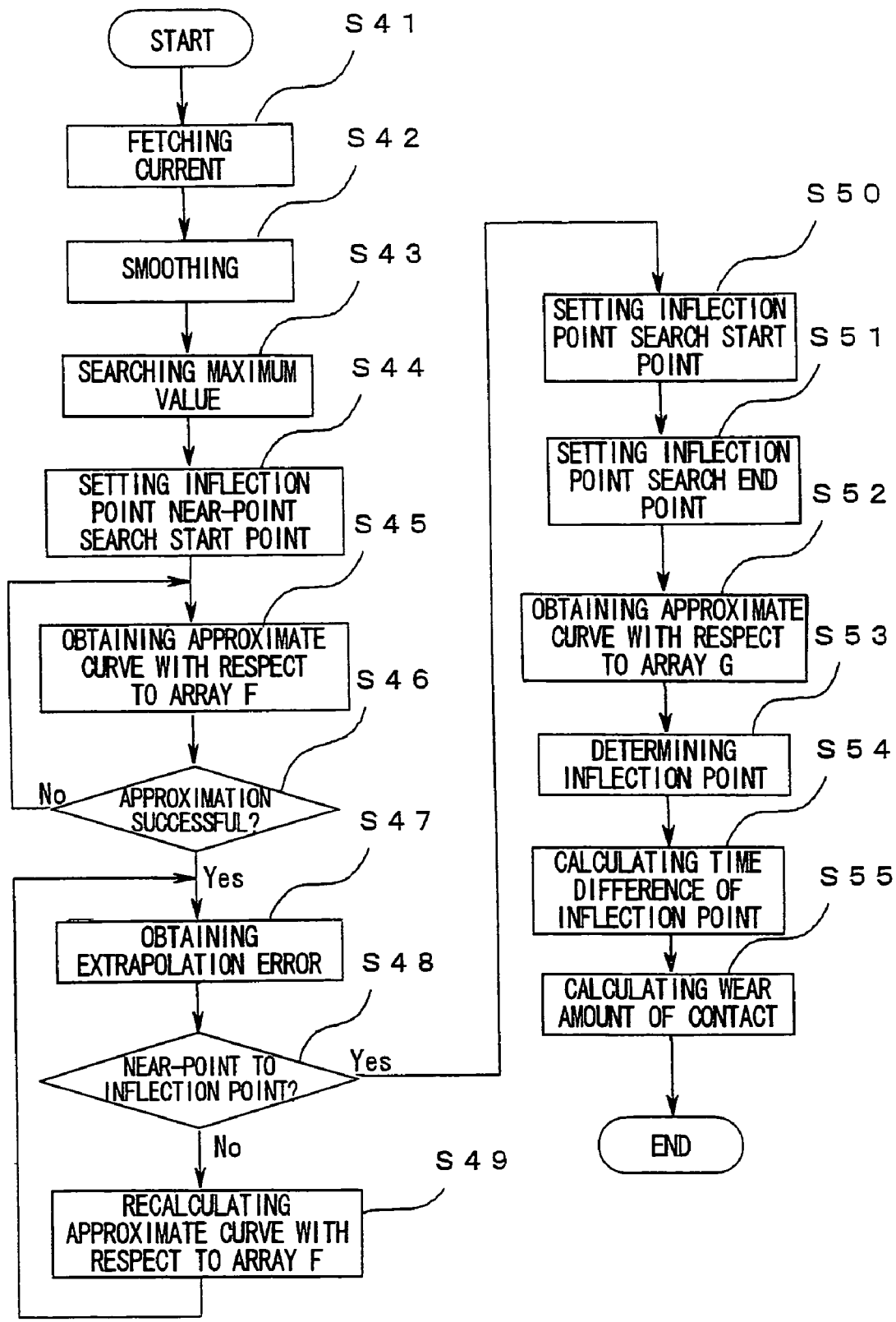
FIG. 17 is a flowchart for explaining operation of a contact wear-measuring device of a vacuum circuit breaker according to an eighth embodiment of the invention.
Figure 18:
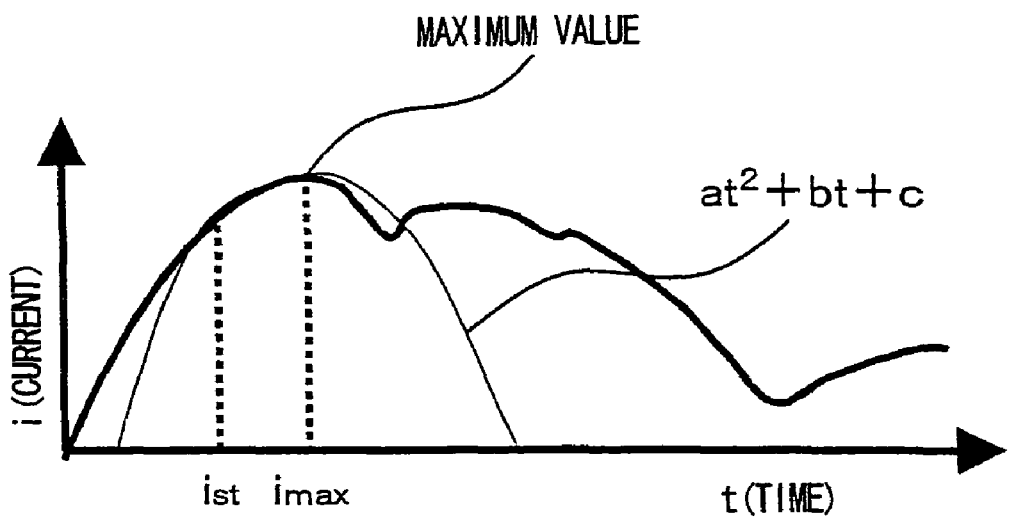
FIG. 18 is an explanatory chart for explaining the operation of the contact wear-measuring device.
Figure 19:
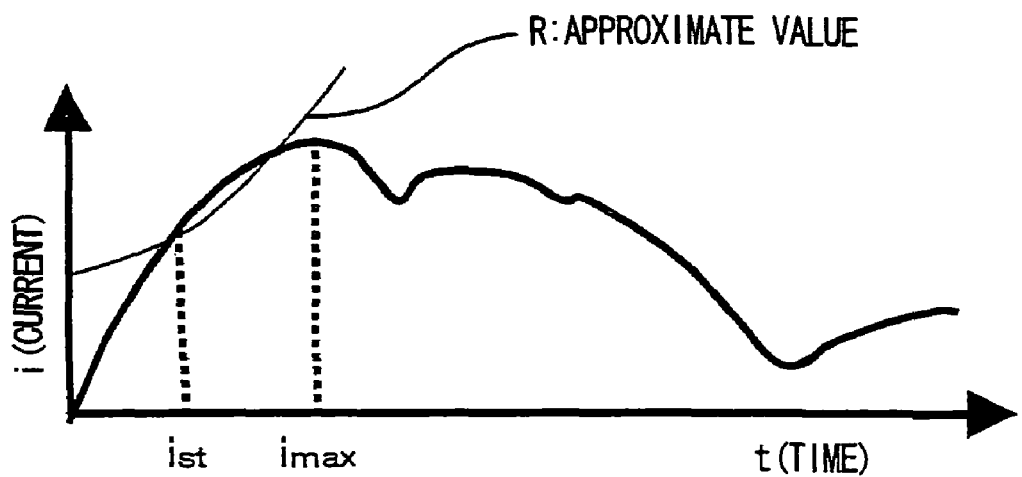
FIG. 19 is an explanatory chart for explaining the operation of the contact wear-measuring device.
Figure 20:
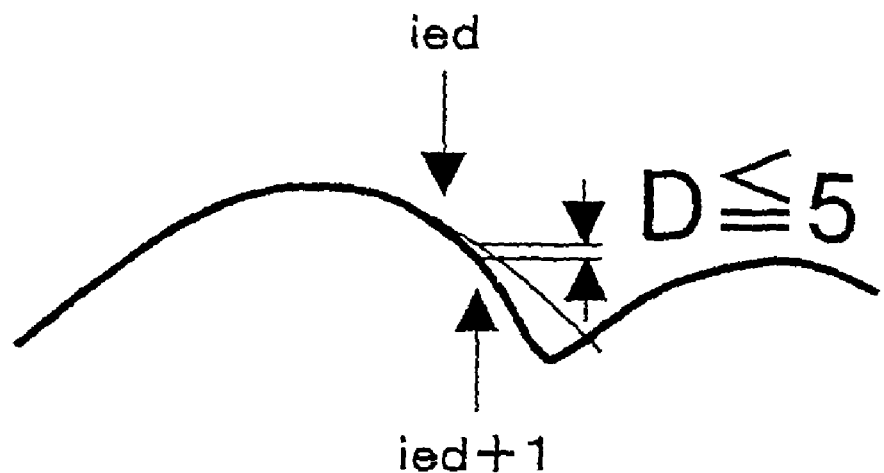
FIG. 20 is an explanatory chart for explaining the operation of the contact wear-measuring device.
Figure 21:
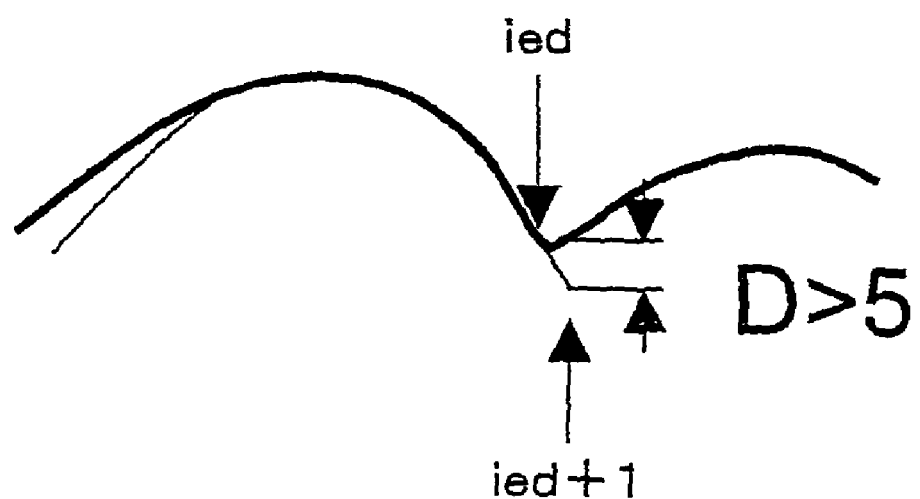
FIG. 21 is an explanatory chart for explaining the operation of the contact wear-measuring device.
Figure 22:
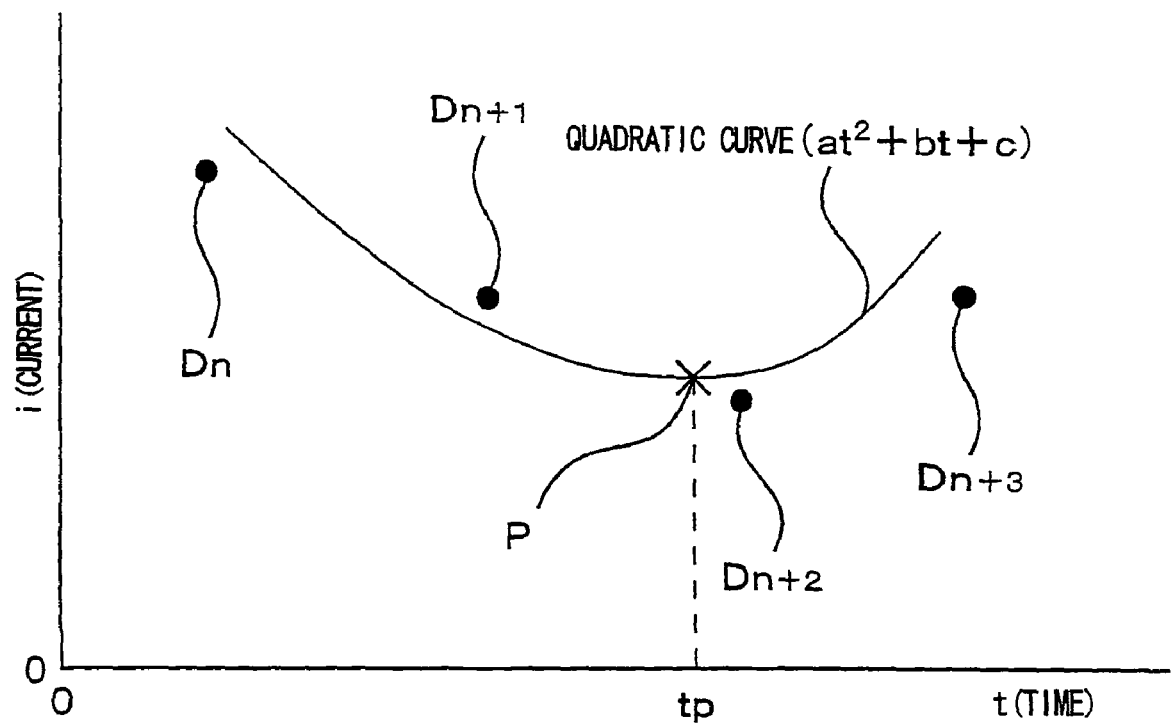
FIG. 22 is an explanatory chart for explaining the operation of the contact wear-measuring device.
Figure 23:
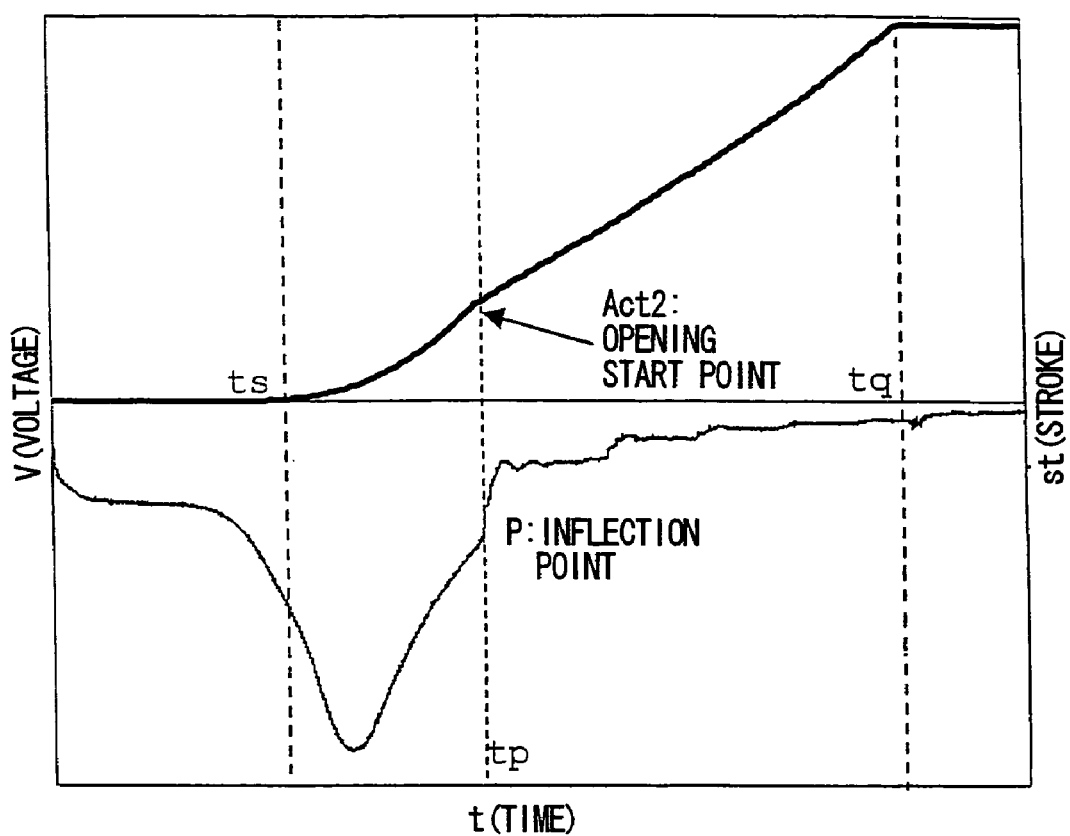
FIG. 23 is a characteristic chart showing a voltage induced to a closing coil and a stroke of a moving iron core according to a ninth embodiment of the invention.
Figure 24:
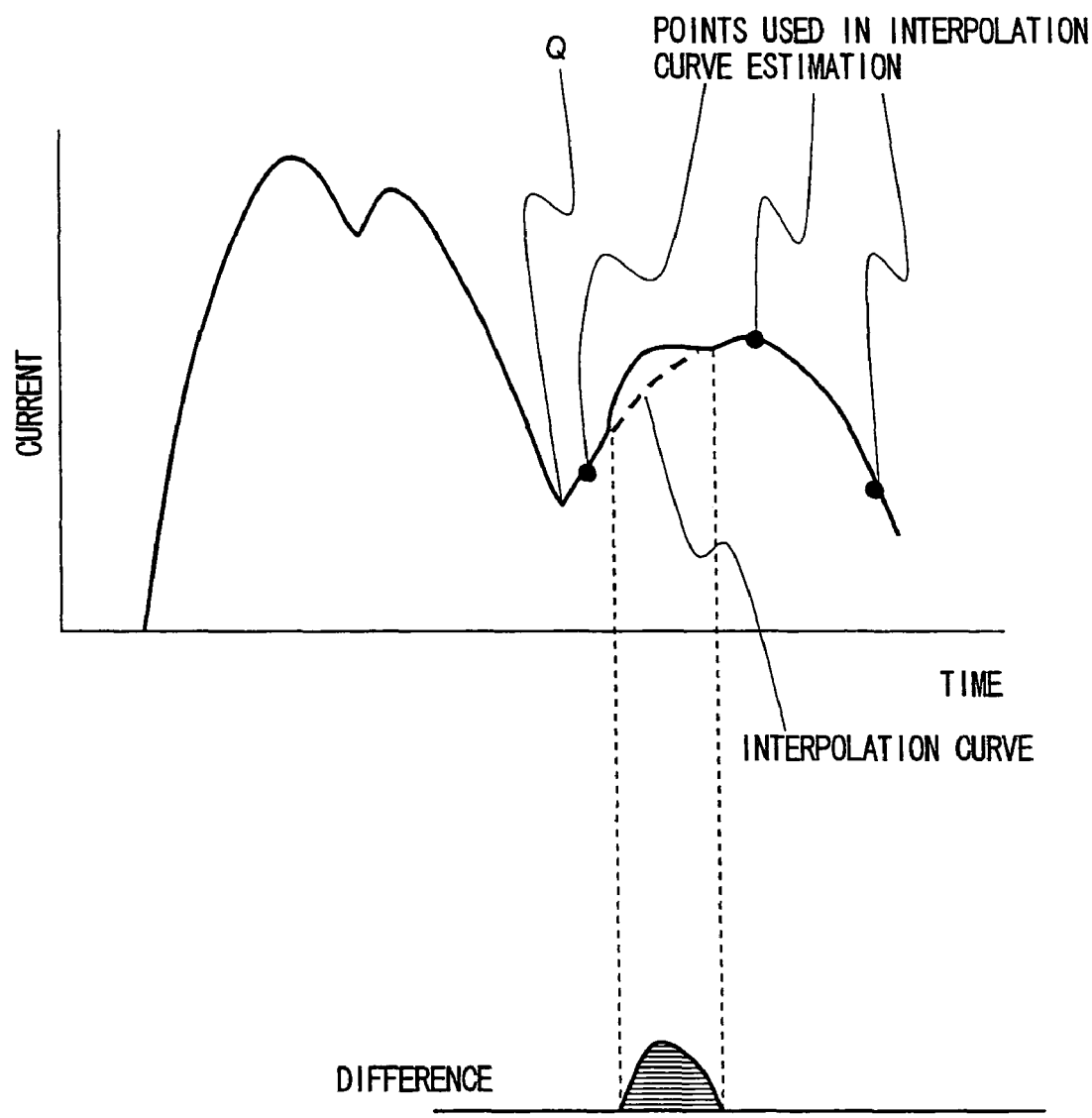
FIG. 24 is a chart showing current characteristics after a time point of the operation completion of a power switching apparatus according to a tenth embodiment of the invention.
Figure 25:
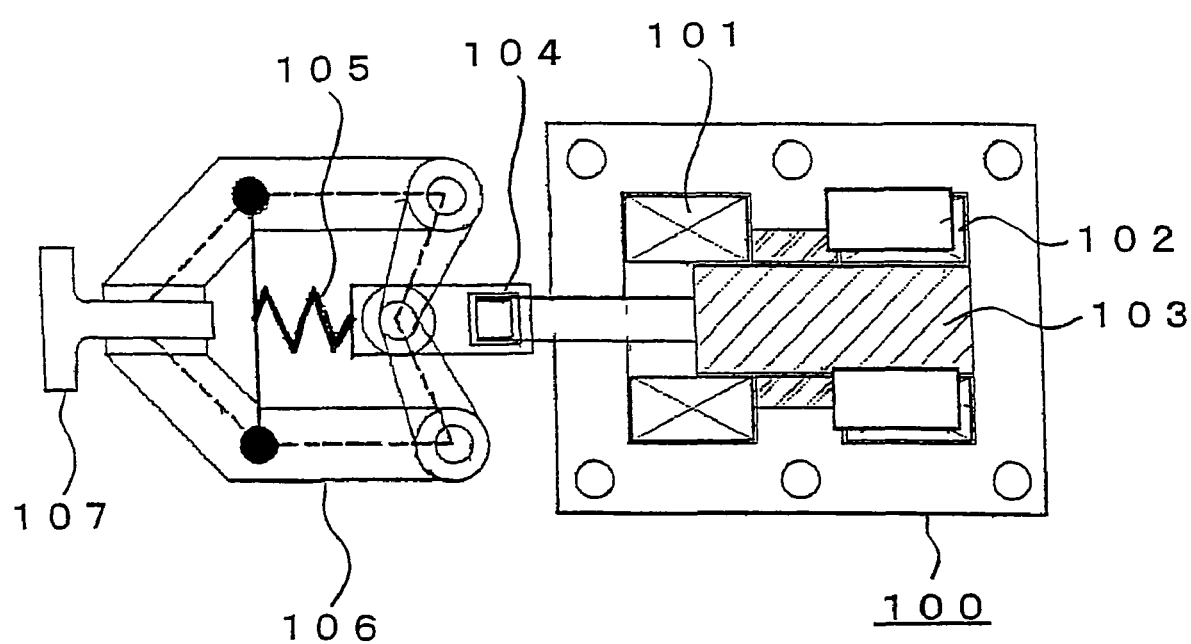
FIG. 25 is a schematic view of a brake apparatus employing an electromagnetic operating mechanism according to an eleventh embodiment of the invention.
Figure 26:
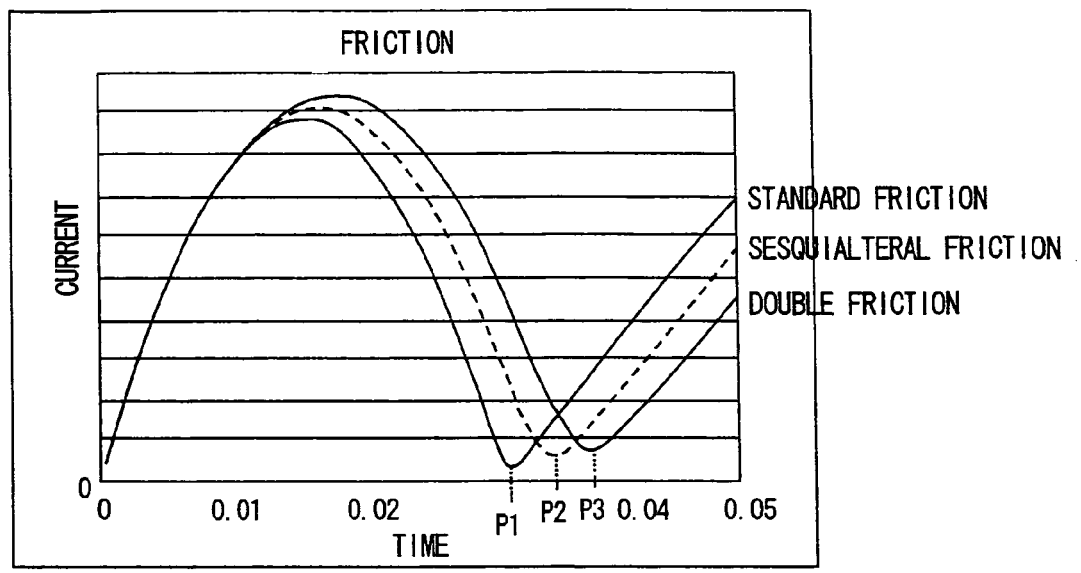
FIG. 26 is a chart showing a waveform of current flowing through a coil of the brake apparatus.
Figure 27:
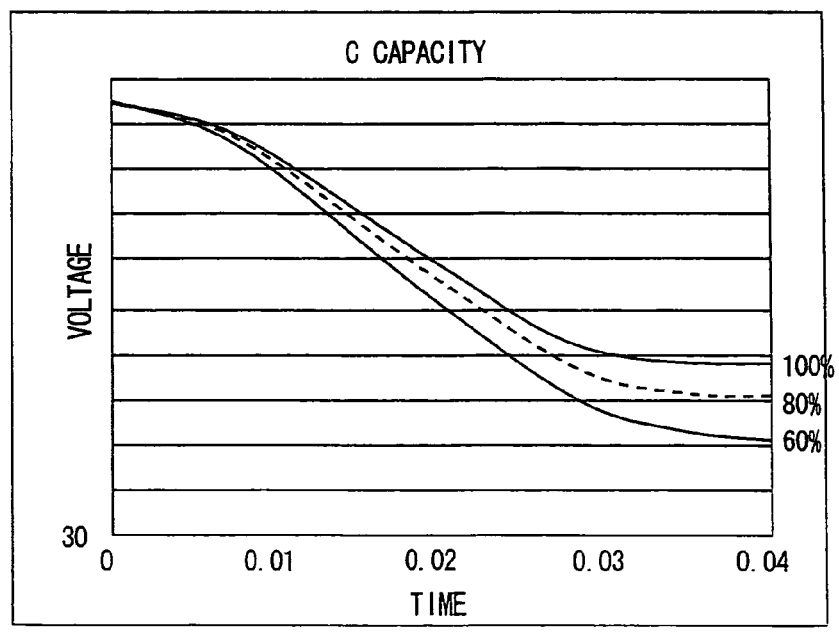
FIG. 27 is a chart showing a voltage waveform in the case where a capacity of a capacitor of an electromagnetic operating mechanism according to a twelfth embodiment of the invention.
Figure 28:
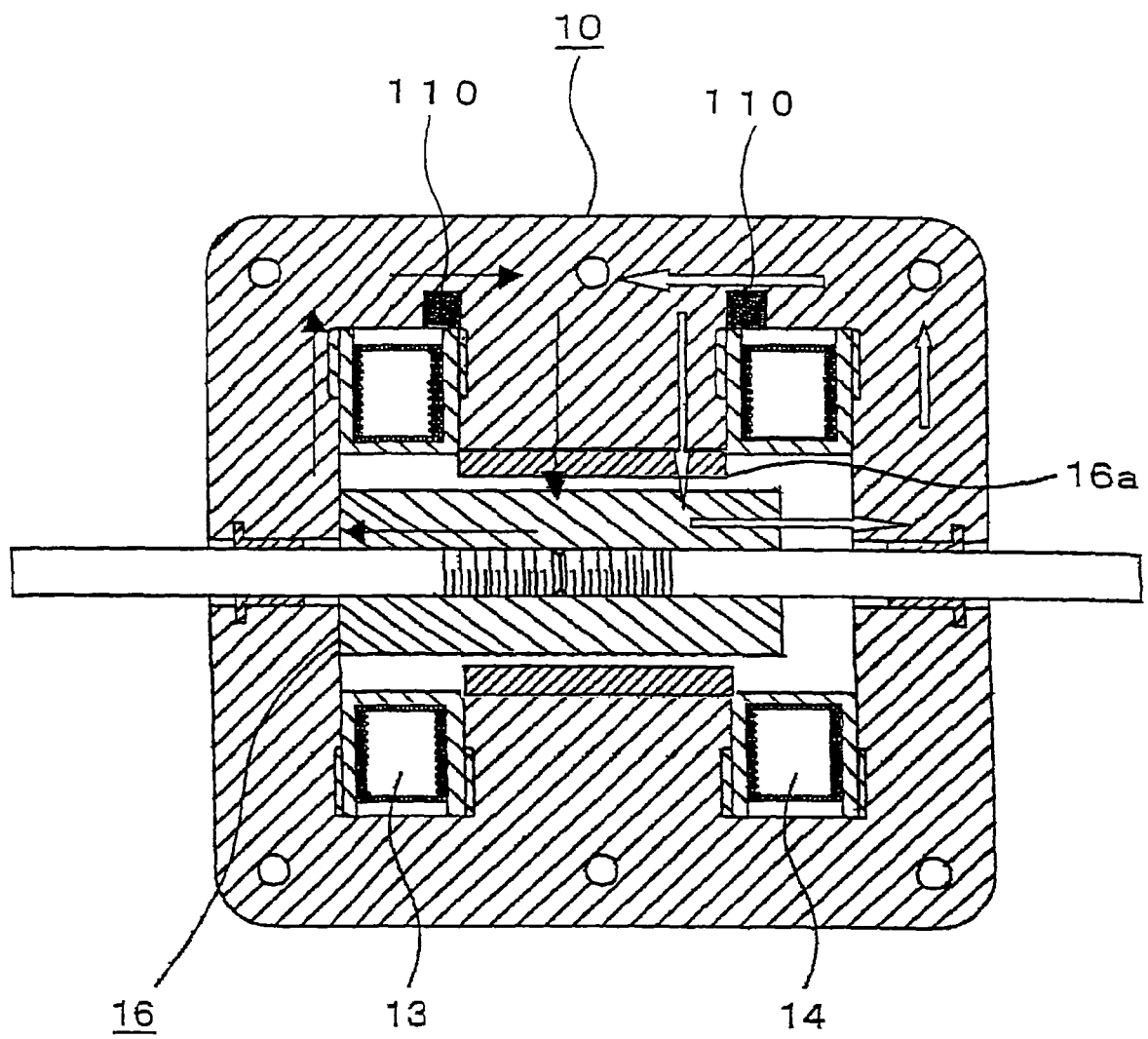
FIG. 28 is an enlarged view of an electromagnetic operating mechanism on which a Hall element is mounted according to a fourteenth embodiment of the invention.
Figure 29:
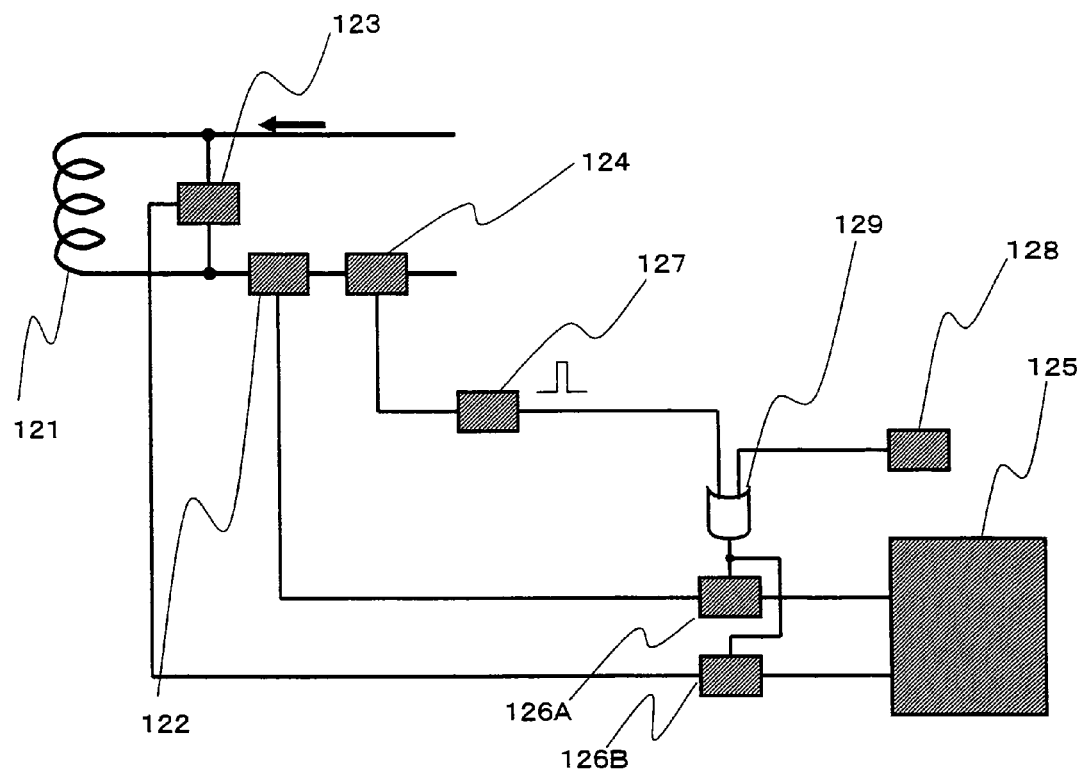
FIG. 29 is a diagram showing an operational processing section according to a fifteenth embodiment of the invention.
Figure 30:
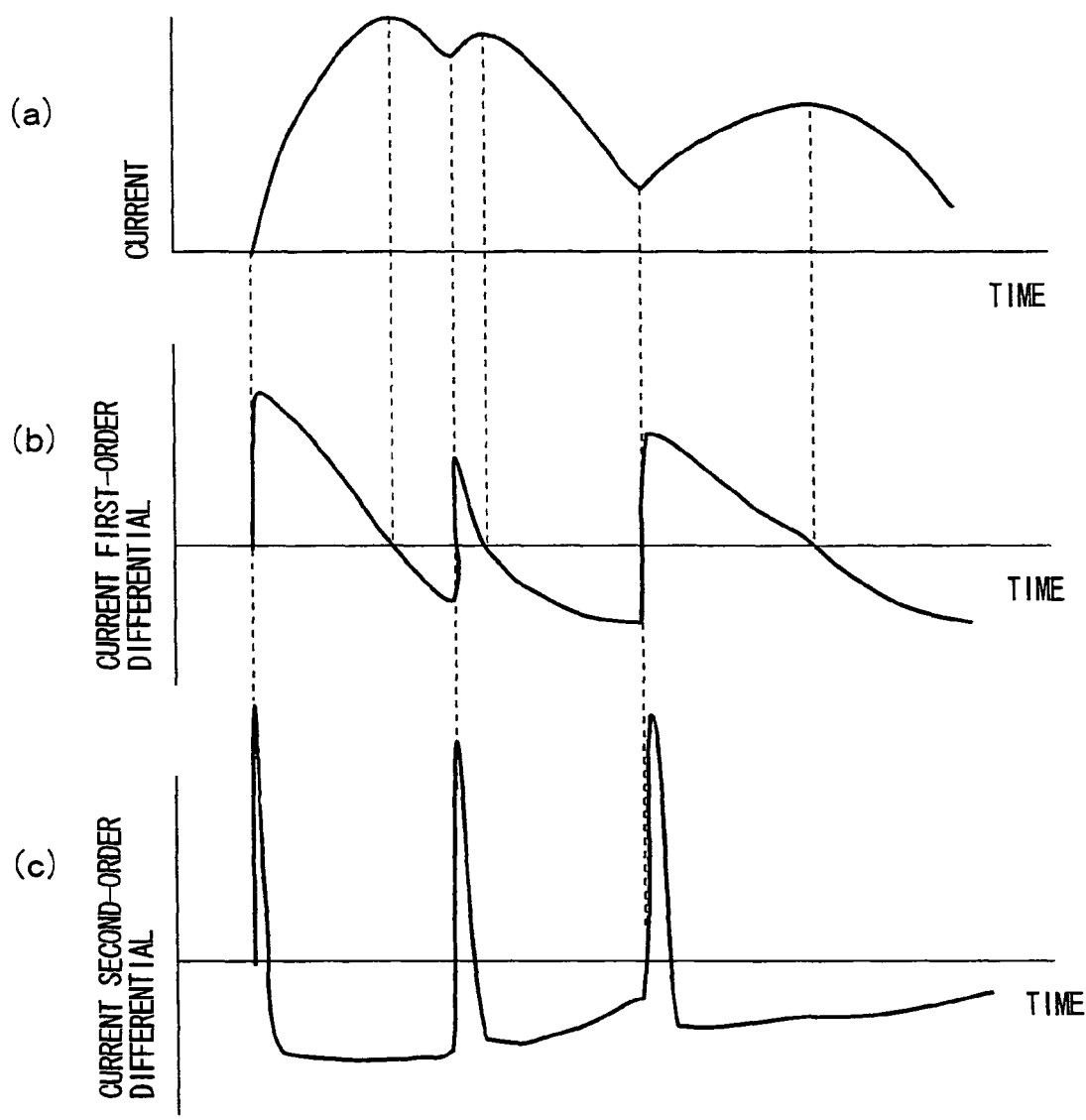
FIG. 30 is a chart showing a correlation between a current waveform and a current differential waveform.
Figure 31:
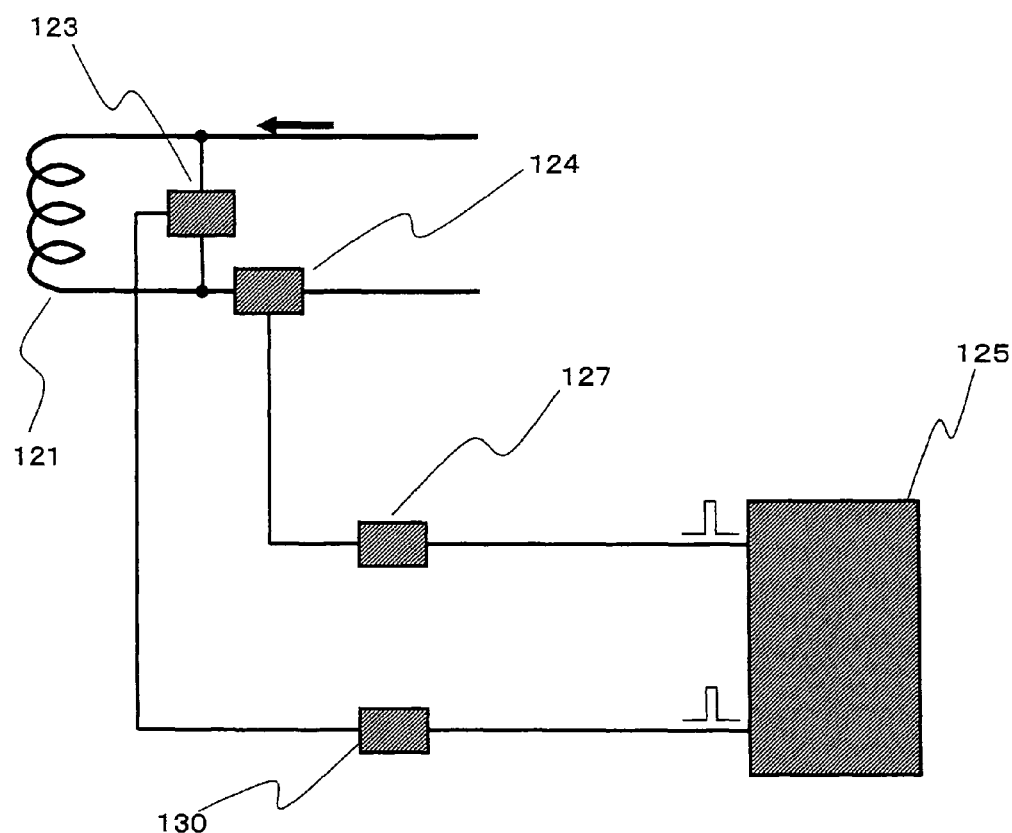
FIG. 31 is a diagram showing an operational processing section according to a sixteenth embodiment of the invention.
Figure 32:
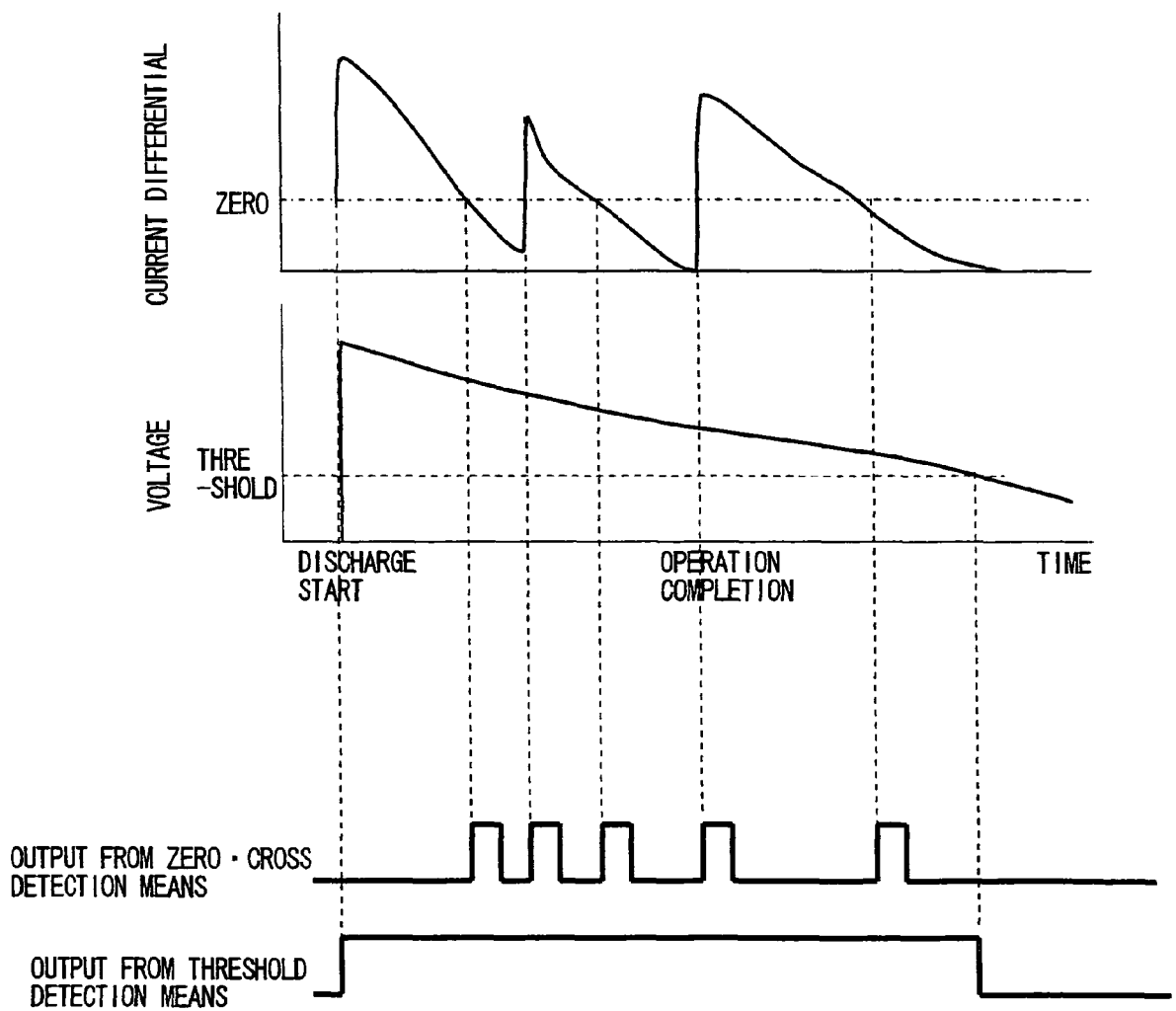
FIG. 32 is a chart showing a correlation between a voltage waveform and an output from threshold detection means.
Figure 33:
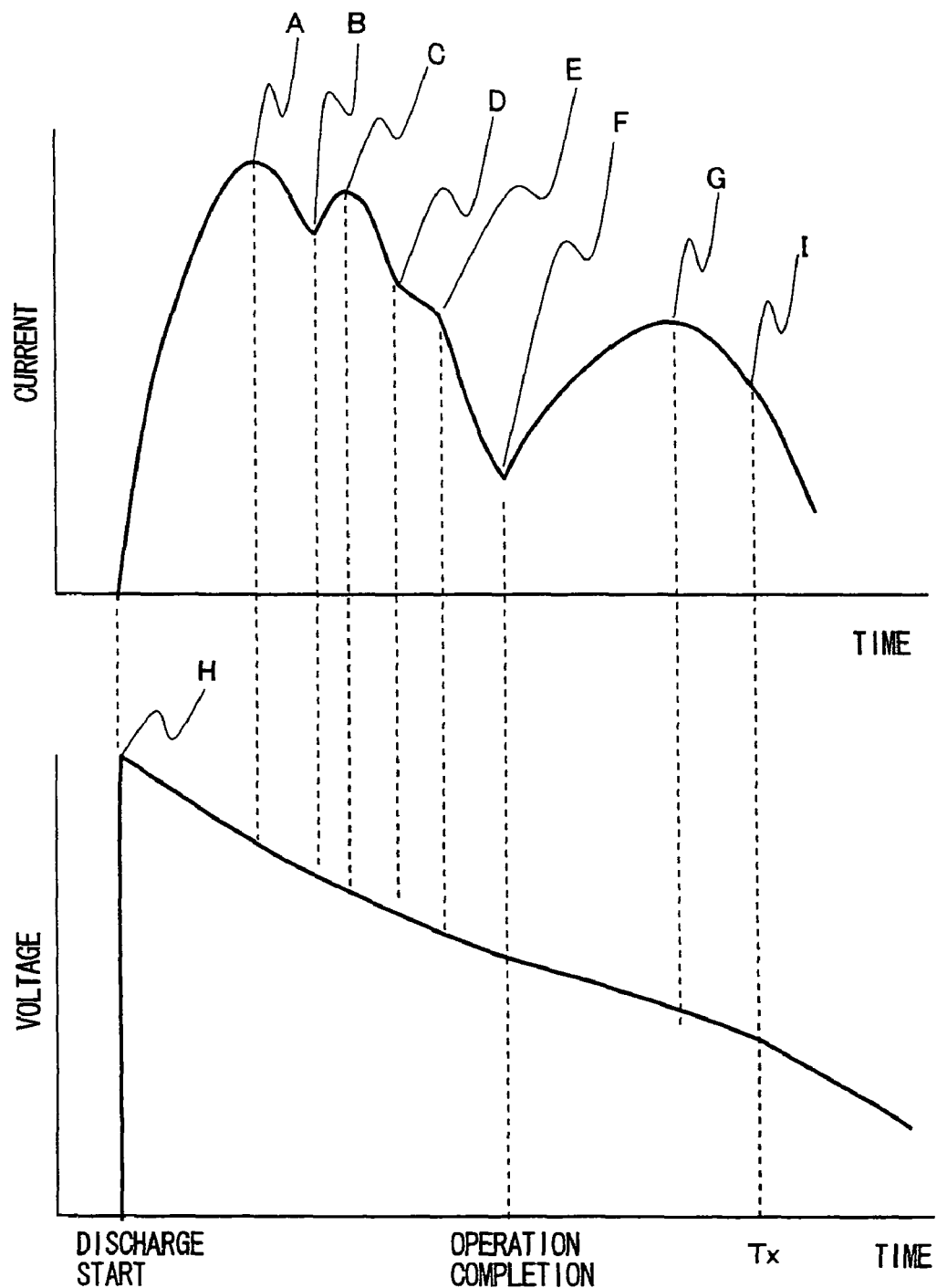
FIG. 33 is a chart showing inflection points and feature time points on current and voltage waveforms of an electromagnetic coil according to a seventeenth embodiment of the invention.
Figure 34:
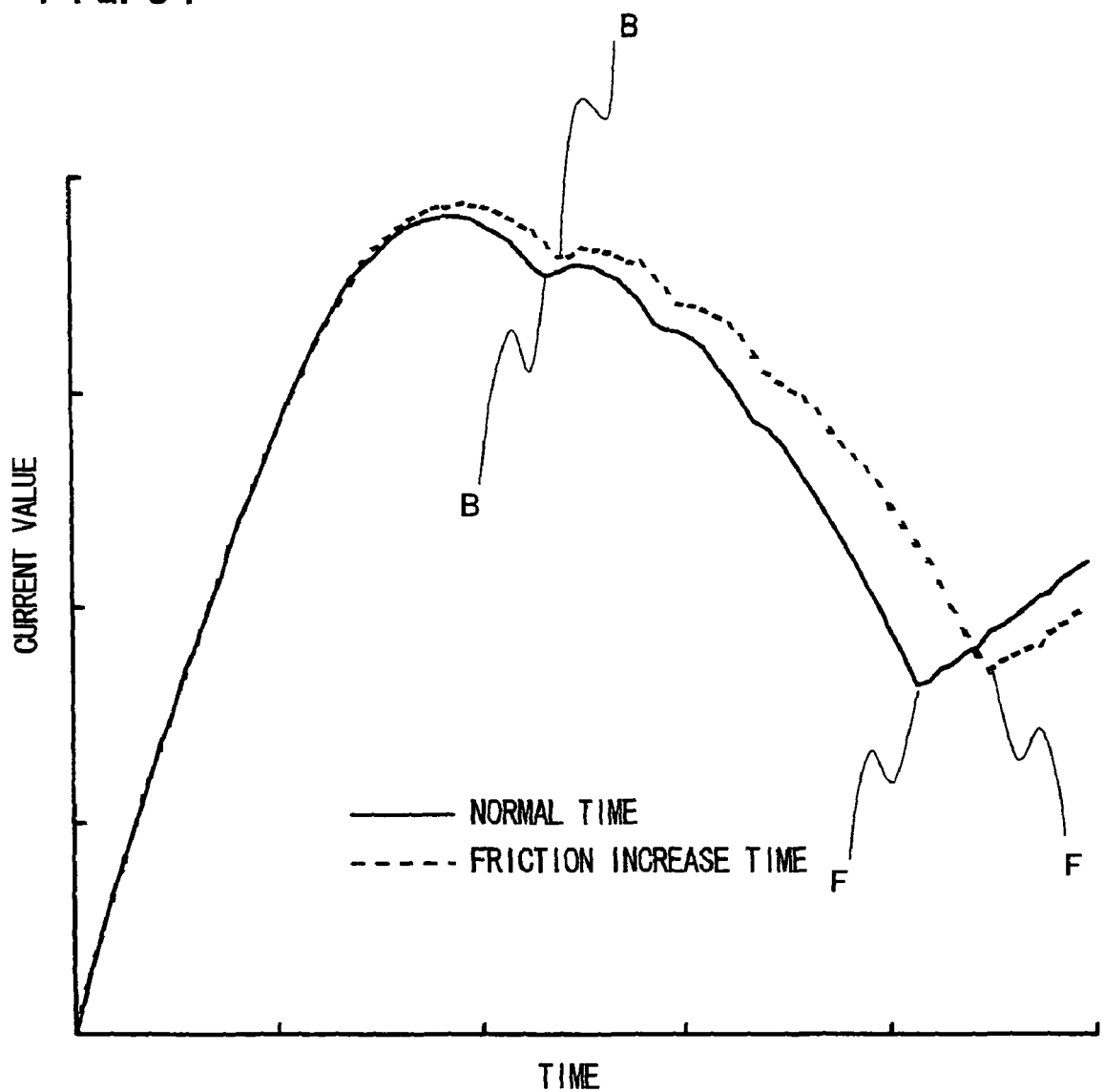
FIG. 34 is a chart showing coil current waveforms in the normal state and in the state in which friction of a drive section is increased.
Figure 35:
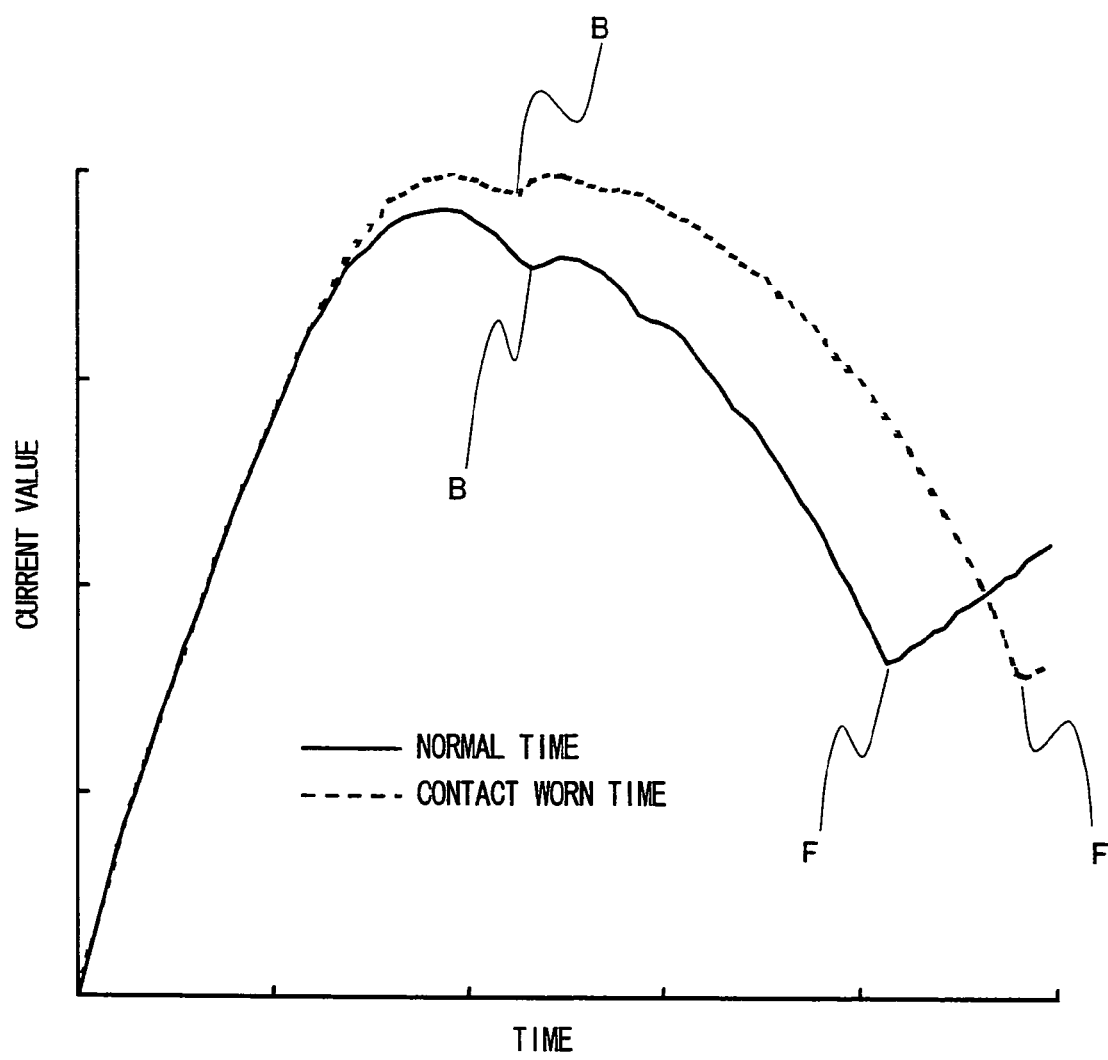
FIG. 35 is a chart showing coil current waveforms in the normal state and in the state of a switching contact being worn.
Figure 36:
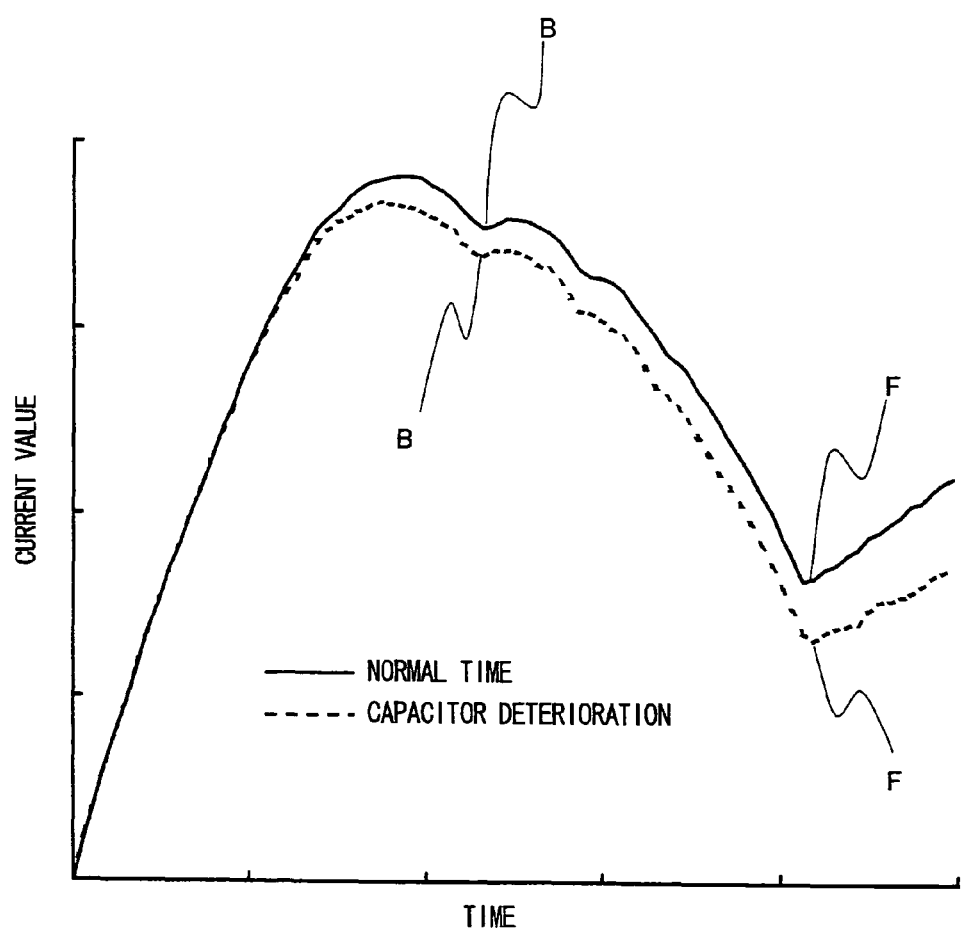
FIG. 36 is a chart showing coil current waveforms in the normal state and in the state in which a capacity of a capacitor is decreased due to deterioration thereof.
Figure 37:
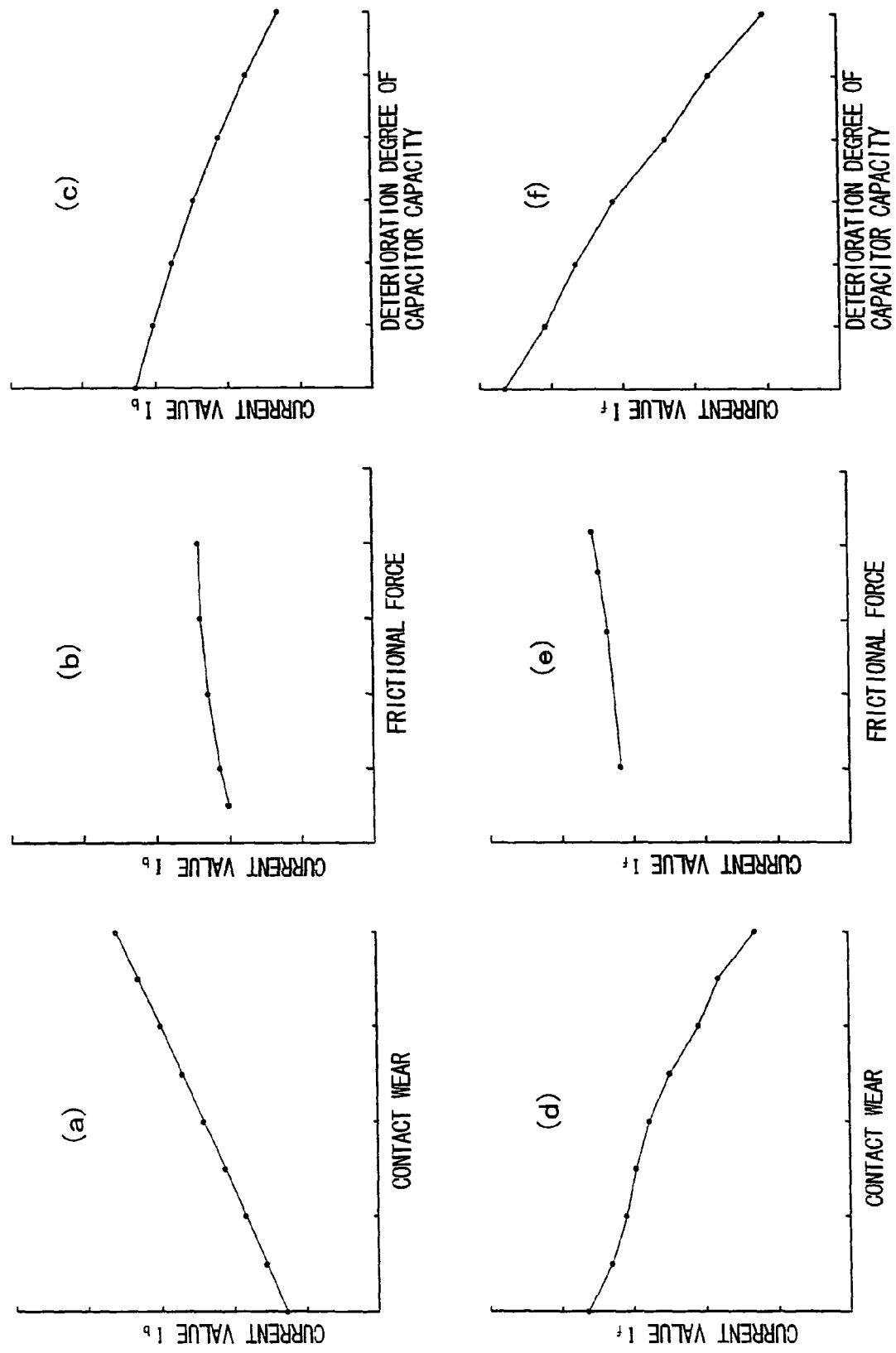
FIG. 37 are charts each showing a correlation between a current value Ib at the inflection point B and a current value If at the inflection point F, shown in FIG. 33, and change in each state factor such as wear amount of contact, frictional force of the moving part and capacitor deterioration.
Figure 38:
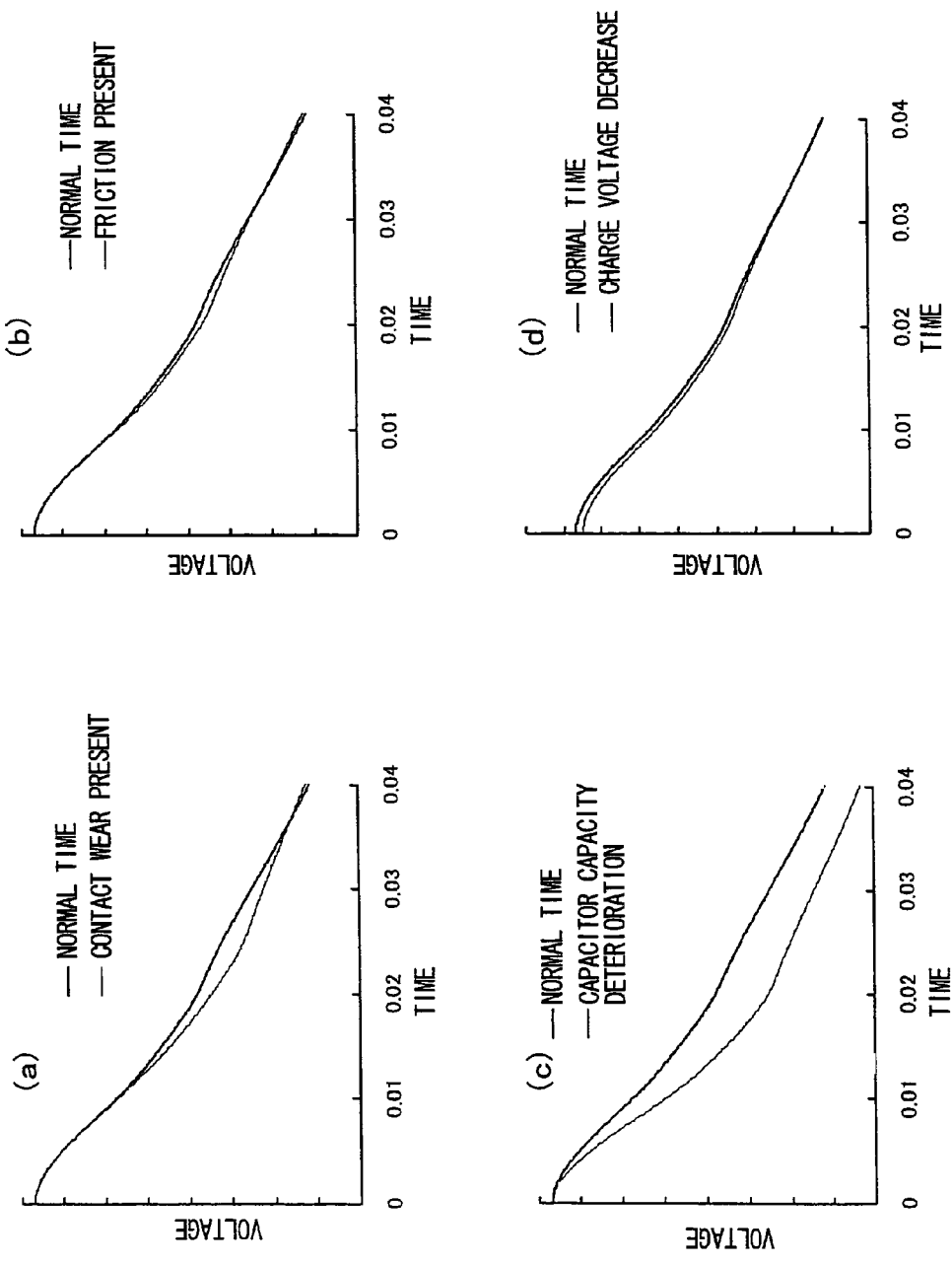
FIG. 38 are charts each showing a correlation between a coil voltage waveform and change in each state factor such as wear amount of contact, frictional force of the moving part, capacitor deterioration and decrease in charge voltage according to an eighteenth embodiment of the invention.

3: vacuum valve, 5: contact, 5a: fixed contact, 5b: moving contact, 7: driving rod,
10: electromagnetic operating mechanism, 13: closing coil, 14: opening coil, 20: driving power supply, 23: closing capacitor, 24: opening capacitor, 32: current measuring instrument,
33: contact wear-measuring device, 33b: opening start point search means, 33c: memory,
33d: contact wear-calculation means, 33e: contact-wear determination means, 43: switching time period monitoring device, 43a: opening-time minimum search means, 43b: closing-time minimum search means
43c: error determination means, 53: characteristic amount measuring device, 53a: opening time period calculation means
53b: error determination means, 63: characteristic amount measuring device, 63a: contact wear calculation means,
73: switching control device, 73a: temperature/capacitor voltage obtaining means
73b: closing time period prediction means, 73c: switching-on timing control means, 83: switching control device
83a: closing time period prediction means, 102, 102: coils, 103: moving iron core
104: connection part, 106: brake lever, 107: rail, 110: Hall element
121: opening coil, 122: current waveform detection means,
123: voltage waveform detection means
124: first-order differential waveform detection means,
125: characteristic amount measuring device
126A: current signal conversion means, 126B: voltage signal conversion means
127: zero•cross detection means, 130: threshold detection means

The invention claimed is:

1. A state grasp device, which is disposed in an electromagnetic operating system including a fixed iron core, a moving iron core constructed movably with respect to said fixed iron core, and an electromagnetic coil that is excited by a driving power supply, and causes said moving iron core to travel, thereby driving an operated apparatus that is connected to said moving iron core, the state grasp device comprising:
  measurement means for measuring a current flowing through said electromagnetic coil or a voltage to be generated at said electromagnetic coil;
  search means for obtaining change information that is changeable owing to a passage of time and use of said operated apparatus or said electromagnetic operating system, on an output waveform from said measurement means, said search means including an inflection point search means for searching an inflection point on output-time characteristics indicating a change with time of output values that are obtained from said measurement means, and for obtaining at least one kind of information out of time information, current value information, and voltage value information at said inflection point; and
  estimating means for estimating a state of the operated apparatus or electromagnetic operating system on the basis of said change information from said search means.

2. A state grasp device, which is disposed in an electromagnetic operating system including a fixed iron core; a moving iron core constructed movably with respect to said fixed iron core; and an electromagnetic coil that is excited by a driving power supply, and causes said moving iron core to travel, thereby driving an operated apparatus that is connected to said moving iron core, the state grasp device comprising:
  a measurement unit configured to measure a current flowing through said electromagnetic coil or a voltage to be generated at said electromagnetic coil;
  a search unit configured to obtain change information that is changeable owing to a passage of time and use of said operated apparatus or said electromagnetic operating system, on an output waveform from said measurement unit, said search unit including an inflection point search unit configured to search for an inflection point on output-time characteristics indicating a change with time of output values that are obtained from said measurement unit, and being configured to obtain at least one kind of information out of time information, current value information, and voltage value information at said inflection point; and an estimating unit configured to estimate a state of the operated apparatus or electromagnetic operating system on the basis of said change information.

3. The state grasp device according to claim 2, wherein said inflection point search unit is configured to search a position of an other inflection point on the basis of a compensation amount having been preliminarily set from a position of one inflection point.

4. The state grasp device according to claim 3, wherein said inflection point includes a point that is extracted on said output-time characteristics after the movement completion of said moving iron core.

5. The state grasp device according to claim 3, further comprising an operating unit configured to operate at least one kind of variation in state quantity, driving parameter, and remaining operating life of said operated apparatus or electromagnetic operating system on the basis of at least one kind of information of time information, current value information, and voltage value information at said inflection point.

6. The state grasp device according to claim 5, further comprising a transmitting unit configured to transmit signals when a change amount over time of said variation exceeds a predetermined value.

7. The state grasp device according to claim 2, wherein said inflection point search unit is configured to obtain a time when said inflection point takes place on the basis of a rate of change with time of said output-time characteristics.

8. The state grasp device according to claim 2, wherein said inflection point search unit is configured to apply said output-time characteristics to an approximate curve of a polynomial, and to obtain a time when said inflection point takes place on the basis of said approximate curve.

9. The state grasp device according to claim 2, wherein said search unit is configured to obtain, as said change information, at least one kind of information of current value information and voltage value information at a feature time point, being a time point after a predetermined time period has passed from a time point of starting the excitation with said driving power supply and a time point where the inflection point is positioned on said output-time characteristics showing the change with time of output values that are obtained from said measurement unit.

10. The state grasp device according to claim 9, wherein with respect to each of a plurality of groups including at least one of state factors having been preliminarily set to cause states of said operated apparatus or electromagnetic operating system, on the basis of said output-time characteristic information obtained by causing state quantities of said state factor belonging to a group thereof to change within a predetermined range, and said search unit is configured to extract a time zone in which the change in output due to change in state quantity of said state factor on said output-time characteristic information of a group of one state factor is larger than a value A having been preliminarily set on the basis of a measurement error, the change in output due to change in state quantity of said state factor on said output-time characteristic information of a group of at least one of the other state factors is smaller than a value B having been preliminarily set to be smaller than said value A, and to select at least one time point as said feature time point for each of the time zones having been extracted.

11. The state grasp device according to claim 9, wherein said feature time point includes a point that is extracted on said output-time characteristics after the movement completion of said moving iron core.

12. The state grasp device according to claim 9, further comprising an operating unit configured to operate at least one kind of variation in state quantity, driving parameter, and remaining operating life of said operated apparatus or electromagnetic operating system on the basis of at least one kind of information of current value information and voltage value information at said feature time point.

13. The state grasp device according to claim 12, further comprising a transmitting unit configured to transmit signals when a change amount over time of said variation exceeds a predetermined value.

14. The state grasp device according to claim 2, wherein
said electromagnetic operating system is configured to drive a moving contact of a switching contact of a power switching apparatus, being said operated apparatus, and comprises a current measurement unit configured to measure said current flowing through said electromagnetic coil as said measurement unit; and said search unit includes at least one of a first inflection point search unit configured to obtain, as a contact motion start time, a time when a first inflection point that appears subsequently to the maximum value of a current waveform provided from said measurement unit takes place, and a second inflection point search unit configured to obtain, as a contact movement completion time, a time when a second inflection point, which takes place after said contact motion start time and at which said current waveform becomes the minimum, takes place.

15. The state grasp device according to claim 14, further comprising a characteristic amount grasp obtaining unit configured to obtain a change in characteristic amounts of said power switching apparatus from a variation with time of at least one of said contact motion start time and said contact movement completion time.

16. The state grasp device according to claim 15, wherein
said electromagnetic coil is an opening electromagnetic coil, said first inflection point search unit is configured to search, as a first contact motion start time, said contact motion start time when said opening electromagnetic coil is excited at a first predetermined time, and to obtain, as a second contact motion start time, said contact motion start time when said opening electromagnetic coil is excited at a second predetermined time sequentially after said first predetermined time, and said characteristic amount grasp obtaining unit is configured to obtain a wear amount of said switching contact as said characteristic amount on the basis of said first and second contact motion start times.

17. The state grasp device according to claim 15, wherein
said electromagnetic coil is an opening electromagnetic coil, said second inflection point search unit is configured to obtain, as a first contact movement completion time, said contact movement completion time when said opening electromagnetic coil is excited at a first predetermined time, and to obtain, as a second contact movement completion time, said contact movement completion time when said opening electromagnetic coil is excited at a second predetermined time sequentially after said first predetermined time, and said characteristic amount grasp obtaining unit is configured to obtain a wear amount of said switching contact as said characteristic amount on the basis of said first and second contact movement completion times.

18. The state grasp device according to claim 15, wherein said electromagnetic coil is an opening electromagnetic coil, and said search unit includes both of said first inflection point search unit and said second inflection point unit, at a first predetermined time, said first inflection point search unit is configured to obtain, as a first contact motion start time, said contact motion start time when said opening electromagnetic coil is excited, and said second inflection point search unit is configured to obtain said contact movement completion time as a first contact movement completion time, at a second predetermined time sequentially after said first predetermined time, said first inflection point search unit is configured to obtain, as a second contact motion start time, said contact motion start time when said opening electromagnetic coil is excited, and said second inflection point search unit is configured to obtain said contact movement completion time as a second contact movement completion time, and said characteristic amount grasp obtaining unit is configured to obtain a first time difference, being a difference between said first contact movement completion time and said first contact motion start time, to obtain a second time difference, being a difference between said second contact movement completion time and said second contact motion start time, and to obtain, as said characteristic amount, a wear amount of said switching contact on the basis of said first and second time differences.

19. The state grasp device according to claim 15, wherein said search unit includes both of said first and second inflection point search units, and said characteristic amount grasp obtaining unit is configured to obtain, as said characteristic amount, a movement time period of said moving contact on the basis of said contact motion start time and said contact movement completion time.

20. A switching control device of a power switching apparatus employing the state grasp device according to claim 2, wherein said electromagnetic operating system is configured to drive a moving contact of a switching contact of said power switching apparatus, being said operated apparatus, and is provided with an opening electromagnetic coil and a closing electromagnetic coil to be excited with an electric charge having been charged in a capacitor as said electromagnetic coil, and comprises a current measurement unit configured to measure said current flowing through said opening electromagnetic coil and said closing electromagnetic coil;

said search unit includes at least one of a first inflection point search unit configured to obtain, as a contact motion start time, a time when a first inflection point takes place which point appears subsequently to the maximum value of a current waveform provided by said current measurement unit, and a second inflection point search unit configured to obtain, as a contact movement completion time, a time when a second inflection point, which takes place subsequently to said contact motion start time and at which said current waveform becomes a minimum, takes place;

said switching control device including a closing time period prediction unit configured to predict a closing completion time period when said closing electromagnetic coil is excited next on the basis of at least one of said contact motion start time and said contact movement completion time, and at least one of a charge voltage of said capacitor and temperature information of said power switching apparatus; and said switching control device including a timing control unit configured to control a timing of exciting said closing electromagnetic coil next on the basis of said closing completion prediction time period.

21. The switching control device of a power switching apparatus according to claim 20, further comprising:

a voltage measuring unit configured to measure a voltage of said electromagnetic coil when a predetermined extremely weak current is carried to said electromagnetic coil, a coil resistance change obtaining unit configured to obtain coil resistance change characteristics of said electromagnetic coil from said current·voltage values, and a temperature information obtaining unit configured to obtain temperature information of said closing electromagnetic coil on the basis of said coil resistance change characteristics.

22. The switching control device of a power switching apparatus according to claim 20, wherein a hall element is mounted on said fixed iron core forming a magnetic circuit, and said switching control device includes a voltage change measuring unit configured to measure voltage change characteristics of said hall element under conditions of constant magnetic flux, and a temperature obtaining unit configured to obtain temperature information of said closing electromagnetic coil on the basis of said voltage change characteristics.

23. The state grasp device according to claim 2, wherein said inflection point includes a point that is extracted on said output-time characteristics after the movement completion of said moving iron core.

24. The state grasp device according to claim 2, wherein said search unit includes a zero•cross detecting unit configured to differentiate a current flowing through said electromagnetic coil or a voltage generated at said electromagnetic coil, and to output a pulse signal at a zero•cross point of a differential output thereof, and a time information obtaining unit configured to obtain time information of an inflection point with said pulse signal.

25. The state grasp device according to claim 2, further comprising an operating unit configured to operate at least one kind of variation in state quantity, driving parameter, and remaining operating life of said operated apparatus or electromagnetic operating system on the basis of at least one kind of information of time information, current value information, and voltage value information at said inflection point.

26. The state grasp device according to claim 25, further comprising a transmitting unit configured to transmit signals when a change amount over time of said variation exceeds a predetermined value.

27. The state grasp device according to claim 2, wherein said electromagnetic operating system is configured to drive a moving contact of a switching contact of a power switching apparatus, being said operated apparatus.

28. The state grasp device according to claim 27, wherein said electromagnetic operating system includes a pressure spring connected between the switching contact of the power switching apparatus and the moving iron core.

* * * * *